(12) United States Patent
Jost et al.

(10) Patent No.: US 10,588,235 B2
(45) Date of Patent: Mar. 10, 2020

(54) EQUIPMENT RACK HAVING MOUNTING RAILS

(71) Applicant: Cooper Technologies Company, Houston, TX (US)

(72) Inventors: Henry D. Jost, Leicester, MA (US); Richard M. Latino, Sterling, MA (US); Lorena E. Sandoval, Norwalk, CA (US); Joseph Rau, North Grafton, MA (US)

(73) Assignee: Eaton Intelligent Power Limited, Dublin (IE)

( * ) Notice: Subject to any disclaimer, the term of this patent is extended or adjusted under 35 U.S.C. 154(b) by 323 days.

(21) Appl. No.: 15/418,028

(22) Filed: Jan. 27, 2017

(65) Prior Publication Data
US 2017/0223864 A1    Aug. 3, 2017

Related U.S. Application Data

(60) Provisional application No. 62/289,212, filed on Jan. 30, 2016.

(51) Int. Cl.
| | | |
|---|---|---|
| *H05K 7/14* | (2006.01) | |
| *A47B 96/14* | (2006.01) | |
| *A47B 57/54* | (2006.01) | |
| *H05K 7/18* | (2006.01) | |

(52) U.S. Cl.
CPC .......... *H05K 7/1401* (2013.01); *A47B 57/54* (2013.01); *A47B 96/14* (2013.01); *A47B 96/1441* (2013.01); *H05K 7/1488* (2013.01); *H05K 7/1489* (2013.01); *H05K 7/1491* (2013.01); *H05K 7/183* (2013.01)

(58) Field of Classification Search
CPC .... H05K 7/1488; H05K 7/183; H05K 7/1401; H05K 7/1489; A47B 96/1441
See application file for complete search history.

(56) References Cited

U.S. PATENT DOCUMENTS

| | | | |
|---|---|---|---|
| 935,004 | A | 9/1909 | Farch |
| 1,058,952 | A | 4/1913 | Durner |
| 1,744,457 | A | 1/1930 | Ellingson |
| 2,124,049 | A | 7/1938 | Battista et al. |
| 2,287,531 | A | 6/1942 | Ong |
| 3,273,720 | A | 9/1966 | Seiz |
| 3,465,895 | A | 9/1969 | Miller |
| 3,469,875 | A | 9/1969 | Ahlgren |
| 3,510,010 | A | 5/1970 | Gasner |
| 3,633,774 | A | 1/1972 | Lee |
| 4,154,419 | A | 5/1979 | Breidenbach |

(Continued)

FOREIGN PATENT DOCUMENTS

| | | |
|---|---|---|
| EP | 0871156 A2 | 10/1998 |
| WO | 2008124910 A1 | 10/2008 |
| WO | 2015/069527 A2 | 5/2015 |

*Primary Examiner* — Michael Safavi
(74) *Attorney, Agent, or Firm* — Stinson LLP

(57) ABSTRACT

An equipment rack, mounting rails for the equipment rack, and associated methods. The mounting rails are selectively movable on a frame of the equipment rack and can be clamped to secure the mounting rails to the frame. A clamp of the mounting rail can include a clamp arm having a clamped position and an unclamped position and a lever arm for moving the clamp arm between the clamped and unclamped positions.

17 Claims, 46 Drawing Sheets

(56) References Cited

U.S. PATENT DOCUMENTS

| | | | |
|---|---|---|---|
| 4,258,511 A | 3/1981 | Strain |
| 4,285,436 A | 8/1981 | Konstant et al. |
| 4,675,723 A | 6/1987 | Bayuk |
| 4,818,000 A | 4/1989 | Bobrowski |
| 5,028,083 A | 7/1991 | Mischenko |
| 5,046,464 A | 9/1991 | Hisatomi et al. |
| 5,179,919 A | 1/1993 | Foltz, Jr. et al. |
| 5,372,262 A | 12/1994 | Benson et al. |
| 5,463,189 A | 10/1995 | Deneke et al. |
| 5,534,665 A | 7/1996 | Long |
| 5,728,976 A | 3/1998 | Santucci et al. |
| 5,730,400 A | 3/1998 | Rinderer et al. |
| 5,792,992 A | 8/1998 | Handler |
| 5,806,945 A | 9/1998 | Anderson et al. |
| 5,853,236 A | 12/1998 | Rogers et al. |
| 5,871,115 A | 2/1999 | Kohn |
| 5,889,648 A | 3/1999 | Heavirland et al. |
| 5,949,246 A | 9/1999 | Frankeny et al. |
| 5,980,008 A | 11/1999 | Stoever |
| 6,021,909 A | 2/2000 | Tang et al. |
| 6,029,586 A | 2/2000 | Schiavello |
| 6,084,180 A | 7/2000 | DeBartolo, Jr. et al. |
| 6,109,625 A | 8/2000 | Hewitt |
| 6,123,400 A | 9/2000 | Nicolai et al. |
| 6,162,004 A | 12/2000 | Hanakawa |
| 6,174,034 B1 | 1/2001 | Benner et al. |
| 6,181,549 B1 | 1/2001 | Mills et al. |
| 6,238,029 B1 | 5/2001 | Marzec et al. |
| 6,385,036 B1 | 5/2002 | Chien |
| 6,422,399 B1 | 7/2002 | Castillo et al. |
| 6,430,782 B1 | 8/2002 | Torres et al. |
| 6,437,244 B1 | 8/2002 | Vander Velde |
| 6,515,225 B1 | 2/2003 | Wright |
| 6,549,424 B1 | 4/2003 | Beseth et al. |
| 6,554,142 B2 | 4/2003 | Gray |
| 6,575,315 B2 | 6/2003 | Zidek |
| 6,588,866 B2 | 7/2003 | Cheng |
| 6,609,619 B2 | 8/2003 | Abbott |
| 6,614,665 B2 | 9/2003 | Witty et al. |
| 6,615,992 B1 | 9/2003 | Lauchner et al. |
| 6,726,164 B1 | 4/2004 | Baiza et al. |
| 6,736,277 B2 | 5/2004 | Lauchner et al. |
| 6,769,551 B2 | 8/2004 | Rafferty et al. |
| 6,773,080 B2 * | 8/2004 | Chen .................. A47B 57/40 211/26 |
| 6,835,891 B1 | 12/2004 | Herzog et al. |
| 6,840,388 B2 | 1/2005 | Mayer |
| 6,856,505 B1 | 2/2005 | Venegas et al. |
| 6,865,774 B2 | 3/2005 | Devine et al. |
| 6,866,154 B2 | 3/2005 | Hartman et al. |
| 6,883,282 B1 | 4/2005 | Newhart, III |
| 6,902,069 B2 | 6/2005 | Hartman et al. |
| 6,916,986 B1 | 7/2005 | Herzog et al. |
| 6,917,518 B2 | 7/2005 | Chen |
| 7,012,808 B2 | 3/2006 | Mayer |
| 7,041,897 B2 | 5/2006 | Herzog |
| 7,055,833 B2 | 6/2006 | Wixted et al. |
| 7,060,893 B1 | 6/2006 | Villi |
| 7,093,725 B2 | 8/2006 | Hartman et al. |
| 7,113,685 B2 | 9/2006 | Ferris et al. |
| 7,137,512 B2 | 11/2006 | Nguyen et al. |
| 7,192,103 B2 | 3/2007 | Hamilton |
| 7,218,526 B2 | 5/2007 | Mayer |
| 7,281,633 B2 | 10/2007 | Hartman et al. |
| 7,281,694 B2 | 10/2007 | Allen et al. |
| 7,293,666 B2 * | 11/2007 | Mattlin .................. G06F 1/181 211/189 |
| 7,357,362 B2 | 4/2008 | Yang et al. |
| 7,362,941 B2 | 4/2008 | Rinderer et al. |
| 7,417,866 B1 | 8/2008 | Beseth et al. |
| 7,458,859 B2 | 12/2008 | McGrath et al. |
| 7,472,970 B2 * | 1/2009 | Bergesch .............. G06F 1/181 211/26 |
| 7,473,846 B2 | 1/2009 | Doerr et al. |
| 7,476,804 B2 | 1/2009 | Adducci et al. |
| 7,478,890 B2 | 1/2009 | Hudz et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,506,768 B2 | 3/2009 | Rassmussen et al. |
| 7,627,221 B2 | 12/2009 | Morris |
| 7,641,297 B2 | 1/2010 | Huang |
| 7,695,323 B2 | 4/2010 | McGrath et al. |
| 7,762,411 B2 | 7/2010 | Hilburn et al. |
| 7,772,489 B2 | 8/2010 | Adducci et al. |
| 7,778,513 B2 | 8/2010 | Rinderer et al. |
| 7,815,202 B2 | 10/2010 | Richards et al. |
| 7,857,670 B2 | 12/2010 | McGrath et al. |
| 7,880,084 B2 | 2/2011 | Adducci et al. |
| 7,959,015 B2 | 6/2011 | Sempliner et al. |
| 7,975,860 B2 | 7/2011 | Dittus et al. |
| 7,988,246 B2 * | 8/2011 | Yu .......................... A47B 88/43 211/175 |
| 8,025,166 B2 | 8/2011 | Hilburn et al. |
| 8,052,231 B2 | 11/2011 | Rasmussen et al. |
| 8,083,298 B2 | 12/2011 | Henderson et al. |
| 8,083,301 B2 | 12/2011 | Hudz et al. |
| 8,091,970 B2 | 1/2012 | Francisquini |
| 8,104,626 B2 * | 1/2012 | Huang .................. A47B 88/43 211/26 |
| 8,128,183 B2 | 3/2012 | Shen et al. |
| 8,162,699 B2 | 4/2012 | McGrath et al. |
| 8,167,146 B2 | 5/2012 | Yu et al. |
| 8,196,873 B2 | 6/2012 | Kohn et al. |
| 8,237,052 B2 | 8/2012 | Adducci et al. |
| 8,256,627 B2 | 9/2012 | Simpliner et al. |
| 8,281,940 B2 * | 10/2012 | Fan ...................... H05K 7/1488 211/26 |
| 8,336,719 B2 | 12/2012 | Fan |
| 8,353,492 B2 | 1/2013 | Mattlin et al. |
| 8,353,494 B2 * | 1/2013 | Peng ...................... A47B 88/43 211/192 |
| 8,363,996 B2 | 1/2013 | Morris |
| 8,363,998 B2 | 1/2013 | Newman et al. |
| 8,371,454 B2 | 2/2013 | Chen et al. |
| 8,435,086 B2 | 5/2013 | McGrath et al. |
| 8,505,986 B2 | 8/2013 | Sun |
| 8,544,860 B2 | 10/2013 | Fan |
| 8,727,138 B2 | 5/2014 | Dittus et al. |
| 8,787,023 B2 | 7/2014 | Lewis, II et al. |
| 8,789,858 B2 * | 7/2014 | Loret de Mola ......... E05B 5/00 292/164 |
| 8,867,213 B2 | 10/2014 | Furuta et al. |
| 8,901,418 B2 | 12/2014 | Walker et al. |
| 8,913,393 B2 | 12/2014 | Mimlitch, III et al. |
| 8,979,220 B2 | 3/2015 | Joist |
| 8,985,345 B2 | 3/2015 | Fan et al. |
| 9,004,432 B2 | 4/2015 | Lacarra |
| 9,055,677 B2 | 6/2015 | Garza, Jr. et al. |
| 9,091,831 B2 | 6/2015 | Chatellard et al. |
| 9,107,322 B2 | 8/2015 | Chuang |
| RE45,739 E | 10/2015 | Bergesch |
| 9,237,808 B2 | 1/2016 | Chen et al. |
| 9,301,605 B2 | 4/2016 | Corbo et al. |
| 9,370,120 B2 | 6/2016 | Chen et al. |
| 9,552,024 B2 | 1/2017 | Lin et al. |
| 9,743,543 B2 | 8/2017 | Anderson et al. |
| 10,117,348 B2 * | 10/2018 | Babcock ............... H05K 7/1491 |
| 2002/0062540 A1 | 5/2002 | Nishida |
| 2002/0172013 A1 | 11/2002 | Chandler |
| 2003/0047345 A1 | 3/2003 | Bernard et al. |
| 2003/0062326 A1 | 4/2003 | Guebre-Tsadik |
| 2003/0127815 A1 | 7/2003 | Hall |
| 2004/0001758 A1 | 1/2004 | Liang |
| 2004/0016713 A1 | 1/2004 | Wyatt et al. |
| 2004/0065459 A1 | 4/2004 | Spagnoli et al. |
| 2004/0120106 A1 | 6/2004 | Searby et al. |
| 2004/0189161 A1 | 9/2004 | Davis et al. |
| 2004/0217073 A1 | 11/2004 | Dobler et al. |
| 2005/0017608 A1 | 1/2005 | Lin et al. |
| 2005/0023943 A1 | 2/2005 | Fan et al. |
| 2005/0077804 A1 | 4/2005 | Altena |
| 2005/0145410 A1 | 7/2005 | Daito |

(56) References Cited

U.S. PATENT DOCUMENTS

| | | | |
|---|---|---|---|
| 2005/0156493 A1* | 7/2005 | Yang | H05K 7/1489 312/334.5 |
| 2006/0066065 A1 | 3/2006 | Mason et al. | |
| 2006/0138062 A1 | 6/2006 | Dahmer et al. | |
| 2007/0012836 A1 | 1/2007 | Krueger et al. | |
| 2007/0084618 A1 | 4/2007 | VanderVelde et al. | |
| 2007/0089895 A1 | 4/2007 | Suzuki et al. | |
| 2007/0158280 A1 | 7/2007 | Cox et al. | |
| 2007/0210680 A1 | 9/2007 | Appino et al. | |
| 2007/0257169 A1 | 11/2007 | Taggett | |
| 2008/0010782 A1 | 1/2008 | Sturdy | |
| 2008/0131198 A1 | 6/2008 | Burrows | |
| 2008/0304903 A1 | 12/2008 | Huang | |
| 2009/0008516 A1 | 1/2009 | Davis et al. | |
| 2009/0016043 A1 | 1/2009 | Hruby et al. | |
| 2009/0250421 A1 | 10/2009 | Wang et al. | |
| 2009/0293233 A1 | 12/2009 | Ho et al. | |
| 2010/0187960 A1 | 7/2010 | Liang | |
| 2010/0200523 A1 | 8/2010 | Henderson | |
| 2011/0000054 A1 | 1/2011 | Trifari, Jr. | |
| 2011/0006022 A1 | 1/2011 | Caveney et al. | |
| 2011/0019361 A1 | 1/2011 | Heistand, II et al. | |
| 2011/0061198 A1 | 3/2011 | Fan | |
| 2011/0073725 A1 | 3/2011 | Aoyama | |
| 2011/0095495 A1 | 4/2011 | Fan et al. | |
| 2011/0181161 A1 | 7/2011 | Hsiao | |
| 2012/0062083 A1* | 3/2012 | Lewis, II | H05K 7/18 312/223.1 |
| 2012/0062084 A1* | 3/2012 | Lewis, II | H05K 5/0234 312/223.6 |
| 2012/0062091 A1 | 3/2012 | Donowho et al. | |
| 2012/0063099 A1* | 3/2012 | Alaniz | H05K 7/1447 361/724 |
| 2012/0145850 A1 | 6/2012 | Yu et al. | |
| 2012/0273438 A1* | 11/2012 | Nordin | H04Q 1/025 211/26 |
| 2012/0292278 A1 | 11/2012 | Schluter et al. | |
| 2012/0321230 A1 | 12/2012 | Chen et al. | |
| 2013/0075350 A1 | 3/2013 | Raney | |
| 2013/0119215 A1 | 5/2013 | Chen et al. | |
| 2013/0154216 A1 | 6/2013 | Faulk, Sr. et al. | |
| 2013/0336714 A1 | 12/2013 | Scherer | |
| 2014/0008313 A1 | 1/2014 | Chen | |
| 2014/0111070 A1 | 4/2014 | Ehlen | |
| 2014/0139976 A1 | 5/2014 | Santoni et al. | |
| 2014/0153186 A1 | 6/2014 | Liu et al. | |
| 2014/0153187 A1 | 6/2014 | Liu et al. | |
| 2014/0159554 A1 | 6/2014 | Liu et al. | |
| 2014/0160713 A1 | 6/2014 | Eguchi et al. | |
| 2014/0319084 A1 | 10/2014 | Lewis, II et al. | |
| 2015/0069888 A1 | 3/2015 | Lewis, II et al. | |
| 2015/0122752 A1 | 5/2015 | Shen et al. | |
| 2015/0250071 A1 | 9/2015 | Garza, Jr. et al. | |
| 2015/0351267 A1 | 12/2015 | Shah et al. | |
| 2016/0309607 A1 | 10/2016 | Hsu | |
| 2017/0008379 A1 | 1/2017 | Gennissen | |
| 2017/0354246 A1 | 12/2017 | Wayner et al. | |

* cited by examiner

EQUIPMENT RACK HAVING MOUNTING RAILS

CROSS-REFERENCE TO RELATED APPLICATION

This application claims priority to U.S. Provisional Patent Application Ser. No. 62/289,212, filed Jan. 30, 2016, which is hereby incorporated by reference in its entirety.

FIELD OF THE DISCLOSURE

The present disclosure generally relates to an equipment rack and components thereof.

BACKGROUND OF THE DISCLOSURE

Electronic equipment components, such as computer servers, routers, switches, data storage devices, and power supplies, are often mounted on equipment racks (e.g., cabinets or enclosures). These rack-mounted components and devices are available in various physical sizes, depending upon the manufacturer, and vary considerably in height and depth. In some cases, customized cabinetry is required to accommodate the many different equipment configurations, which may be expensive to purchase and maintain, and may result in a data center with multiple specialized cabinets that are not fully loaded with equipment. Cabinets and enclosures are often required to satisfy one or more industry standards, such as the Electronic Industries Association (EIA) EIA-310-D standard, which defines requirements for the industry-standard nineteen-inch rack, and in particular, establishes parameters for the rail mounting-hole patterns.

SUMMARY OF THE DISCLOSURE

In one aspect, an equipment rack includes a frame assembly including first and second generally horizontal braces. One of the first and second braces is positioned lower than the other of the first and second braces. A mounting rail includes an elongate rail body extending vertically between the first and second braces and a releasable clamp operatively coupled to the elongate rail body. The clamp includes a clamp arm movable between a clamped position, in which the clamp arm is in clamping engagement with the brace to secure the rail body in a selected horizontal position on the first brace, and an unclamped position, in which the clamp arm is free from clamping engagement with the first brace to allow the rail body to move horizontally along the first brace. A lever arm is operatively coupled to the clamp arm and configured to rotate relative to the clamp arm to impart movement of the clamp arm between the clamped and unclamped positions.

In another aspect, a method of configuring an equipment rack includes providing a mounting rail on a brace of a frame of the equipment rack. The brace extends between and interconnects two uprights of the frame. The method includes sliding the mounting rail along a length of the brace to a selected position on the brace when a clamp arm of the mounting rail is in an unclamped position. The method includes clamping the mounting rail on the brace by rotating a lever arm operatively coupled to the clamp arm to move the clamp arm to a clamped position, in which the clamp arm is in clamping engagement with the brace.

In yet another aspect, a mounting rail is for an equipment rack includes a brace. The mounting rail includes an elongate rail body having a web and a lip. The lip extends transversely with respect to the web. The lip includes a plurality of mounting openings spaced apart along a length of the lip for mounting equipment on the rail body. A clamp includes a clamp arm at least partially defining a channel for receiving the brace. The clamp arm includes a first portion extending away from the web and a second portion extending from the first portion. The second portion extending transversely with respect to the first portion. The clamp including a lever arm rotatable with respect to the clamp arm for moving the second portion between a clamped position and a non-clamped position. The second portion in the clamped position being spaced from the web of the rail body.

Other features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE DISCLOSURE

Figure 1:
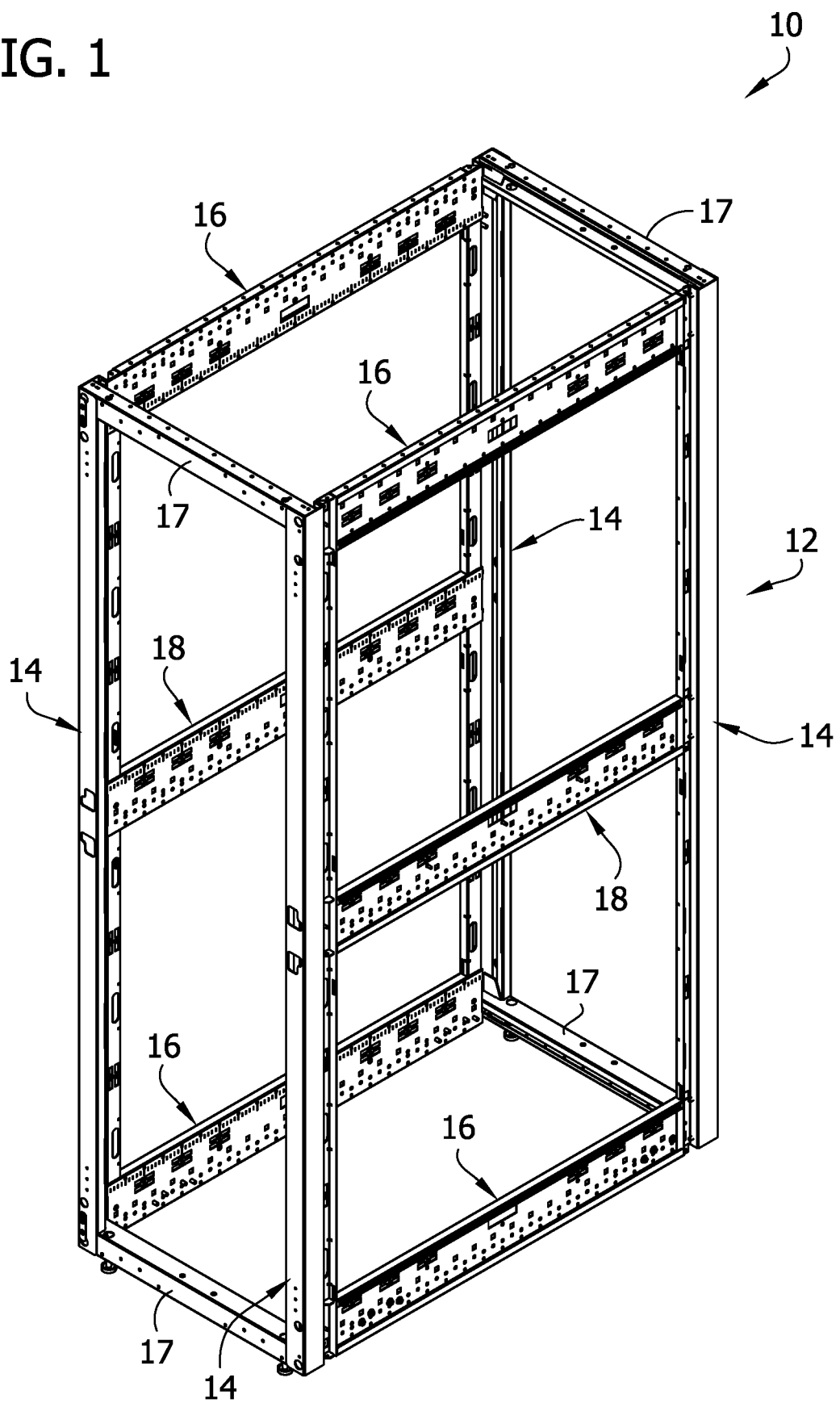
FIG. 1 is a perspective of an equipment rack including one embodiment of a frame assembly.
Figure 2:
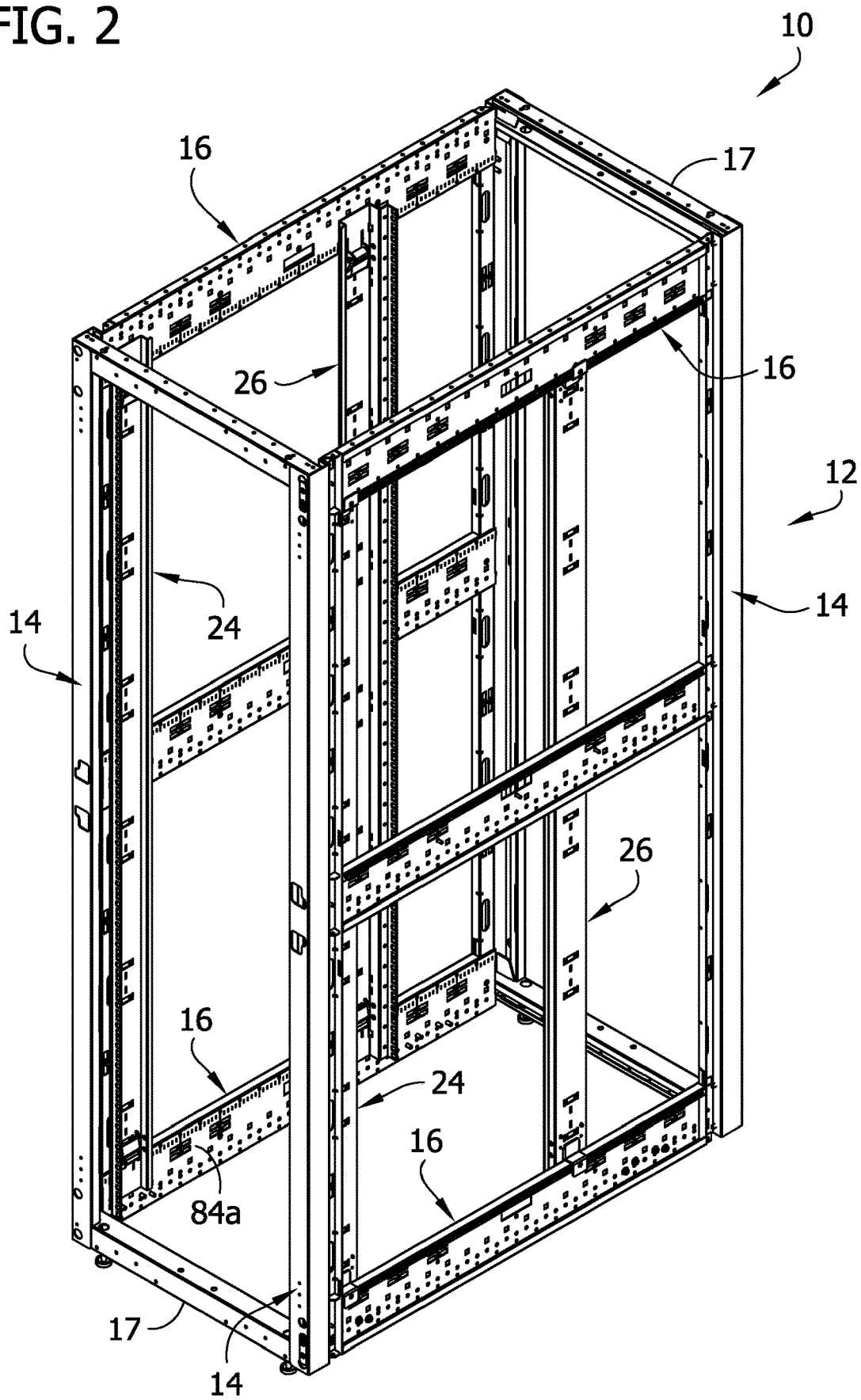
FIG. 2 is similar to FIG. 1, with the addition of one embodiment of mounting rails secured to the frame assembly.

Referring to FIG. 1 of the drawings, one embodiment of an equipment rack is generally indicated at reference numeral 10. The equipment rack 10 may be part of or otherwise be referred to as an equipment cabinet or enclosure. The illustrated equipment rack 10 is particularly suitable for mounting equipment, such as but not limited to computer servers, routers, switches, data storage devices, and/or power supplies (not show), thereon. The illustrated equipment rack 10 is generally in the form of a cabinet-type equipment rack, including a frame assembly, generally indicated at 12. The frame assembly 12 has generally rectangular footprint and a front, a back, a left side, a right side, an upper end and a lower end. In FIG. 1, the front faces out of the page to the left, the back faces into the page to the right, the left side faces into the page to the left, and the right side faces out of the page to the right. The frame assembly 12 comprises four uprights, generally indicated at 14 (e.g., vertical supports or struts), at four corners of the frame assembly. The four uprights 14 may be identical in structure, as explained in more detail below. The frame assembly 12 also includes upper and lower side braces, generally indicated at 16 (e.g., horizontal supports or struts), secured to, extending between, and interconnecting adjacent uprights at the left and right sides of the frame assembly adjacent the respective upper and lower ends of the frame assembly. The upper and lower side braces 16 may be identical in structure, although, for reasons that will be apparent below, the upper side braces may be oriented upside-down (i.e., inverted) relative to the lower side braces. Upper front, upper back, lower front, and lower back braces, each indicated at 17 (e.g., horizontal supports or struts), are secured to, extend between, and interconnect adjacent uprights 14 at the front and back of the frame assembly 12 adjacent the respective upper and lower ends of the frame assembly. These braces 17 may be identical to one another and of a different structure than the upper and lower side braces 16. The frame assembly 12 further includes intermediate left and right side braces 18 located between the upper and lower braces 16 and secured to, extending between, and interconnecting adjacent uprights 14 at the left and right sides of the frame assembly. The intermediate side braces 18 may be identical in structure to the upper and lower side braces 16, as illustrated. It is understood that in one or more embodiments, one or more of the uprights 14 and/or the braces 16, 17, 18 may have a structure other than illustrated without necessarily departing from the scope of the claims.

The uprights 14 may be formed from sheet metal, having a thickness from 10 gauge to 20 gauge, for example, or other suitable thicknesses. The uprights 14 may be formed from other materials suitable for providing structural support to the equipment rack 10. The braces 16, 17, 18 may be formed from sheet metal, having a thickness from 10 gauge to 20 gauge, for example, or other suitable thicknesses. The braces 16, 17, 18 may be formed from other materials suitable for providing structural support to the equipment rack 10. The braces 16, 17, 18 may be secured to the corresponding uprights 14 in suitable ways, including but not limited to, mechanically fastening (e.g., screws, bolts, nuts), welding, brazing, soldering, and/or adhesion. The upper braces 16, 17 may be secured to one another to form an upper frame member (e.g., rectangular frame member), and the lower braces may be secured to one another to form a lower frame member (e.g., rectangular frame member). The corresponding braces 16, 17 may be secured to one another in suitable ways, including but not limited to, mechanically fastening (e.g., screws, bolts, and nuts), welding, brazing, soldering, and/or adhesion.

Although not shown, upper and/or lower panels may be secured to the respective upper and lower ends of the frame assembly 12. Left and right panels (not shown) may be secured to the respective left and right sides of the frame assembly 12. A back panel (not shown) may be secured to the back of the frame assembly 12. A door (not shown) may be attached to the front of the frame assembly 12 to allow access (e.g., permitted access) to the equipment in the rack.

Referring to FIGS. 2-12, in one or more embodiments the equipment rack 10 further includes at least one pair of mounting rails configured to mount the equipment within the rack. In the illustrated embodiment, the equipment rack 10 includes a first pair of mounting rails including left and right mounting rails (e.g., front mounting rails), each generally indicated at reference numeral 24, and a second pair of mounting rails including left and right mounting rails, each generally indicated at reference numeral 26. The left mounting rails 24, 26 are attached to and extend between the left upper brace 16 and the left lower brace 16. The right mounting rails 24, 26 are attached to and extend between the right upper brace 16 and the right lower brace 16. As explained below, the mounting rails 24, 26 are selectively, individually movable along the left and right upper and lower braces 16 to adjust the positions of the mounting rails along the lengths of the corresponding braces. In effect, the mounting rails 24, 26 are selectively movable forward and backward in the equipment rack 10.

Figure 3:
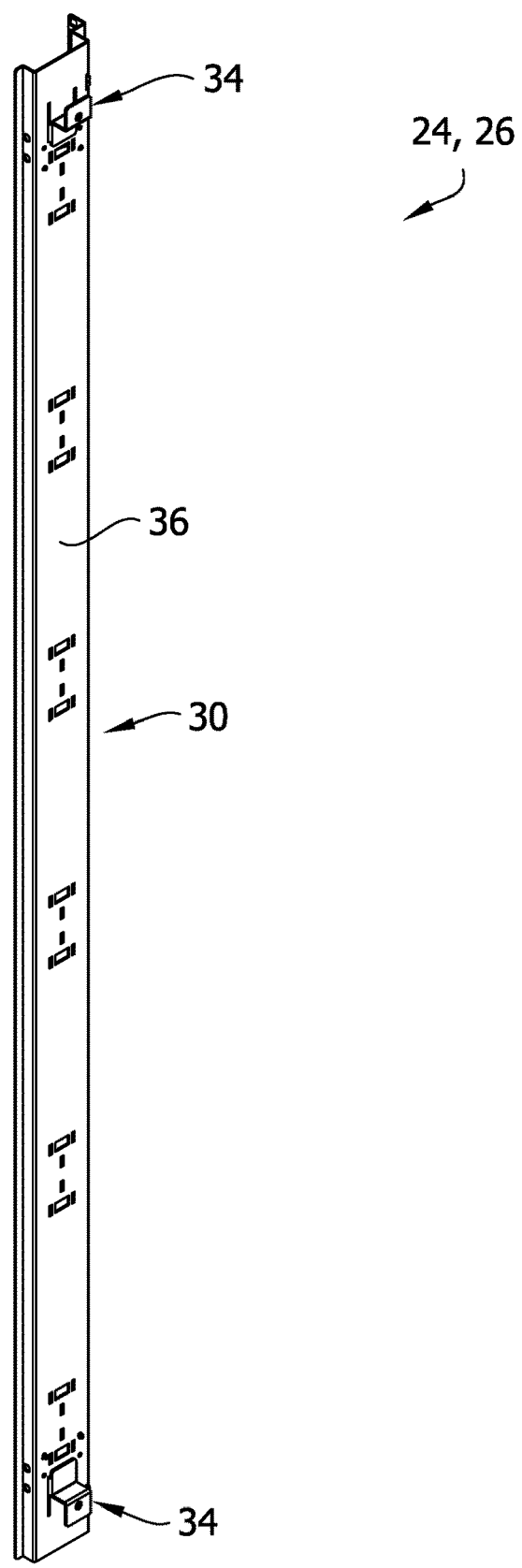
FIG. 3 is an enlarged perspective of one of the mounting rails.

Each of the mounting rails 24, 26 may be substantially identical to facilitate modularity of the rack 10. Referring to FIG. 3, each mounting rail 24, 26 includes an elongate rail body, generally indicated at 30 (e.g., a vertical strut), having a length extending between upper and lower ends thereof, and at least one releasable clamp, generally indicated at 34, configured to facilitate clamping of the mounting rail in a selected position relative to at least one of the corresponding upper and lower left and right braces 16 and unclamping of the mounting rail from the at least one of the corresponding upper and lower left and right braces to allow movement (e.g., sliding movement) of the mounting rail along the corresponding brace.

Figure 4:
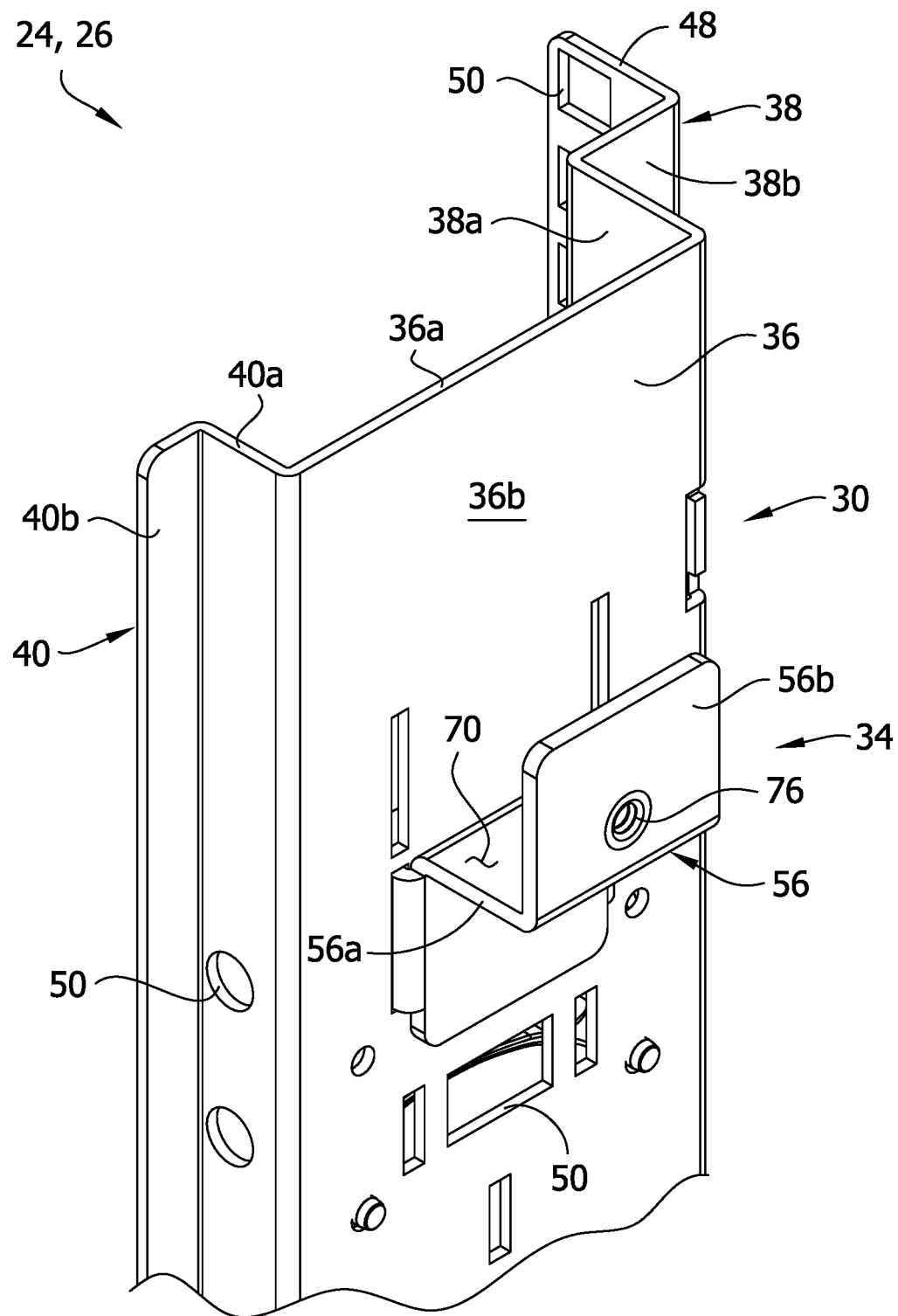
FIG. 4 is an enlarged, fragmentary view of FIG. 3 at an upper end of the mounting rail.
Figure 5:
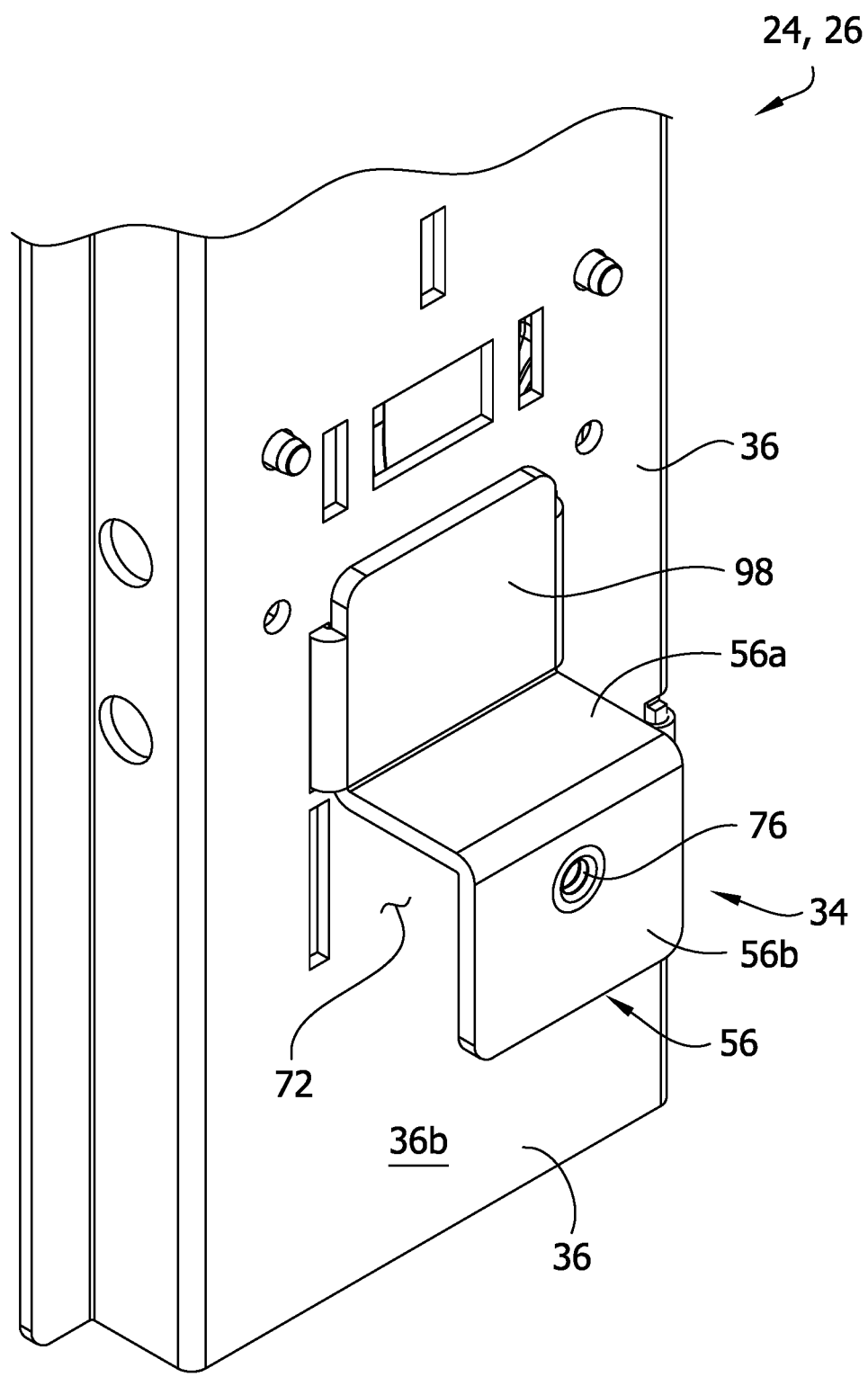
FIG. 5 is an enlarged, fragmentary view of FIG. 3 at a lower end of the mounting rail.
Figure 6:
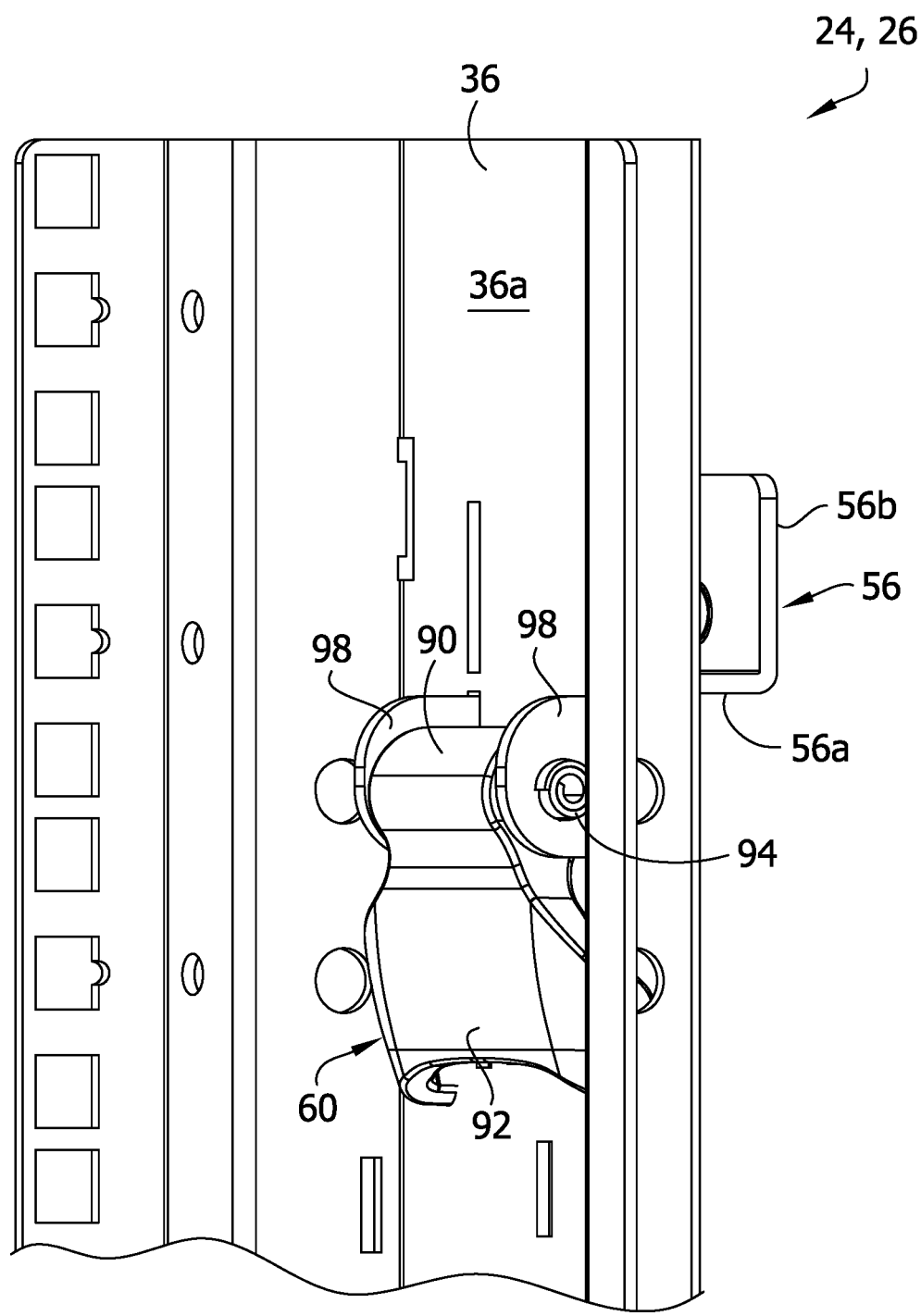
FIG. 6 is an enlarged, fragmentary perspective of the mounting rail, showing an inner side of the mounting rail at the upper end thereof.
Figure 7:
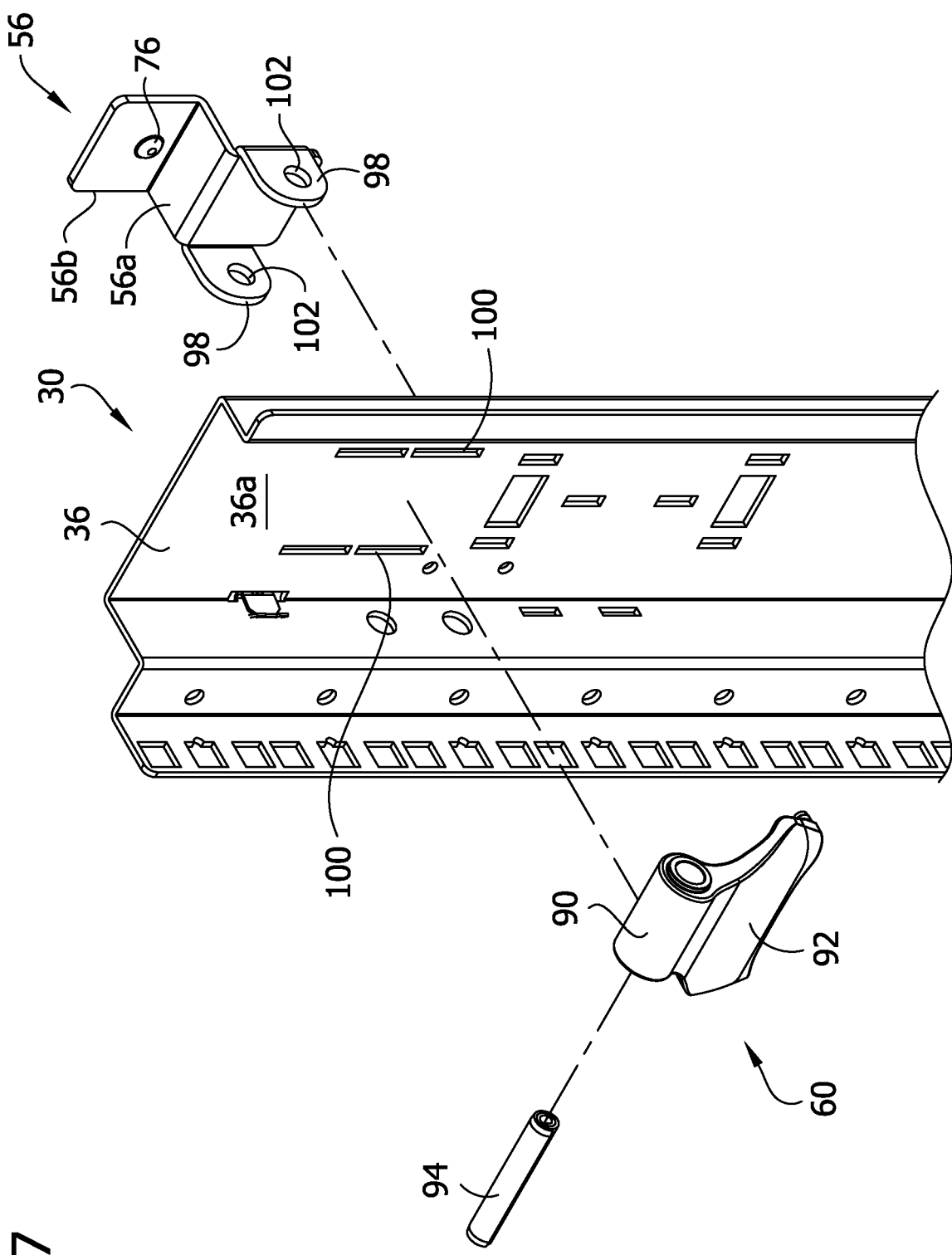
FIG. 7 is similar to FIG. 6, with components of the mounting rail shown exploded.

For ease of illustration, the following description refers to one mounting rail 24, 26 with the understanding that such descriptions applies equally to the other mounting rails. As shown in FIGS. 3 and 4, the rail body 30 in generally in the form of a strut including a web 36 with a generally planar shape, and opposite first and second L-shaped flanges, generally indicated at 38, 40, respectively, extending from opposites sides of the web. The L-shaped flanges 38, 40 have first portions 38a, 40a, respectively, extending inward, relative to the rack 10, at generally perpendicular angles from an inner surface 36a of web 36 to form a channel shaped-strut, and second portions 38b, 40b, respectively, at the ends of the respective first portions extending laterally away from the web. A lip 48 extends inward, relative to the rack 10, from the second portion 38b of the L-shaped first flange 38, such that the lip 48 is generally parallel to the first portion 38a of the L-shaped flange and perpendicular to the web 36. The web 36, the first and second L-shaped flanges 38, 40, respectively, and the lip 48 each define a plurality of mounting openings 50 spaced apart along its length. The mounting openings 50 are selectively used to facilitate mounting of the equipment in the rack 10 and/or for connecting other components and structures to the mounting rails 24, 26. As explained in more detail below, an outer surface 36b of the web 36 engages (i.e., contacts) inner surfaces of the respective upper and lower braces 16, 18 when the mounting rail 24, 26 is clamped on the upper and lower braces. The strut of the rail body 30 may be fabricated from sheet metal, having a thickness from 10 gauge to 20 gauge, for example, or other suitable thicknesses.

In the illustrated embodiment, each mounting rail 24, 26 includes two of the clamps 34, as shown in FIG. 3. In particular, each mounting rail 24, 26 includes upper and lower clamps 34 located adjacent respective upper and lower ends of the rail body 30. The upper and lower clamps 34 may be identical, although, as illustrated, the upper and lower clamps may have different orientations on the rail body 30 (see, e.g., FIGS. 4 and 5). Each illustrated clamp 34 is selectively configurable between a clamped configuration, to clamp the mounting rail 24, 26 on the corresponding brace 16 and resist movement of the mounting rail on the corresponding brace, and an unclamped configuration, to allow sliding movement of the mounting rail on the corresponding brace. As explained below, the illustrated clamp 34 includes a locking mechanism to releasably lock the clamp in the clamping configuration. The locking mechanism may be a cam lock, as explained below. It is understood that other types of clamps, including other ways of locking the clamp, do not necessarily depart from the scope of the claims.

Figure 10:
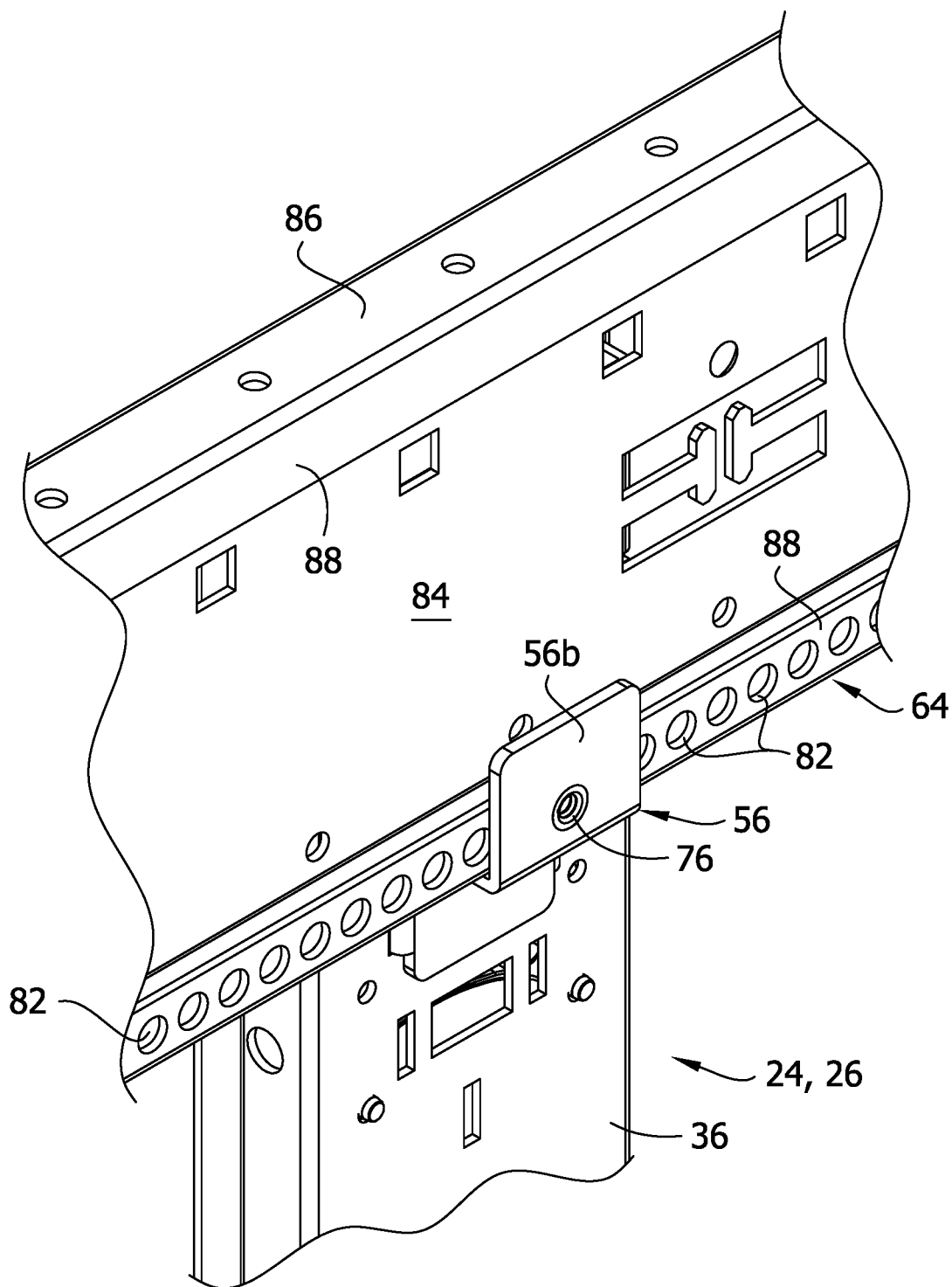
FIG. 10 is an enlarged, fragmentary perspective of the upper end of the mounting rail secured to an upper side brace of the equipment rack.
Figure 11:
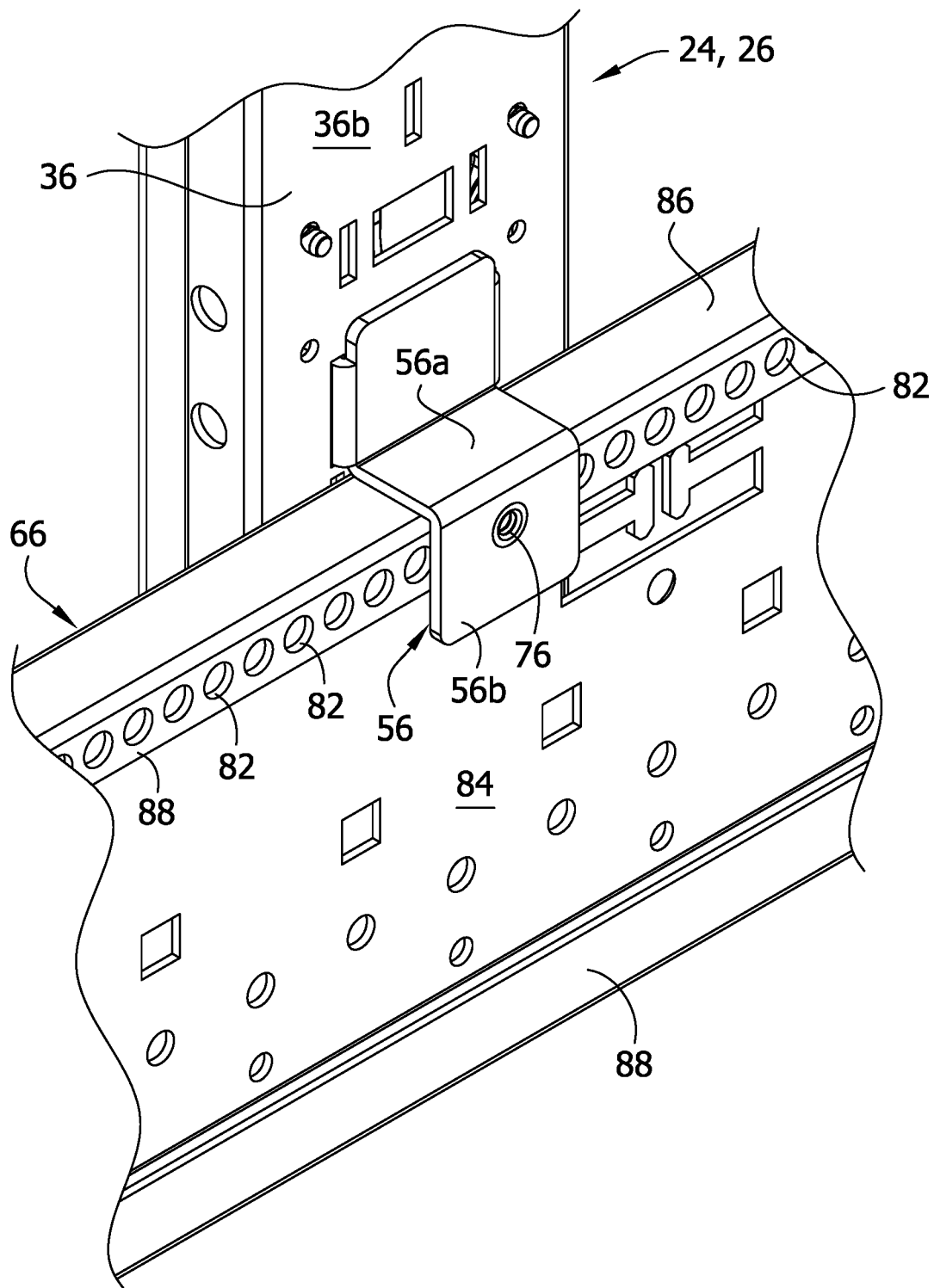
FIG. 11 is an enlarged, fragmentary perspective of the lower end of the mounting rail secured to a lower side brace of the equipment rack.

The clamp 34 includes a clamp arm, generally indicated at 56, extending outward from the outer surface 36b of the web 36, and a lever, generally indicated at 60, at the inner surface 36a of the web configured to move the clamp arm toward and away from the outer surface of the web. The illustrated clamp arm 56 is configured to engage (e.g., contact) the corresponding one of the upper and lower braces 16. As shown in FIG. 10, the clamp arm 56 of the upper clamp is arranged and configured to engage (e.g., contact) a lower portion, generally indicated at 64, of the upper brace 16. As shown in FIG. 11, the clamp arm 56 of the lower clamp 34 is arranged and configured to engage (e.g., contact) an upper portion, generally indicated at 66, of the lower brace 16. The illustrated clamp arm 56 of each clamp is L-shaped (i.e., generally L-shaped) having a first clamp portion 56a extending outward from (e.g., generally perpendicular to) the outer surface 36b of the web 36, and a second clamp portion 56b extending from (e.g., generally perpendicular to) the first clamp portion. The clamp arm 56 of the upper clamp 34 is arranged such that the second clamp portion 56b extends upward from (e.g., generally perpendicular to) the first clamp portion 56a, as shown in FIG. 4. The clamp arm 56 and the outer surface 36b of the web 36 define an upper channel 70 (FIG. 4) sized and shaped to receive the lower portion 64 of the upper brace 16 (as shown in FIG. 10). The clamp arm 56 of the lower clamp 34 is arranged such that the second clamp portion 56b extends downward from (e.g., generally perpendicular to) the first clamp portion 56a. The clamp arm 56 and the outer surface 36b of the web 36 define a lower channel 72 (FIG. 5) sized and shaped to receive the upper portion 66 of the lower brace 16 (as shown in FIG. 11).

The clamp arm 56 of each clamp 34 includes a detent projection 76 extending into the corresponding channel 70, 72. As will be understood from the following disclosure, in one or more embodiments each clamp 34 may function as and be referred to as a detent because of the detent projection 76. It is understood that the clamp 34 may not include the detent projection 76 and may not function as a detent. In the illustrated embodiment, the detent projection 76 extends from the second portion 56b of the clamp arm 56, although the detent projection may project from another portion of the clamp arm, such as the first portion 56a. The illustrated detent projection 76 comprises a nub or boss or other projecting component. The upper portions 66 of the lower side braces 16 and the lower portions 64 of the upper side braces each defines a plurality of detent-receiving recesses 82 (e.g., dimple, opening, aperture, gap or other defined structure) spaced apart from one another along the brace. In the illustrated embodiment, each of the upper and lower side braces 16 includes a web 84, upper and lower flanges 86 extending outward from (e.g., perpendicular to) the web, and upper and lower inturned lips 88 extending inward, relative to the web, from the upper and lower side flanges 16, respectively. Accordingly, the upper and lower side braces 16 comprise generally C-shaped struts. The upper flanges 86 and upper lips 88 define the upper portion 66 of the lower side braces 16, and the lower flanges 86 and the lower lips 88 define the lower portions 64 of the upper side braces 16. In the illustrated embodiments, at least one of the upper and lower lips 88 defines the detent-receiving recesses 82. As explained in more detail below, the detent projection 76 is configured to be received in any selected one of the plurality detent-receiving recesses 82 to facilitate locking of the mounting rail 24, 26 to the corresponding brace 16 and configured to be selectively removed from the detent-receiving recess to facilitate unlocking of the mounting rail from the corresponding brace. Accordingly, at least one of the lower and upper portions 64, 66 of the upper and lower side braces 16, respectively, defines a track on which the clamp arm 56 is selectively slidable to adjust the position of the mounting rail 24, 26 in the rack 10.

Figure 8:
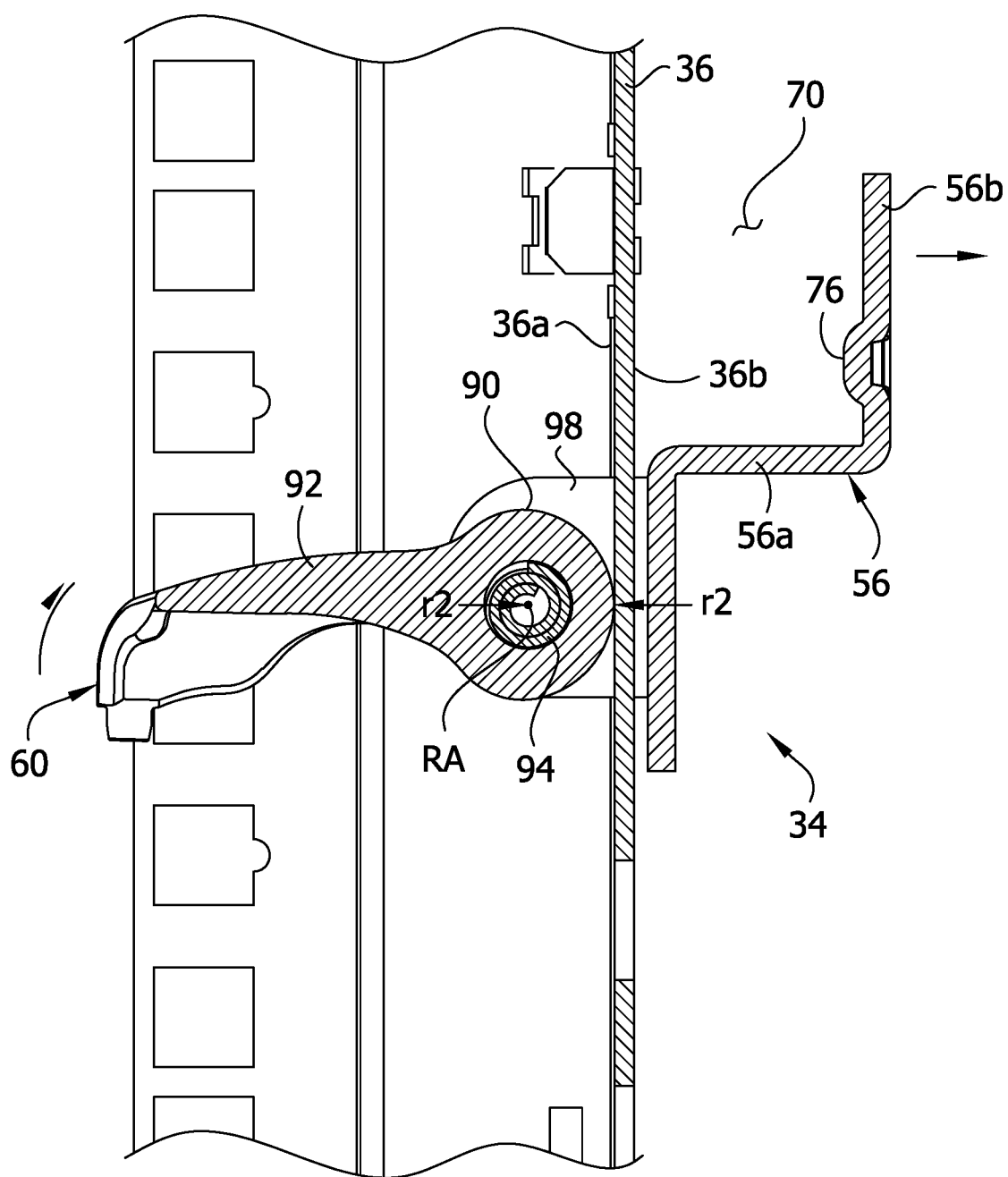
FIG. 8 is an enlarged cross section at the upper end of the mounting rail showing a clamp in an unlocked position.
Figure 9:
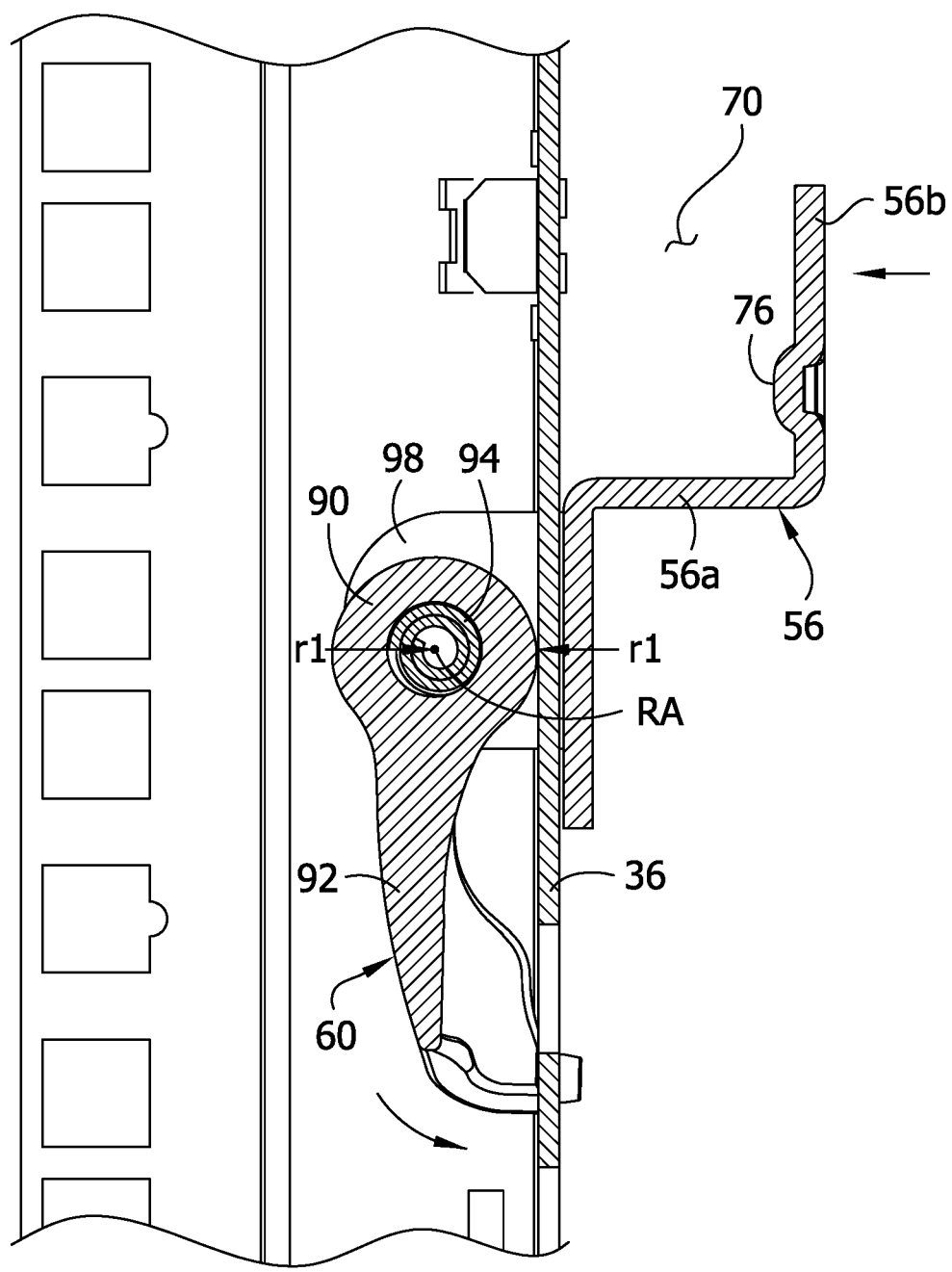
FIG. 9 is similar to FIG. 8, with the clamp in the locked position.

The lever 60 includes a cam 90 (e.g., a cylindrical cam) pivotally coupled to the clamp arm 56, and a lever arm 92 secured to the cam for manually actuating rotation of the cam about a rotational axis RA relative to the clamp arm and the rail body 30. In the illustrated embodiment, the lever 60 includes a trunnion 94 (e.g., a pivot pin) defining the rotational axis RA and rotatably coupled to a trunnion bearing 98 secured to the clamp arm 56. The trunnion bearing 98 includes spaced apart bearing arms (indicated by same reference numeral 98) extending inward relative to the clamp arm 56 through spaced apart slots 100 in the web 36 of the mounting rail 24, 26. The bearing arms 98 define trunnion-receiving openings 102 in which the trunnion 94 is rotatably received at the inner side of the web 36. The cam surface of the cam 90 has an eccentric circumference having a non-uniform diameter about the rotational axis RA. To lock the clamp 34, the lever arm 92 is rotated toward the web 36 to a cam-locked position, as shown in FIG. 9 for example, so that the cam 90 rotates about the rotational axis RA and a circumferential portion of the cam surface having a relatively larger radius r1 with respect to the rotational axis engages (i.e., contacts) and rides on (e.g., pushes against) the inner surface 36a of the web to move the clamp arm 56 toward the outer surface 36b of the web. To unlock the clamp 34, the lever arm 92 is rotated away the web 36 to an unlocked position, as shown in FIG. 8 for example, so that the cam 90 rotates about the rotational axis RA and a circumferential portion of the cam surface having the relatively larger radius r1 disengages from (e.g., is no longer in contact with) the inner surface 36a of the web 36 and a circumferential portion of the cam surface having a relatively smaller radius r2 with respect to the rotational axis RA rides on the inner surface 36a of the web 36 to allow the clamp arm 56 to move away from the outer surface 36 of the web.

In use, the one or more pairs of mounting rails 24, 26 are connected to the upper and lower side braces 16. The clamps 34 are configured in the unclamped configuration (e.g., the circumferential portion of the cam surface having the relatively smaller radius r2 is in engagement with and/or facing the inner surface 36a of the web 36). The lower portions 64 of the upper side braces 16 (e.g., the lower flanges 86 and the lower lips 88 of the braces) are inserted into the upper clamp channels 70 of the mounting rails 24, 26. The upper portions 66 of the lower braces 16 (e.g., the lower flanges 86 and the lower lips 88 of the braces) are inserted into the lower clamp channels 72 of the mounting rails 24, 26. With the clamps 34 in the unclamped configuration, the mounting rails 24, 26 are slidable along the upper and lower side braces 16 (e.g., the clamp arms 56 slide along the braces) to selected front-to-back positions within the equipment rack 10 and relative to the lengths of the side braces.

Figure 12:
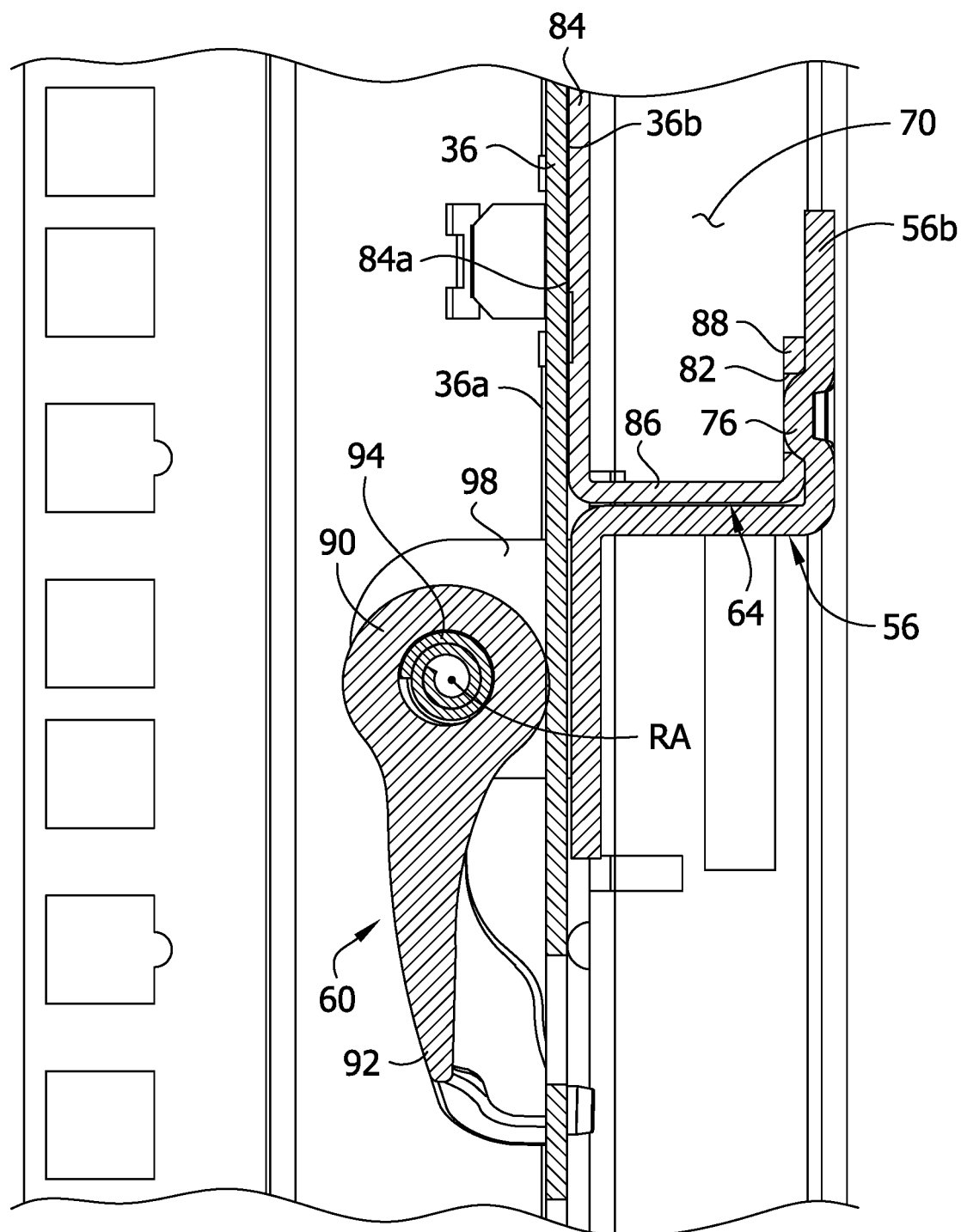
FIG. 12 is an enlarged cross section at the upper end of the mounting rail secured to the upper side brace of the equipment rack.
Figure 13:
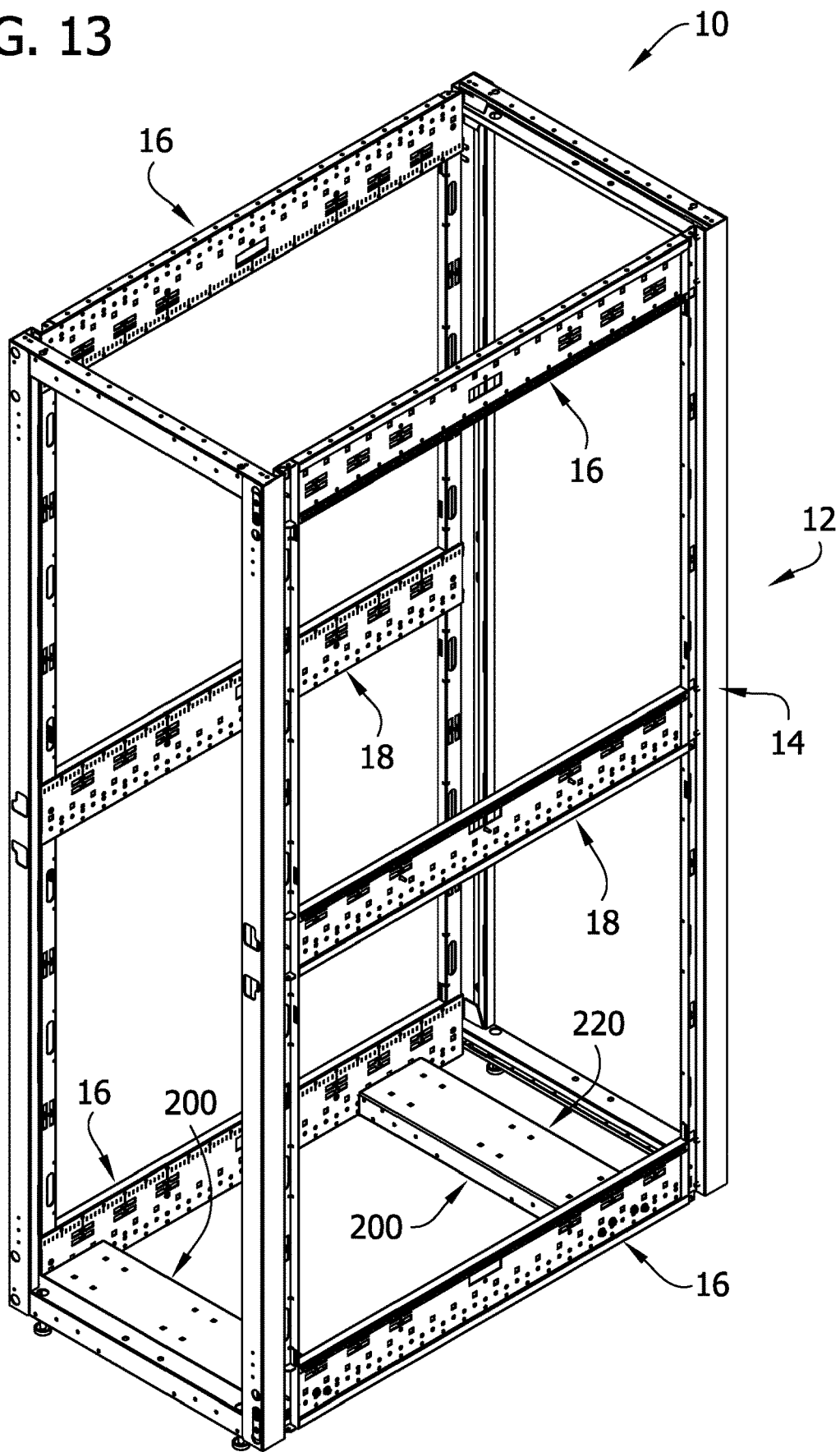
FIG. 13 is similar to FIG. 1, with the addition of one embodiment of caster bracket assemblies secured to the frame assembly.

Referring to FIG. 12, to lock the mounting rails 24, 26 in the selected positions on the upper and lower side braces 16, the lever arms 92 of the clamps 34 are manually rotated relative to the corresponding clamp arms 56 and rail bodies 30, such as rotated toward the web 36 of the rail body (e.g., downward), to actuate rotation of the cam 90. During rotation of the cam 90 the circumferential portion of the cam surface having the relatively larger radius r1 engages (e.g., contacts) and rides on (e.g., pushes against) the inner surface 36a of the web 36. This camming action moves the clamp arm 56 toward the corresponding upper and lower portions 64, 66 of the respective upper and lower side braces 16, whereupon the clamp arm 56 clamps the mounting rail 24, 26 to the corresponding side brace 16 such that the inner surface 84a of the web 84 of the brace contacts the outer surface 36b of the web 36 of the rail body 30. The cam 90 is in a locked position to inhibit unintentional unclamping of the clamp 34. In this clamped configuration of the clamp 34, the detent projection 76 on the clamp arm 56 enters one of the detent-receiving recesses 82 (broadly, forms a mating connection) to further inhibit unintentional movement of the mounting rail 24, 26 from its selected position. The detent-receiving recesses may be spaced apart from one another at uniform intervals along the lengths of the braces 16, including but not limited to, about 10 mm intervals.

The positions of the mounting rails 24, 26 can be quickly and easily repositioned in the rack 10 by unclamping the mounting rails. To selectively unlock one of the mounting rails 24, 26, the lever arms 92 of the upper and lower clamps 34 are manually rotated away from the web 36 of the rail body 30 (e.g., upward), to actuate rotation of the corresponding cams 92, whereupon the circumferential portions of the cam surfaces having the larger radii r1 disengage from the inner surface 36a of the web 36 to allow the clamp arms 56 to move away from the upper and lower portions 64, 66 of the respective lower and upper side braces 16 and unclamp the mounting rail. With the mounting rail 24, 26 unclamped from the brace 16, the mounting rail is allowed to slide along the corresponding brace. In this unclamped configuration of the clamps 34, the detect projections 76 on the clamp arms 56 are at least partially outside the detent-receiving recesses 82 to further allow sliding movement of the mounting rail 24, 26 along the corresponding brace 16.

Referring to FIGS. 46-49, another embodiment of a clamp is generally indicated at reference numeral 134. This clamp 134 is similar to the first clamp 34, with differences being described hereinafter. The clamp 134 may be used in the same way as described above with respect to the first clamp 34.

Like clamp 34, the present clamp 134 includes a clamp arm, generally indicated at 156, and a lever, generally indicated at 160. In general, the clamp arm 156 and the lever 160 function in the same manner as the respective clamp arm 56 and the lever 60 of the first clamp 34. In particular, the clamp arm 156 is configured to engage (e.g., contact) the corresponding one of the upper and lower braces 16. The clamp arm 156 is generally L-shaped having a first clamp portion 156a and a second clamp portion 156b, similar to the first clamp arm 56. The lever 160 includes a cam 190 (e.g., a cylindrical cam) pivotally coupled to the clamp arm 156, and a lever arm 192 secured to the cam for manually actuating rotation of the cam about a rotational axis RA2 relative to the clamp arm and the rail body 30. As with clamp 34, the cam surface of the cam 190 has an eccentric circumference having a non-uniform diameter about the rotational axis RA2, and the lever 160 includes a trunnion 194 (e.g., a pivot pin) defining the rotational axis RA2 and rotatably coupled to a trunnion bearing 198 secured to the clamp arm 156. The trunnion bearing 198 includes spaced apart bearing arms (indicated by same reference numeral 198).

Figure 48:
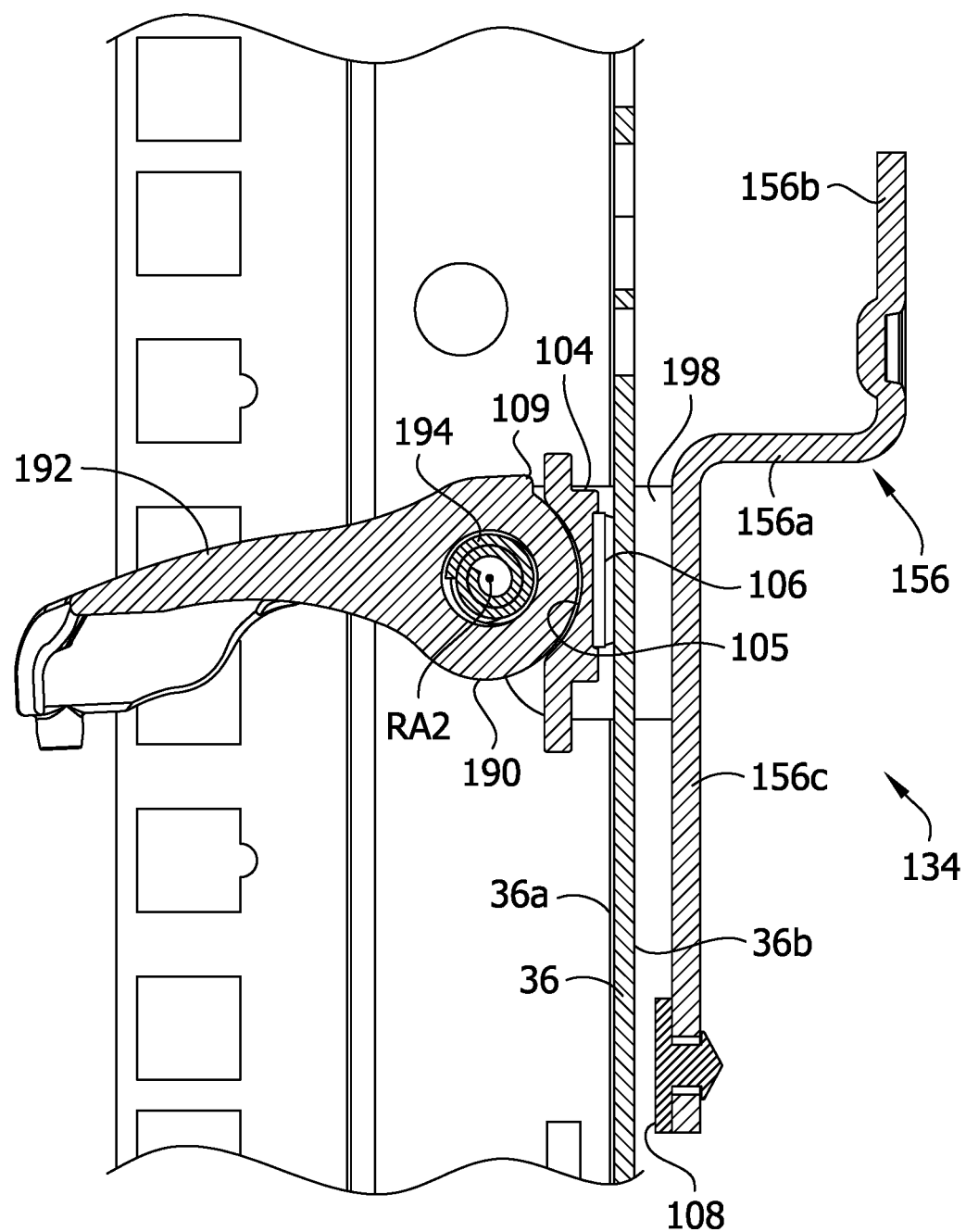
FIG. 48 is an enlarged cross section at the upper end of the mounting rail showing the clamp in an unlocked position.
Figure 49:
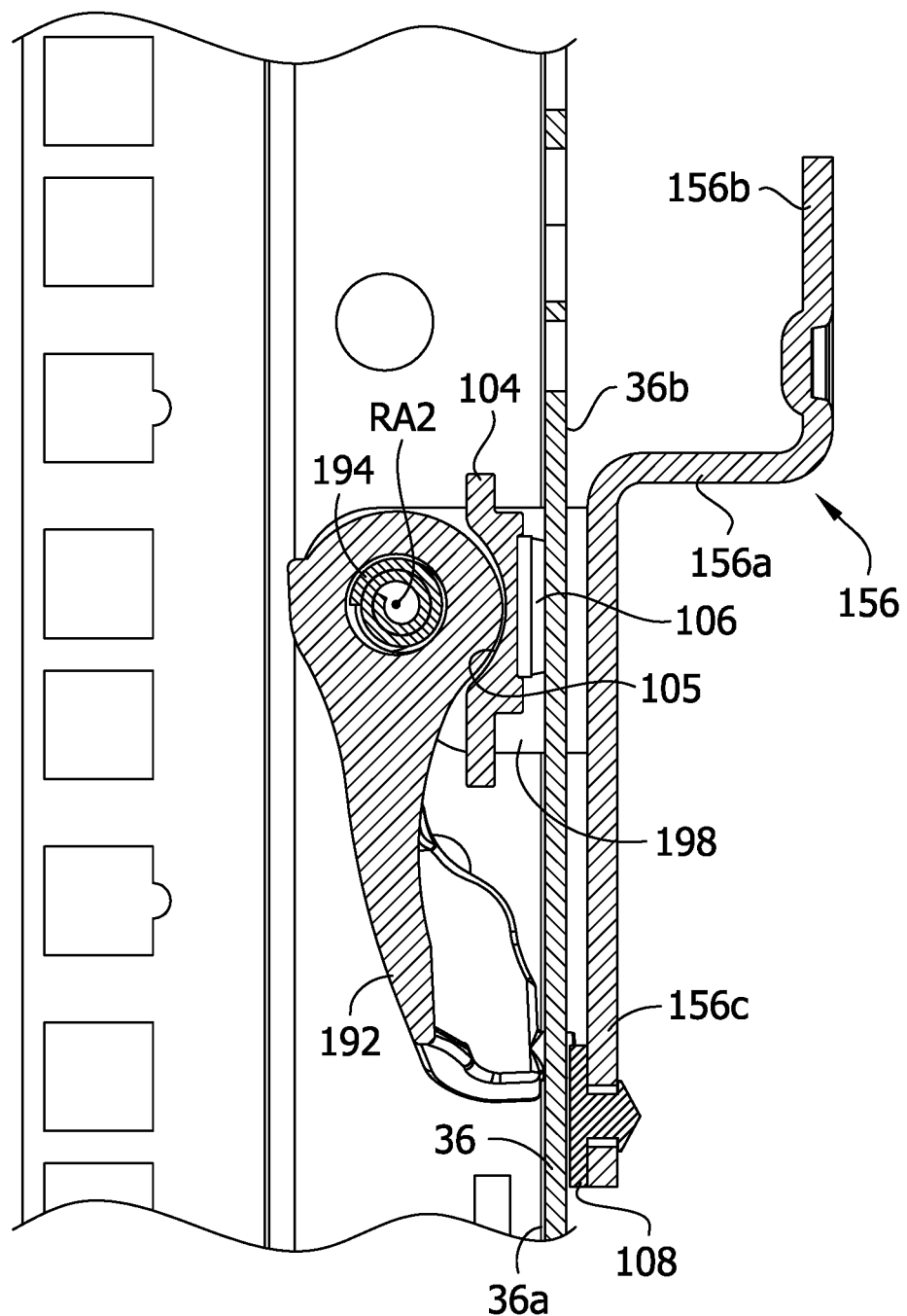
FIG. 49 is similar to FIG. 48, with the clamp in the locked position.

Unlike the clamp 34, the present clamp 134 includes a thrust plate 104 disposed between the cam 190 and the inner surface 36a of the web 36. The thrust plate 104 increases a clamping force of the clamp 134 on the brace 16. The cam 190 engages and rides on a bearing surface 105 of the thrust plate 104 having a shape generally corresponding to the shape of the surface of the cam 190 (e.g., the bearing surface 105 defines a recess in which the cam is received). The thrust plate 104 is captured by the trunnion bearing 198 to maintain its position between the cam 190 and the inner surface 36a of the web 36. The trunnion bearing 198 is slidable inward and outward relative to the thrust plate 104 during locking and unlocking of the clamp 134. To lock the clamp 134, the lever arm 192 is rotated toward the web 136 to a cam-locked position, as shown in FIG. 49 for example, so that the cam 190 rotates about the rotational axis RA2 and a circumferential portion of the cam surface having a relatively larger radius with respect to the rotational axis engages (i.e., contacts) and rides on (e.g., pushes against) the bearing surface 105 of the thrust plate 104 to move the clamp arm 156 toward the outer surface 36b of the web 36. One or more bumpers 106 (e.g., a resiliently compressible bumper) engages the inner surface 36a of the web 36 and may compress as the clamp arm 156 clamps on the brace 16. The illustrated embodiment also includes a bumper 108 (e.g., a resiliently compressible bumper) attached to a body component 156c of the clamp arm 156 that engages the outer surface 36b of the web 36 may compress as the clamp arm 156 clamps on the brace 16. To unlock the clamp 134, the lever arm 192 is rotated away the web 36 to an unlocked position, as shown in FIG. 48 for example, so that the cam 190 rotates about the rotational axis RA2 and a circumferential portion of the cam surface having the relatively larger radius disengages from (e.g., is no longer in contact with) the bearing surface 105 of the thrust plate 104 and a circumferential portion of the cam surface having a relatively smaller radius with respect to the rotational axis RA2 rides on the bearing surface 105 of the thrust plate 104 to allow the clamp arm 156 to move away from the outer surface 36b of the web 36.

The lever 192 of the clamp 134 includes a stop 109 that inhibits the lever from rotating beyond a selected rotational position (e.g., beyond about 90 degrees from its locked position). In the illustrated embodiment, the stop 109 projects outward from the cam surface of the cam 190 and engages the thrust plate 104 when the lever 192 is rotated to about 90 degrees from its locked position to inhibit further rotation of the lever.

Referring to FIGS. 13-16, in one or more embodiments, the equipment rack 10 may include at least one caster bracket, generally indicated at 200, for mounting casters 202 (broadly, wheels) at the lower end of the frame assembly 12. Together, the caster bracket 200 and the casters 202 form a caster bracket assembly. In the illustrated embodiment, the equipment rack 10 includes two caster brackets 200: a front caster bracket and a back caster bracket. The caster brackets 200 may be substantially identical to facilitate modularity of the rack 10. As shown best in FIG. 15, the caster bracket 200 has a generally rectangular footprint, including generally planar base 206 and front, back, left, and right side walls 208 extending downward from the corresponding sides of the base. The caster bracket 200 is attached to the frame assembly 12 adjacent the lower end thereof. In the illustrated embodiment, the caster bracket 200 extends between the inner surfaces 36a of the lower left and right braces 16. The left and right side walls 208 of the caster bracket 200 are attached to the left and right braces 16, respectively. In one example, a first set of mechanical fasteners 210 (e.g., screws or bolts and nuts) fasten the left side wall of the caster bracket to the lower left brace, and a second set of mechanical fasteners 212 (e.g., screws or bolts and nuts), which may be identical to the fasteners of the first set, fasten the right side wall 208 of the caster bracket 200 to the lower right brace 16. The fasteners 212 are inserted through openings 214 in the respective left and right walls 208 and openings 216 in the respective webs of the lower braces 16. The caster brackets 200 may be attached to the lower side braces 16 and/or the frame assembly 12 in other ways. Casters 202 are attached to the lower surface of the caster bracket body 206 using suitable fasteners 218 (e.g., screws or bolts and nuts) or in other ways.

Figure 14:
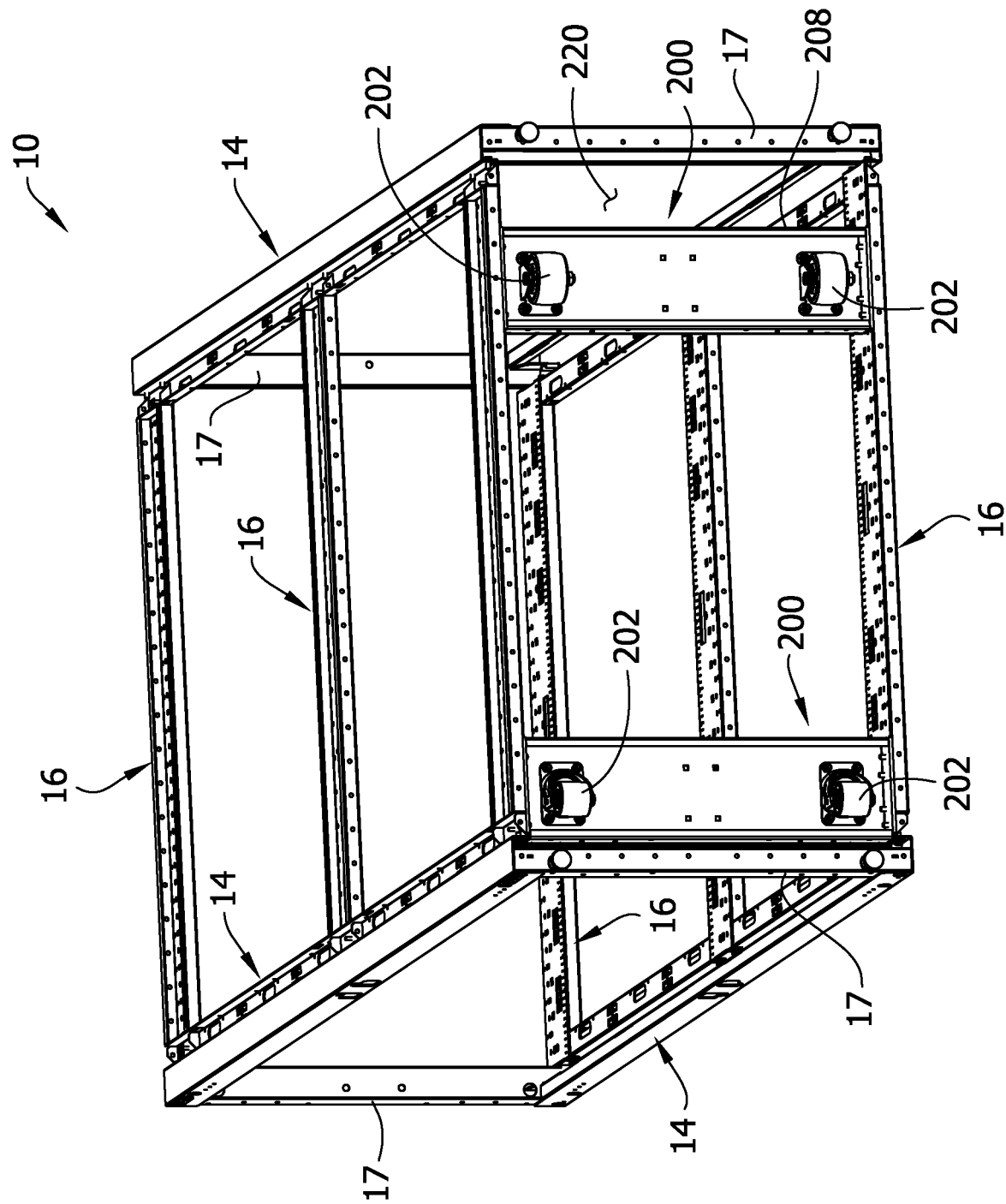
FIG. 14 is a bottom perspective of the equipment rack of FIG. 13.
Figure 15:
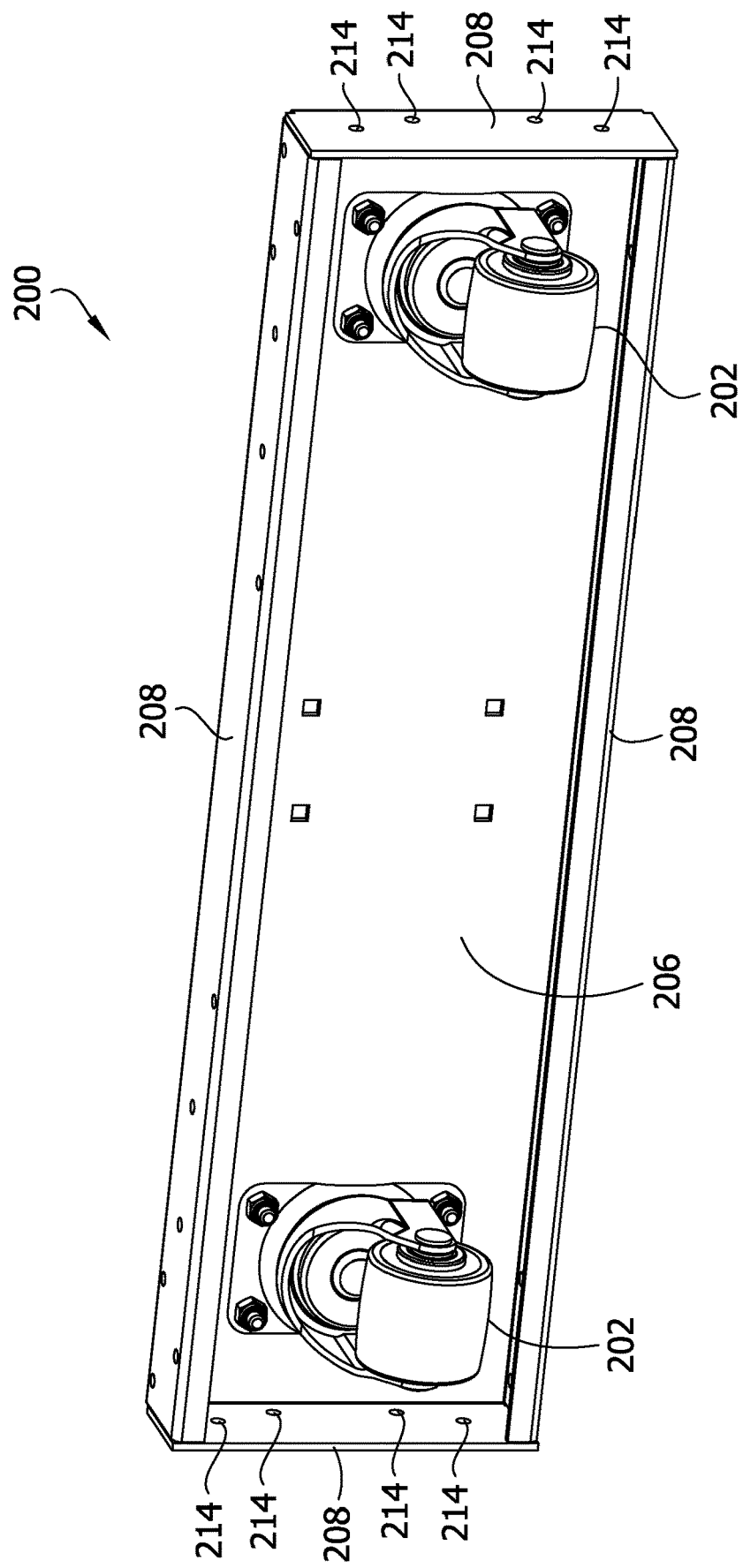
FIG. 15 is an enlarged, bottom perspective of one of the caster bracket assemblies.
Figure 16:
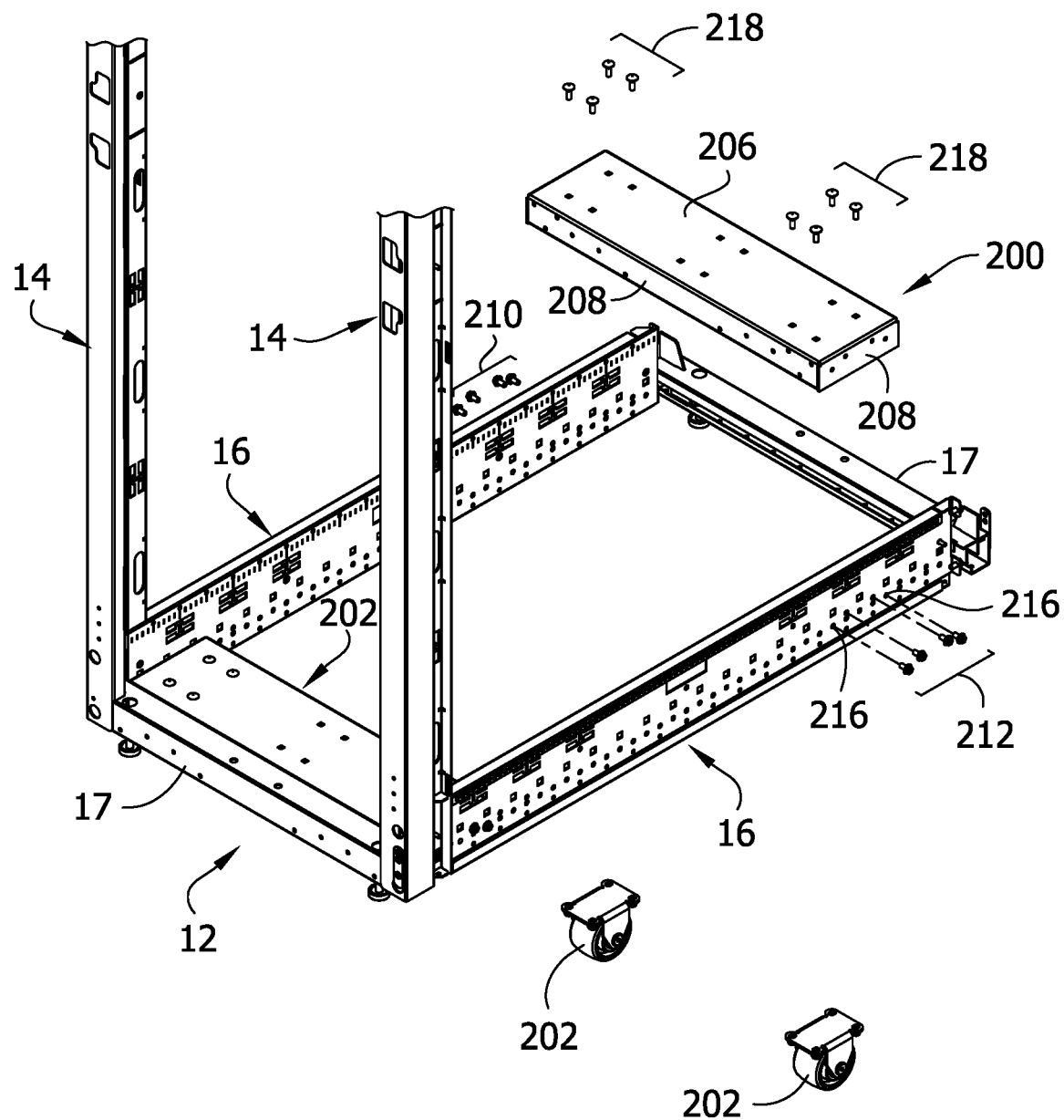
FIG. 16 is an enlarged, fragmentary view of FIG. 13, showing one of the caster bracket assemblies exploded from the frame assembly.

At least one of the caster brackets 200 (e.g., the rear caster bracket) is selectively attachable to the lower right and left braces 16 at a plurality of locations along the lengths of the braces to adjust the locations of the caster bracket in a front-to-back direction. As shown in FIG. 14, in one example this adjustable location of the rear caster bracket 200 allows the rear caster bracket to be attached to the frame assembly 12 such that the back side wall 208 of the caster bracket is spaced apart, in a forward direction, from the lower back brace 17 (i.e., spaced from the back side of the frame assembly) to define a gap 220 therebetween. Cables, wires, and/or other components may be fed through the gap 220 to outside the rack 10.

Figure 17:
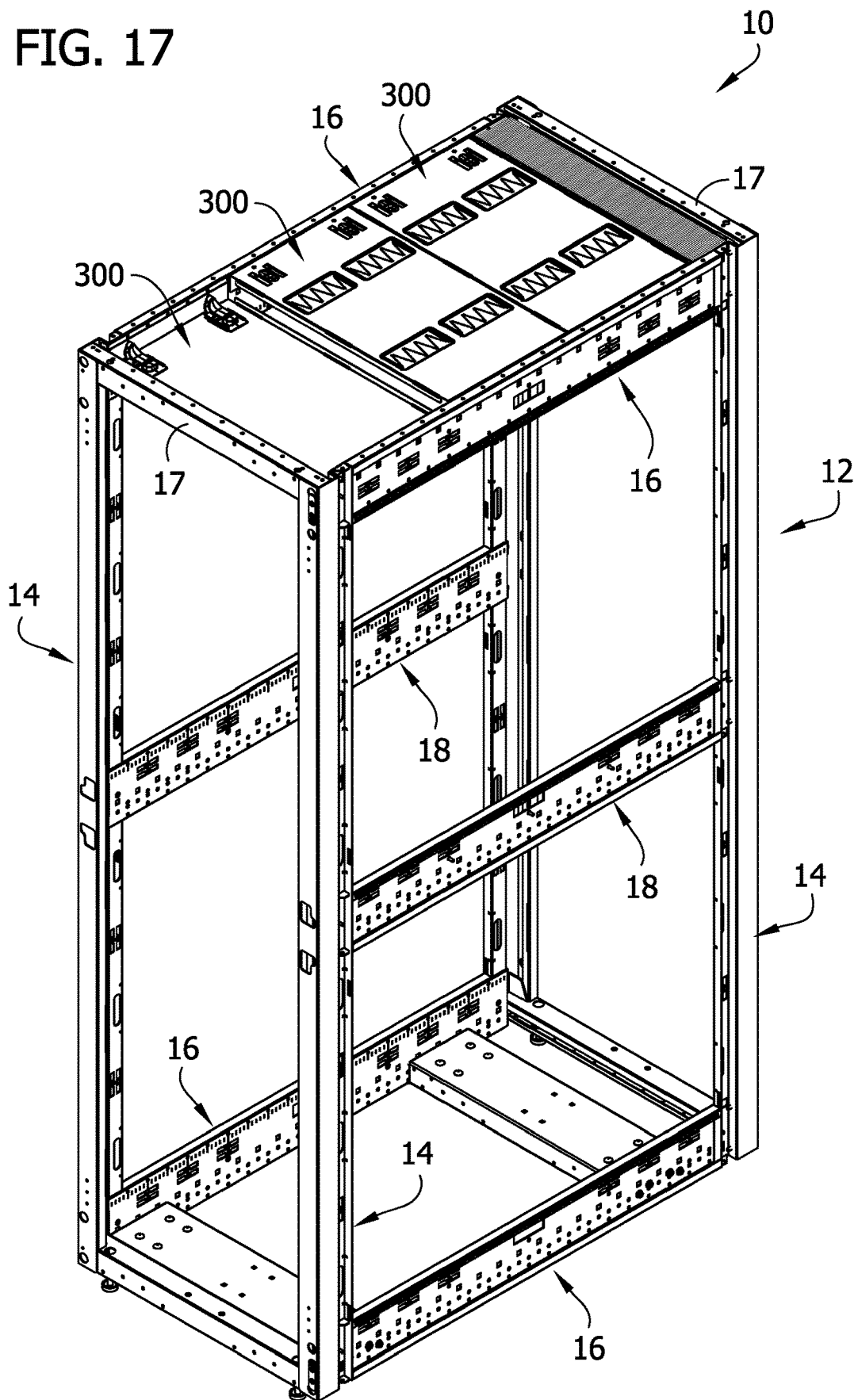
FIG. 17 is similar to FIG. 1, with the addition of horizontal panels attached to an upper end of the frame assembly.
Figure 18:
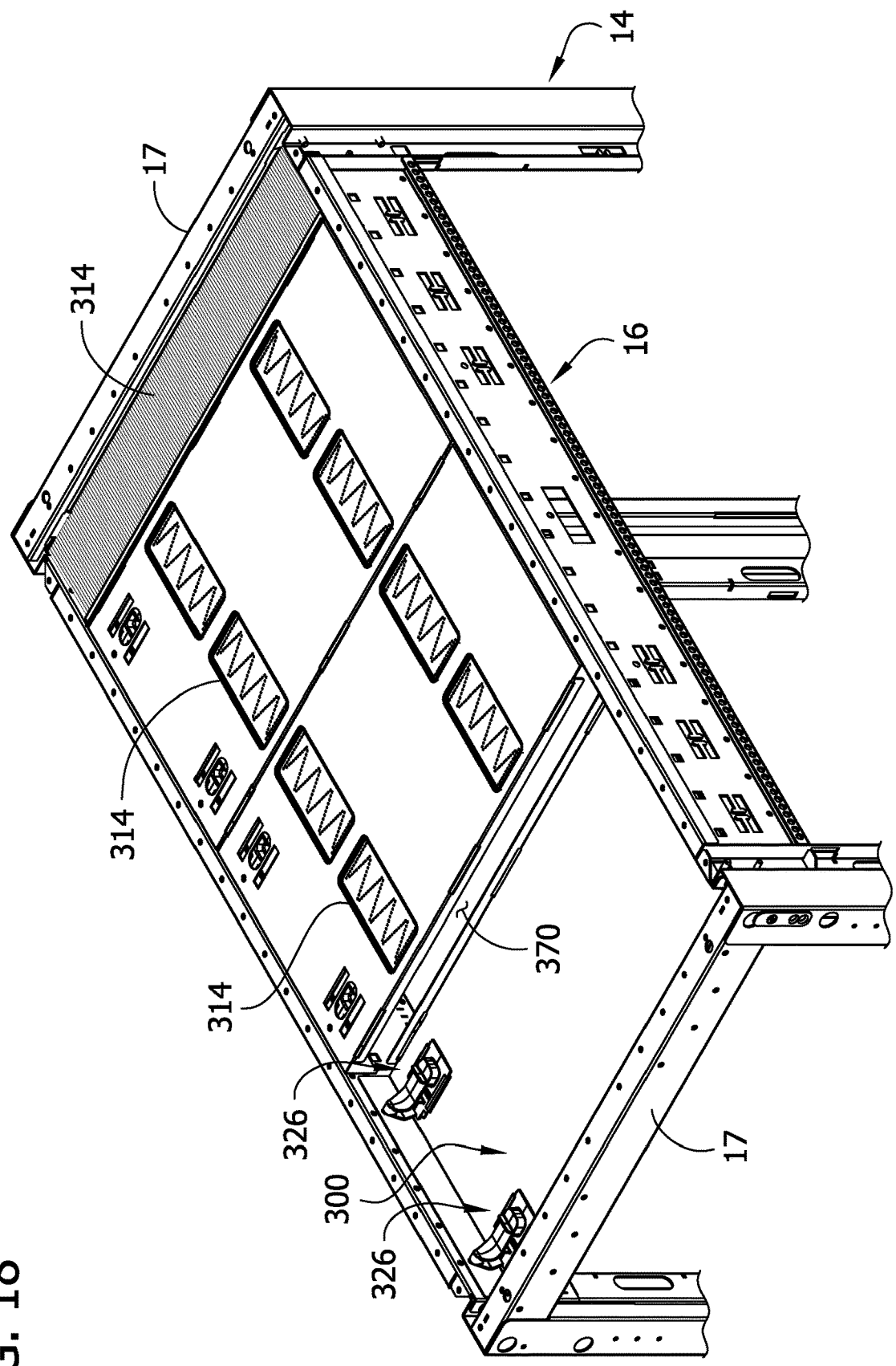
FIG. 18 is an enlarged, fragmentary view of FIG. 17 showing the horizontal panels.
Figure 19:
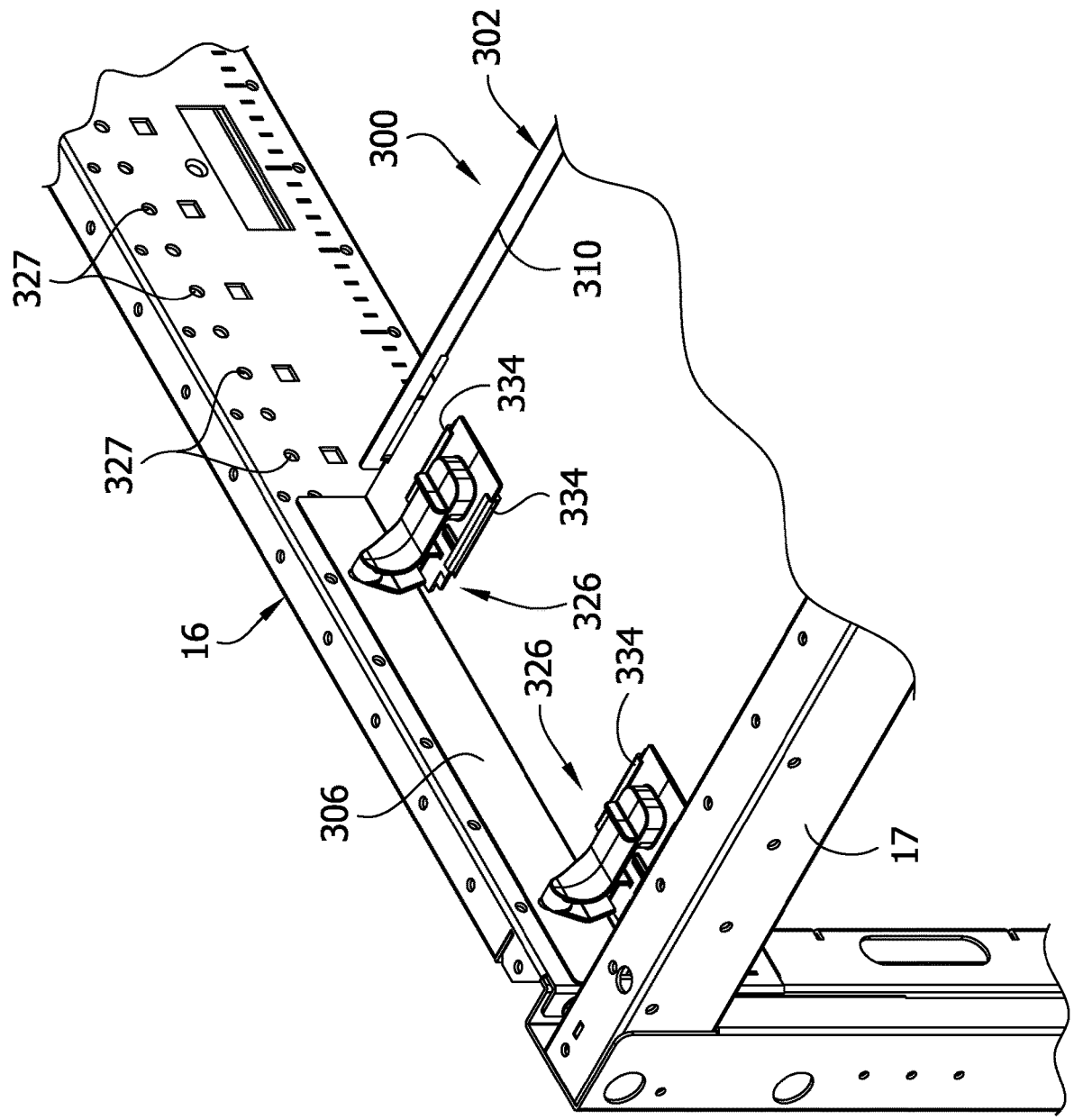
FIG. 19 is an enlarged, fragmentary view of FIG. 18 showing a front horizontal panel, with a middle horizontal panel removed from the frame assembly.

Referring to FIGS. 17-19, in one more embodiments, the equipment rack 10 may include one or more horizontal panel assemblies, each generally indicated at reference numeral 300, secured to one or both of the upper end and the lower end of the frame assembly 12. In the embodiment shown in FIG. 17, the equipment rack 10 includes a plurality of upper horizontal panel assemblies 300 (e.g., 3 upper horizontal panel assemblies) secured to the upper end of the frame assembly 12, forming a ceiling of the rack. It is understood that the horizontal panel assemblies 300 may be secured to the lower end of the frame assembly 12 to form a floor of the equipment rack 10. The illustrated horizontal panel assemblies 300 are modular in that the horizontal panel assemblies can be arranged in different configurations at the lower end and/or the upper end of the frame assembly 12, as explained in more detail below. Moreover, the horizontal panel assemblies 300 may be secured to the frame assembly 12 in an inverted orientation, as explained in more detail below.

Figure 20:
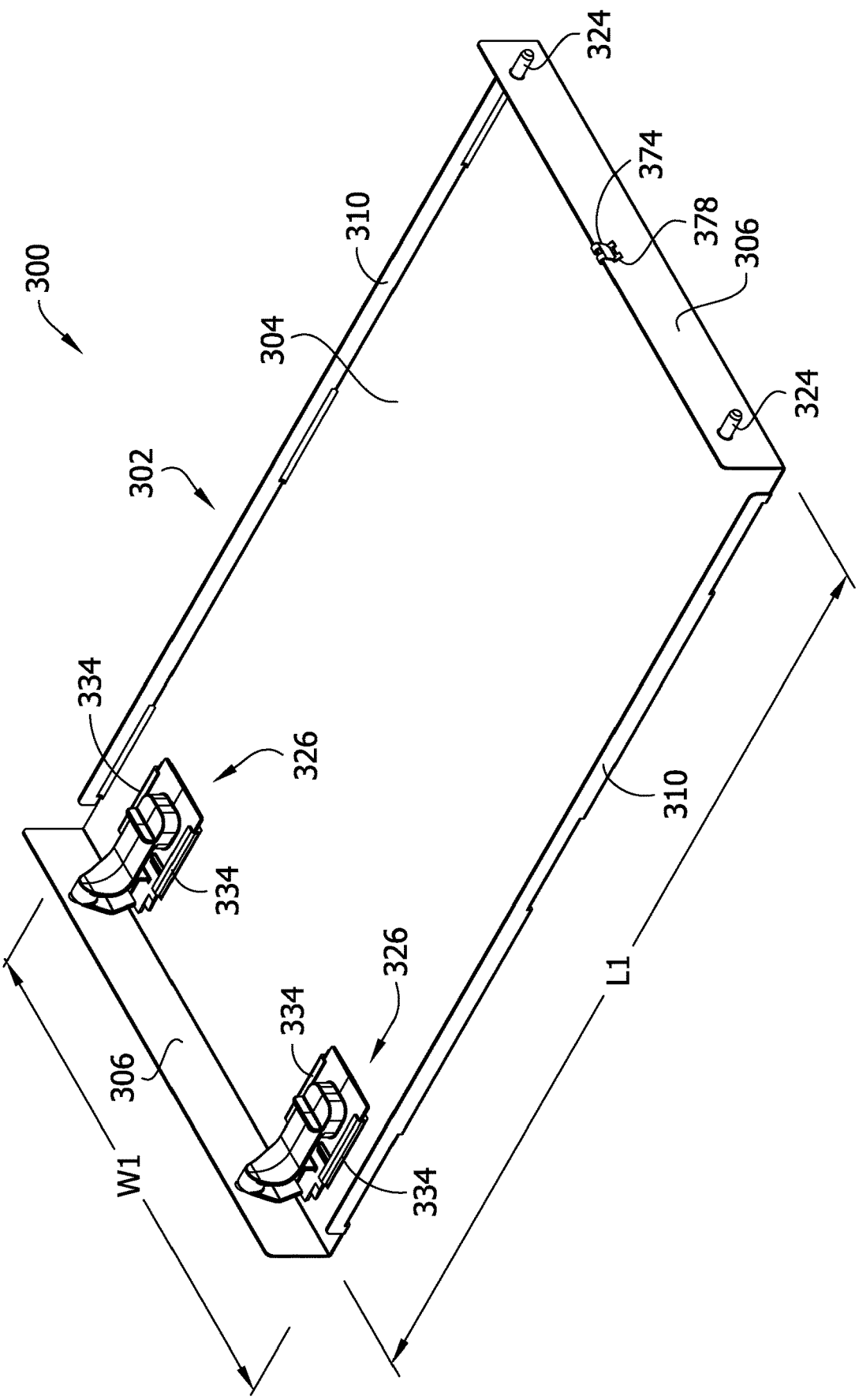
FIG. 20 is an enlarged perspective of the front horizontal panel.

Each horizontal panel assembly 300 includes a horizontal panel, generally indicated at 302. The horizontal panel 302 includes panel body 304 with opposite upper and lower faces, and opposite left and right end walls 306 extending downward from respective left and right sides of the panel body. The panel body 304 may be generally planar with a rectangular footprint. The illustrated horizontal panels 302 also include front and back flanges 310 extending downward from respective front and back sides of the panel body 304. The flanges 310 add strength and rigidity to the horizontal panels 300. As shown in FIG. 17, the horizontal panels 302 are arranged front to back to form the ceiling and/or floor of the rack 10. As shown in FIG. 20, each horizontal panel 302 has a length L1 extending between the opposite left and right end walls 306 and a width W1 extending between the opposite front and back flanges 310. In one or more embodiments, the lengths L1 of the horizontal panels 302 may be uniform, while the widths may vary by predetermined increments, such as 100 mm increments. The horizontal panels 302 may be formed as a unitary structure. For example, the horizontal panels 302 may be fabricated from sheet metal, having a thickness from 10 gauge to 20 gauge, for example, or other suitable thicknesses.

Referring to FIG. 17, one or more embodiments of the horizontal panel assembly 300 may include egress/ingress ports 314 through which cables/wires may exit/enter the rack 10. The illustrated egress/ingress ports 314 are provided on the panel body 302. The egress/ingress ports 314 include, but are not limited to, brushes, flap seals (e.g., rubber flaps), and other components generally known in the art. The horizontal panel 302 illustrated in FIG. 20 is a solid panel having no egress/ingress ports for through which cables/wires may exit/enter the rack 10. One or more of the horizontal panels 302 may be of other configurations and have other features.

Referring to FIGS. 21-24, each horizontal panel assembly 300 further includes at least one retractable pin 320 configured to releasably secure the horizontal panel assembly to the frame assembly 12. In the illustrated embodiment, each horizontal panel assembly 300 includes a pair of the retractable pins 320 at one of the end walls 306 of the horizontal panel 302 (e.g., the left end wall), and a pair of non-retractable pins 324 at the other end wall (e.g., the right end wall; FIG. 20) of the horizontal panel 302. The pins 320, 324 extend (or at extendable) laterally outward from the corresponding end walls 306 and are configured to be inserted into selected ones of pin-receiving recesses 327 (FIG. 17) (e.g., dimple, opening, aperture, gap or other defined structure) in the left and right braces 16 (e.g., upper and/or lower left and right braces) to secure the horizontal panel assembly 300 to the frame assembly 12. The non-retractable pins 324 are fixedly secured (e.g., welded, soldered, fastened, etc.) to the corresponding end wall 306. As explained in more detail below and shown in FIGS. 21 and 23, the retractable pins 320 extend or are extendable through pin openings 325 in the associated end wall 306 and are movable inward relative to the horizontal panel 302 to facilitate securement of the horizontal panel assemblies 300 to the frame assembly 12. In one or more embodiments, the non-retractable pins 324 may be replaced with other types of connectors, including the retractable pins 320, or other suitable connectors.

Figure 23:
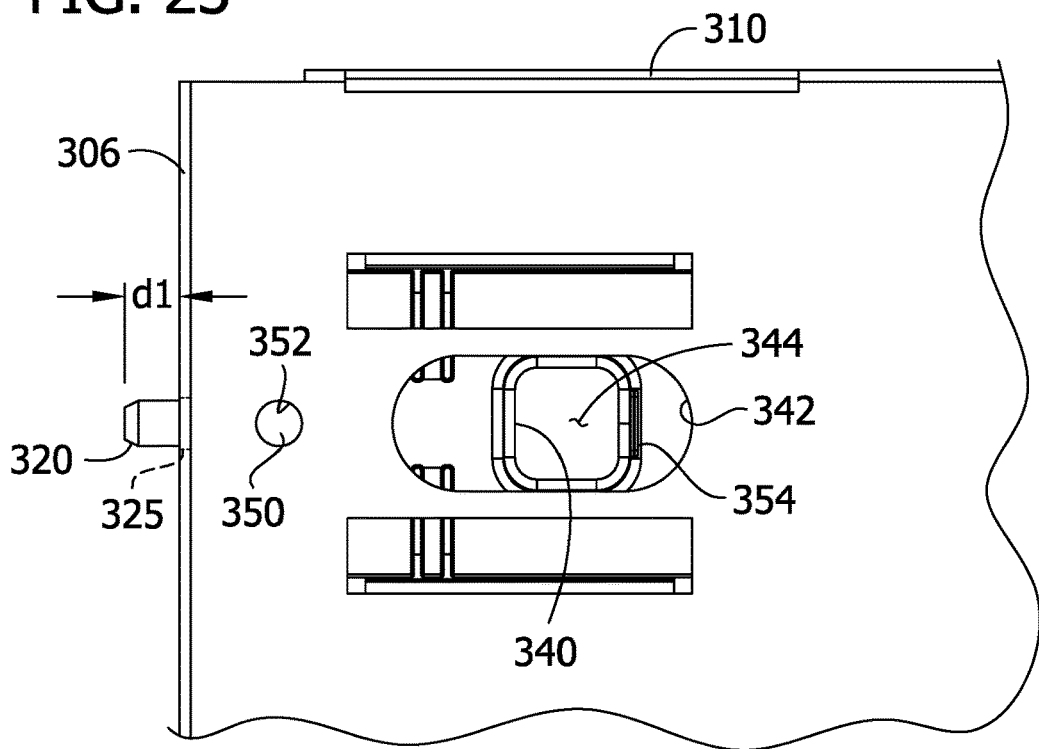
FIG. 23 is an enlarged, fragmentary bottom plan view of the horizontal panel showing a retractable pin assembly in an extended (locked) position.
Figure 24:
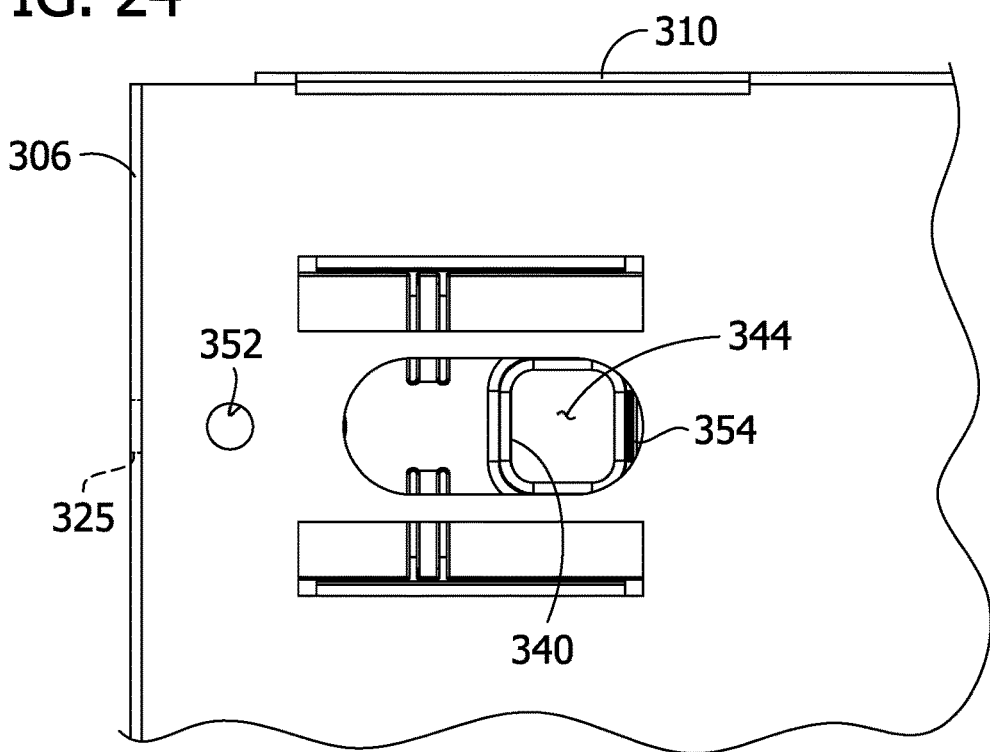
FIG. 24 is similar to FIG. 23, with the retractable pin assembly in a retracted (unlocked) position.
Figure 25:
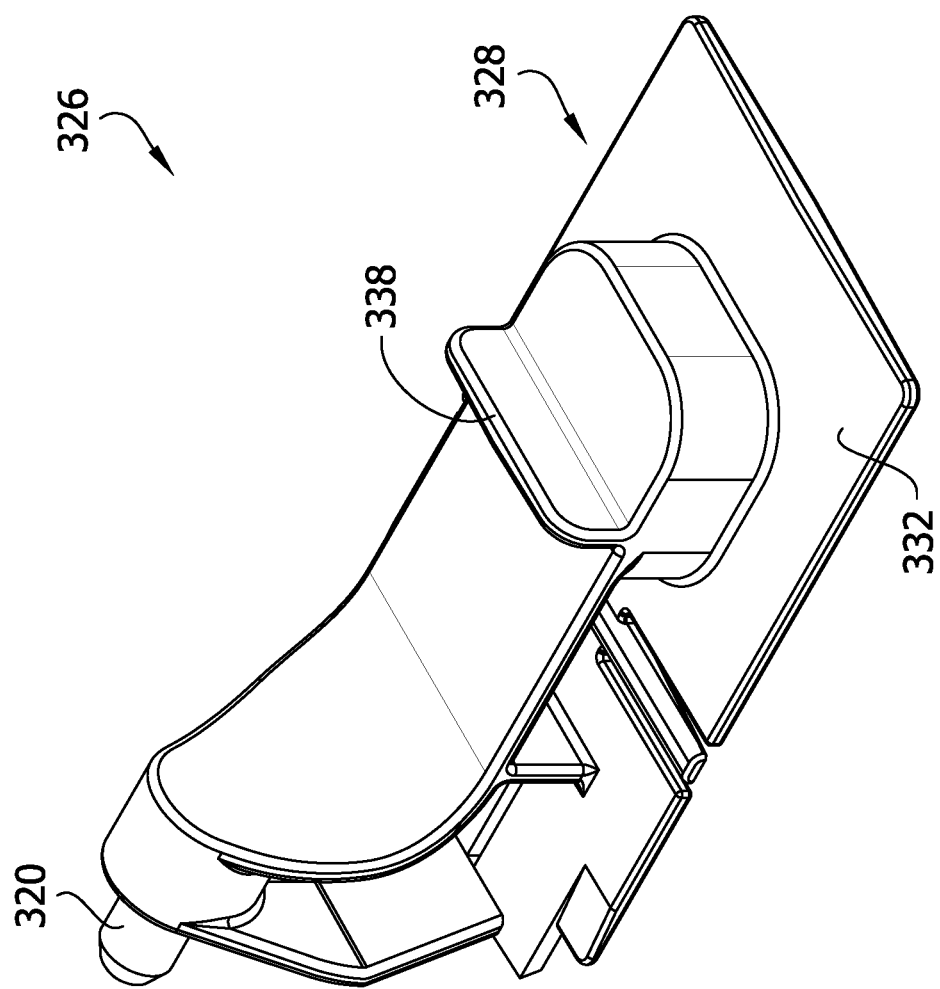
FIG. 25 is an enlarged, bottom perspective of the retractable pin assembly.
Figure 26:
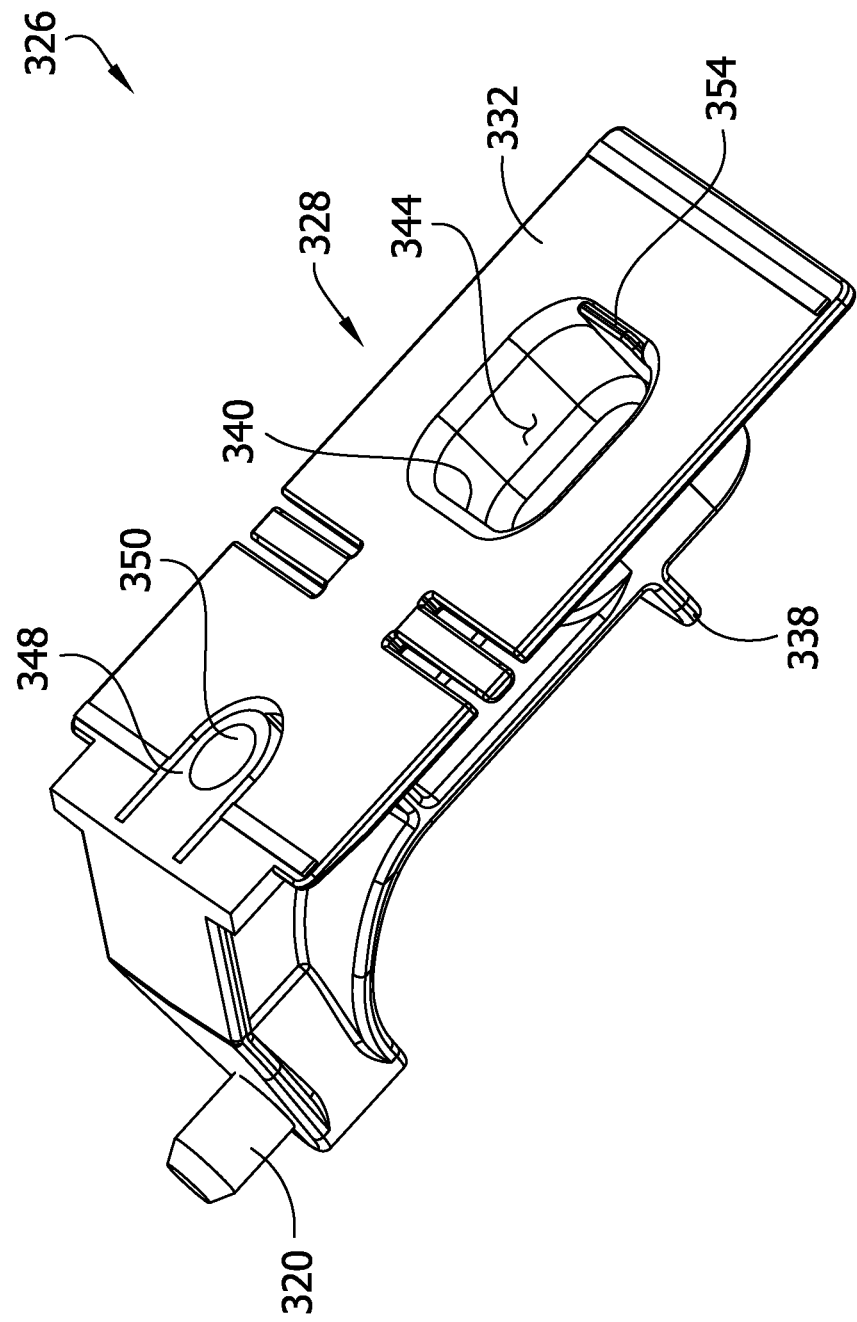
FIG. 26 is an enlarged, top perspective of the retractable pin assembly.
Figure 27:
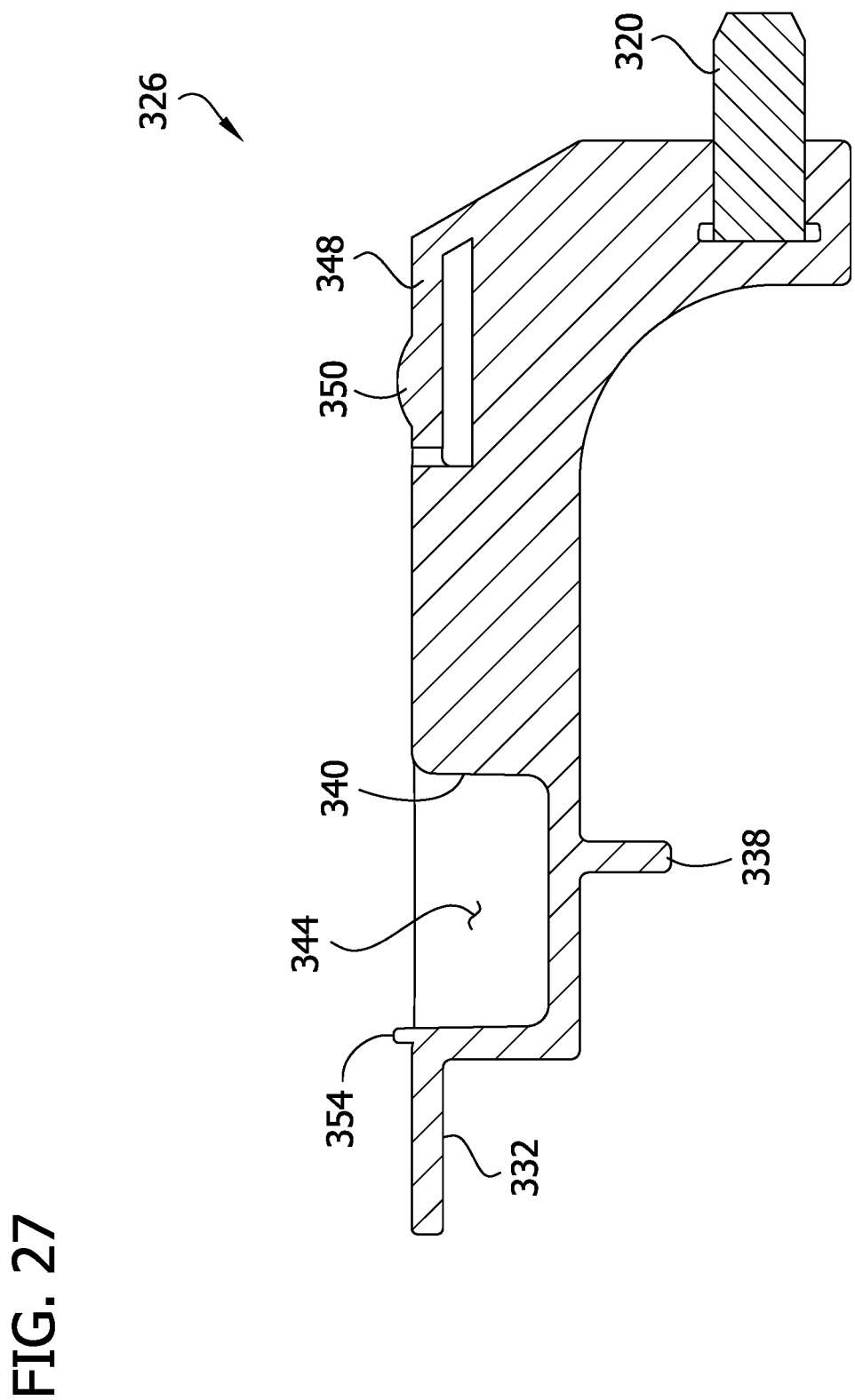
FIG. 27 is a sectional view of the retractable pin assembly.

Referring to FIGS. 20-22 and 25, each retractable pin 320 is part of a retractable pin assembly, generally indicated at 326. The retractable pin assembly 326 comprises a slide, generally indicated at 328, which is secured to the retractable pin 320. The slide 328 is slidably coupled to the horizontal panel 302 (e.g., at the lower surface of the panel body 304). The slide 328 includes a slide base 332 having opposite sides slidably captured between opposing L-shaped track arms 334 extending from the lower surface of the panel body 304 and defining a track in which the slide is slidably captured. The slide 328 also includes a lower handle 338 accessible at the lower face of the panel body. In the illustrated embodiment, the first handle 338 comprises a tab configured to be gripped or contacted or otherwise controlled to slidably move the slide 328 in the track. As shown in FIGS. 23, 24 and 27, the illustrated slide 328 also includes an upper handle 340 accessible at the lower face of the panel body 304 through an access opening 342 formed in the panel body. The upper handle 340 is defined by a finger cavity 344 extending in the slide base 332.

Figure 21:
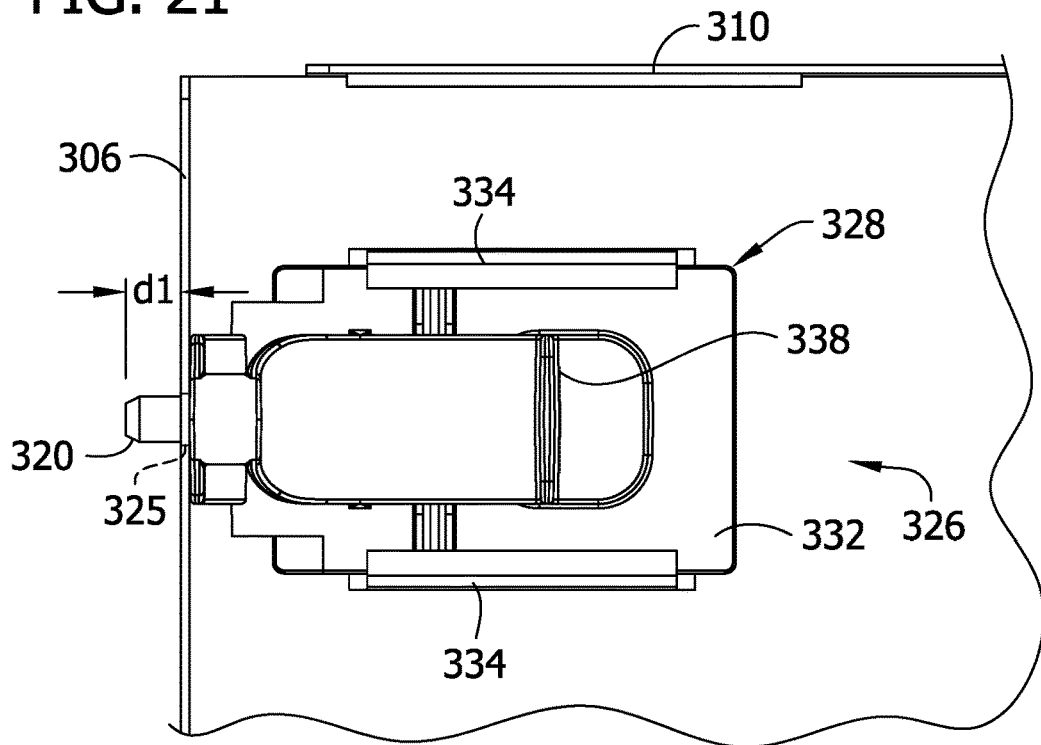
FIG. 21 is an enlarged, fragmentary top plan view of the horizontal panel showing a retractable pin assembly in an extended (locked) position.

The retractable pin assembly 326 is movable (e.g., slidable) between an extended position (or locked position), as shown in FIGS. 21 and 23, in which the pin 320 extends laterally outward from the corresponding end wall 306 of the horizontal panel 302 an extended distance d1, and a retracted position (or unlocked position), in which the pin does not extend outside the horizontal panel 302 (as shown) or extends laterally outward from the end wall a retracted distance (not shown) that is less than the extended distance. In one or more embodiments, the retractable pin assembly 326 is releasably lockable in the extended position. In the illustrated embodiment, the retractable pin assembly 326 includes a detent 348 on the slide base 332. The detent 348 is resiliently deflectable relative to the slide base and includes a detent projection 350 (e.g., a nub) that is receivable in a detent-receiving opening 352 in the horizontal panel 302 (e.g., panel body 304) when the retractable pin assembly 326 is in the extended position (FIGS. 21 and 23). The illustrated detent 348 is cantilevered to the slide base 332 to resiliently deflect. In one or more embodiments, as shown in FIG. 24, the slide 328 includes a stop 354 configured to contact an edge of the access opening 342 to restrict further inward sliding of the retractable pin assembly 326 when the retractable pin assembly 326 is in the retracted position.

In one or more embodiments, the slide 328 may be formed as an integral, one-piece component. The slide 328 may be formed from plastic or other material. In one example, the retractable pin 320 may be formed from metal or other rigid material. As an example, the slide 328 may be overmolded on the pin 320. Other ways for securing the pin 320 to the slide 328 are possible.

Figure 22:
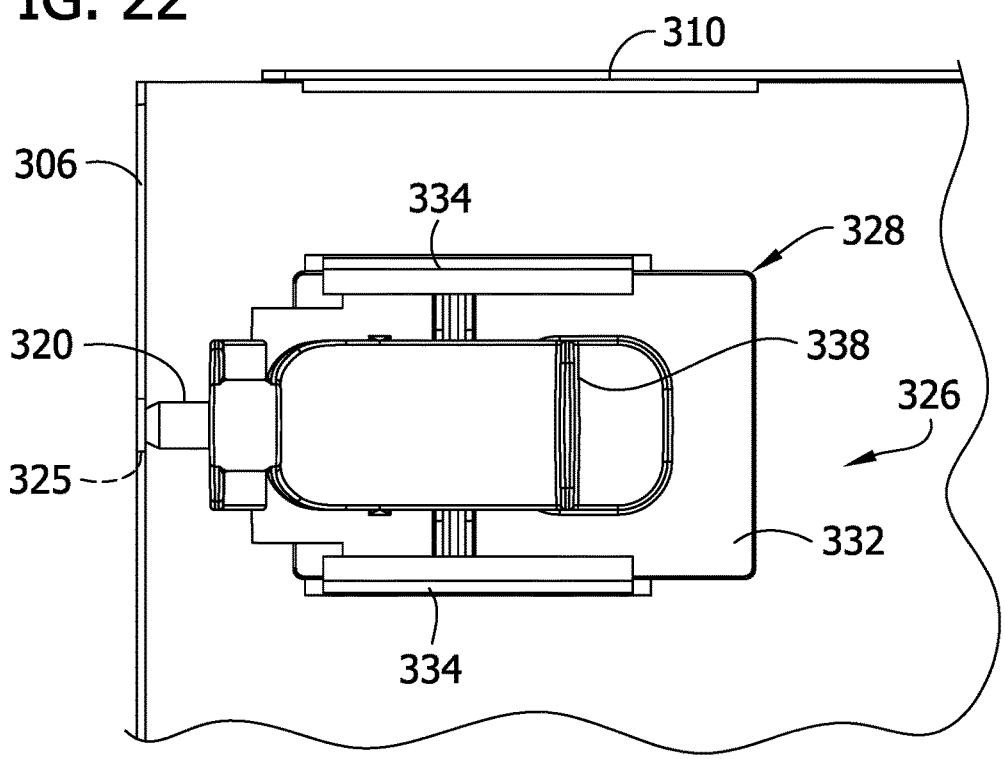
FIG. 22 is similar to FIG. 21, with the retractable pin assembly in a retracted (unlocked) position.

In one or more examples, to secure each of the horizontal panels 300 to the frame assembly 12, the retractable pin assemblies 326 are disposed in the retracted positions, as shown in FIGS. 22 and 24, for example, and the non-retractable pins 324 are first inserted into the selected pin-receiving recesses 327 of one of the upper and/or lower braces 16. With the non-retractable pins 324 in the selected pin-receiving recesses 327, the retractable pin assemblies 326 are moved to the extended (or locked) positions such that the retractable pins 320 enter the selected ones of the pin-receiving recesses 327 in the other, opposing upper and/or lower braces 16. Accordingly, the retractable pin assembly and the pin-receiving recess 327 in the brace 16 together constitute a releasable latch or releasable latching mechanism. In an example, either the lower handles 338 or the upper handles 340 may be manually grasped to impart sliding movement of the retractable pin assemblies 326. As the retractable pin assemblies 326 are moved to the extended positions, the detents 348 resiliently rebound as the detent projections 350 enter the detent-receiving openings 352 in the horizontal panel 302 (e.g., panel body 304) to releasably lock the retractable pin assemblies 326 in the extended positions.

In one or more examples, to remove one of the horizontal panels 300 from the frame assembly 12, the retractable pin assemblies 326 are moved to the retracted (or unlocked) positions such that the retractable pins are withdrawn from the pin-receiving recesses 327 in the upper and/or lower braces 16. As the retractable pin assemblies 326 are moved to the retracted (or unlocked) positions, the detent projections 350 contact respective edges of the detent-receiving openings 352 and ride on the panel body 304, whereupon the detents 348 resiliently deflect. In the retracted (or unlocked) positions, the stops 354 inhibit the retractable pin assemblies 326 from over retracting.

As disclosed above, the horizontal panel assemblies 300 are configured to allow the panel assembly to be secured to the frame assembly 12 in a non-inverted (i.e., upside-up) or inverted orientation (i.e., upside-down). For example, as shown in FIGS. 17-19, the front horizontal panel assembly 300 is secured to the frame assembly 12 in the inverted orientation, and the middle horizontal panel assembly is secured to the frame assembly in the non-inverted orientation. As shown best in FIG. 18, this arrangement of adjacent horizontal panel assemblies 300 creates a vertical panel opening 370 between adjacent sides (e.g., the back side of the front horizontal panel 302 and the front side of the middle horizontal panel 302) of the horizontal panel assemblies 300. In particular, in the illustrated embodiment, the panel opening 370 is defined by vertically spaced apart side flanges 310 of the adjacent horizontal panels 302. In this embodiment, the flanges 310 have suitable widths so that the flanges of adjacent horizontal panels are spaced apart vertically when one of the horizontal panels is inverted. A gasket, brush, flap or other structure can be secured over or adjacent the panel opening 370. The panel opening 370 allows for ingress/egress of cables/wires or other components. The panel opening 370 can also functions as a vent for air within the rack 10.

Referring to FIG. 20, in one or more embodiments, an electrically conductive clip 374 may be secured to one or more of the end walls 306 of the horizontal panel 302. The clip 374 includes resiliently deflectable jaws for receiving the end wall 306 therebetween. The clip 374 also includes one or more barbs 378 that contact the adjacent side brace 16 when the horizontal panel assembly 300 is secured to the frame assembly 12. The barbs 378 are in electrical contact with the side brace 16 to ground the horizontal panel assembly 300. The barbs 378 may be configured to dig into or scrap the side brace 16 to facilitate the electrical connection.

Referring to FIGS. 28-38, in one or more embodiments, the equipment rack 10 includes various brackets 400, 400', 400" mountable on the frame for supporting items in the equipment rack. The brackets 400, 400', 400" are configured to permit convenient installation at various locations on the frame 12. As will become apparent, the brackets 400, 400', 400" are tool-free mounting brackets, i.e., configured for mounting on the frame 12 without requiring the use of a tool.

Figure 28:
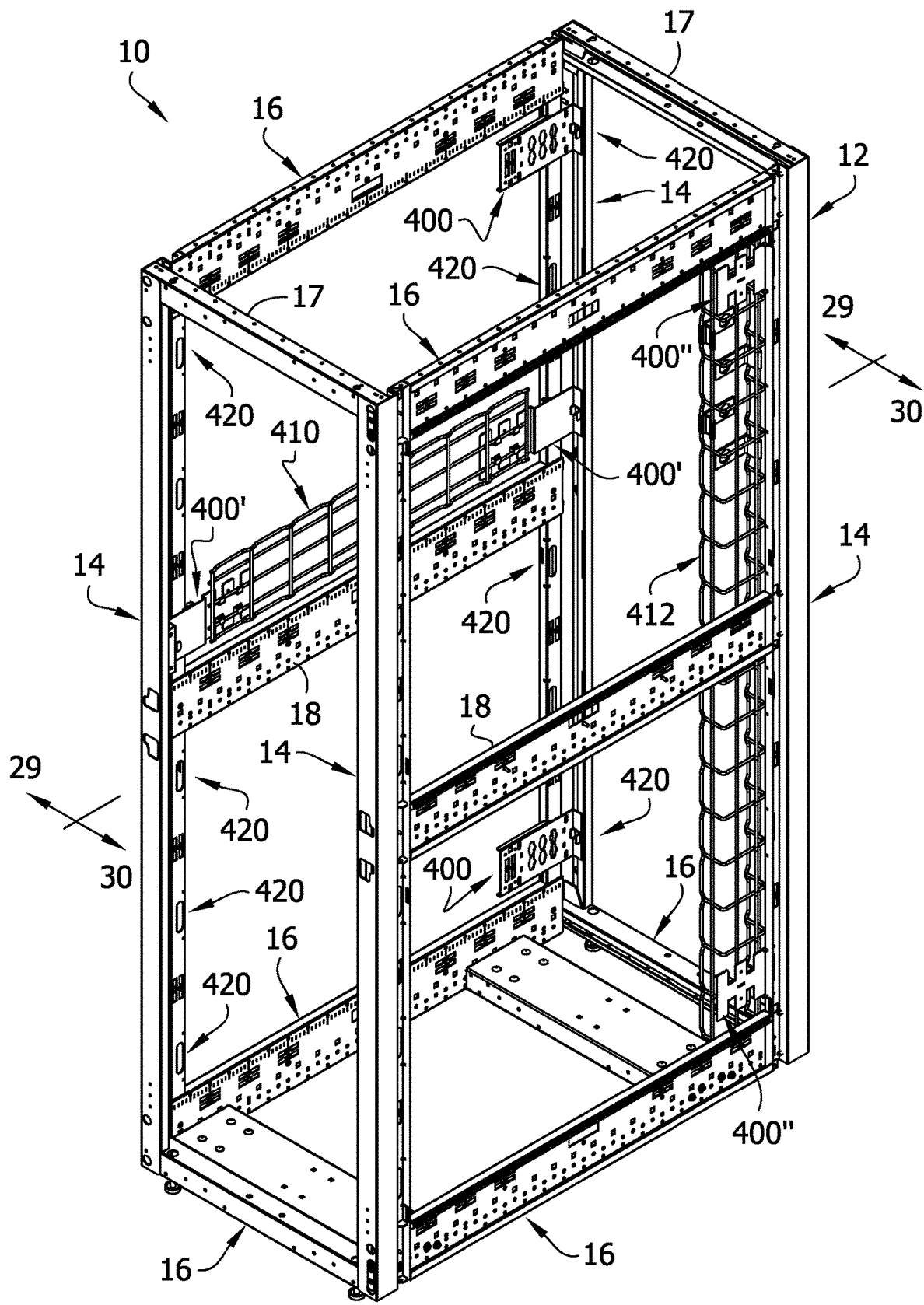
FIG. 28 is a front perspective of the equipment rack having various components removed for clarity in illustrating brackets.
Figure 29:
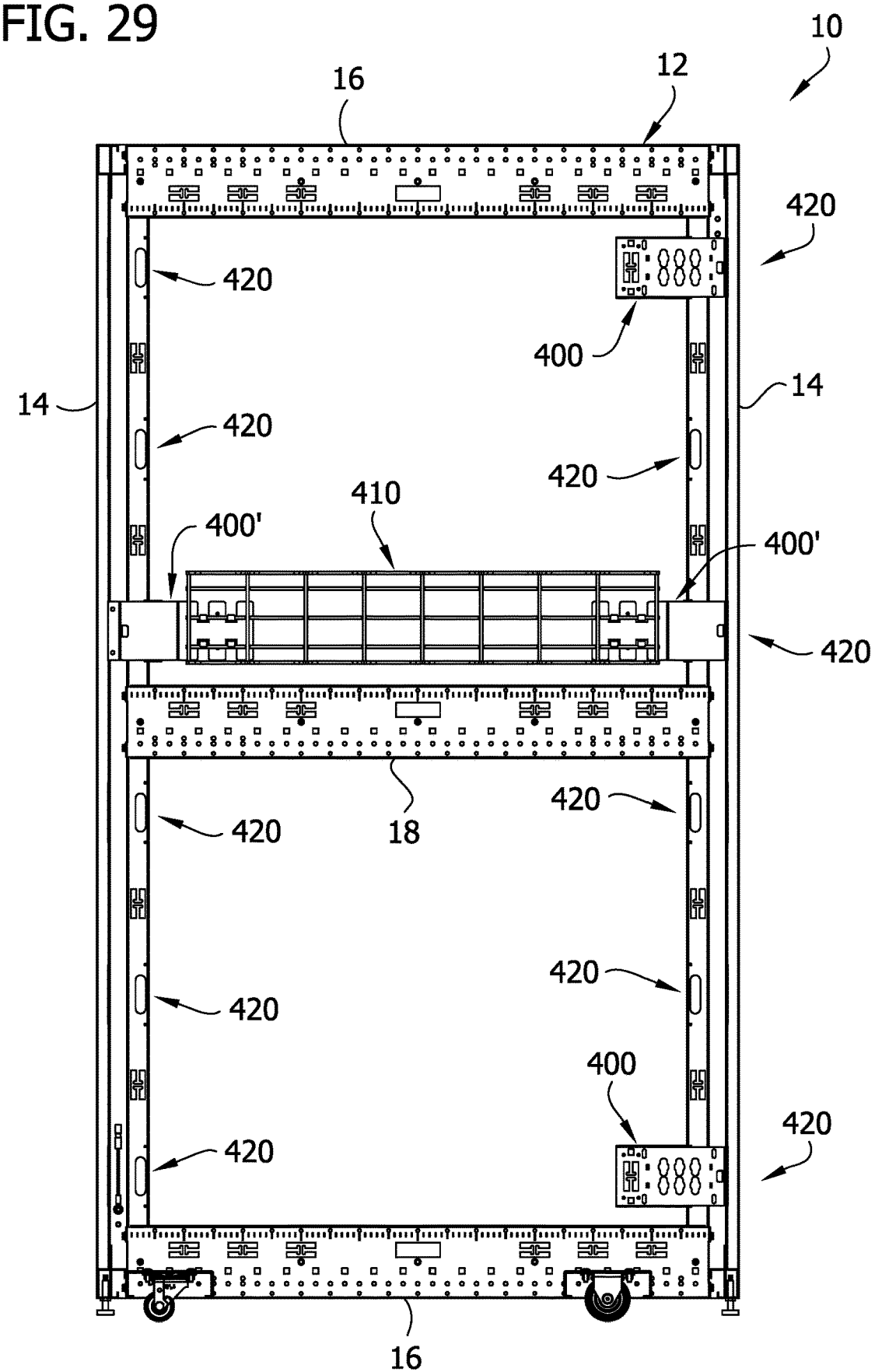
FIG. 29 is a section of the equipment rack of FIG. 28 taken in the plane including line 29-29 in FIG. 28.
Figure 30:
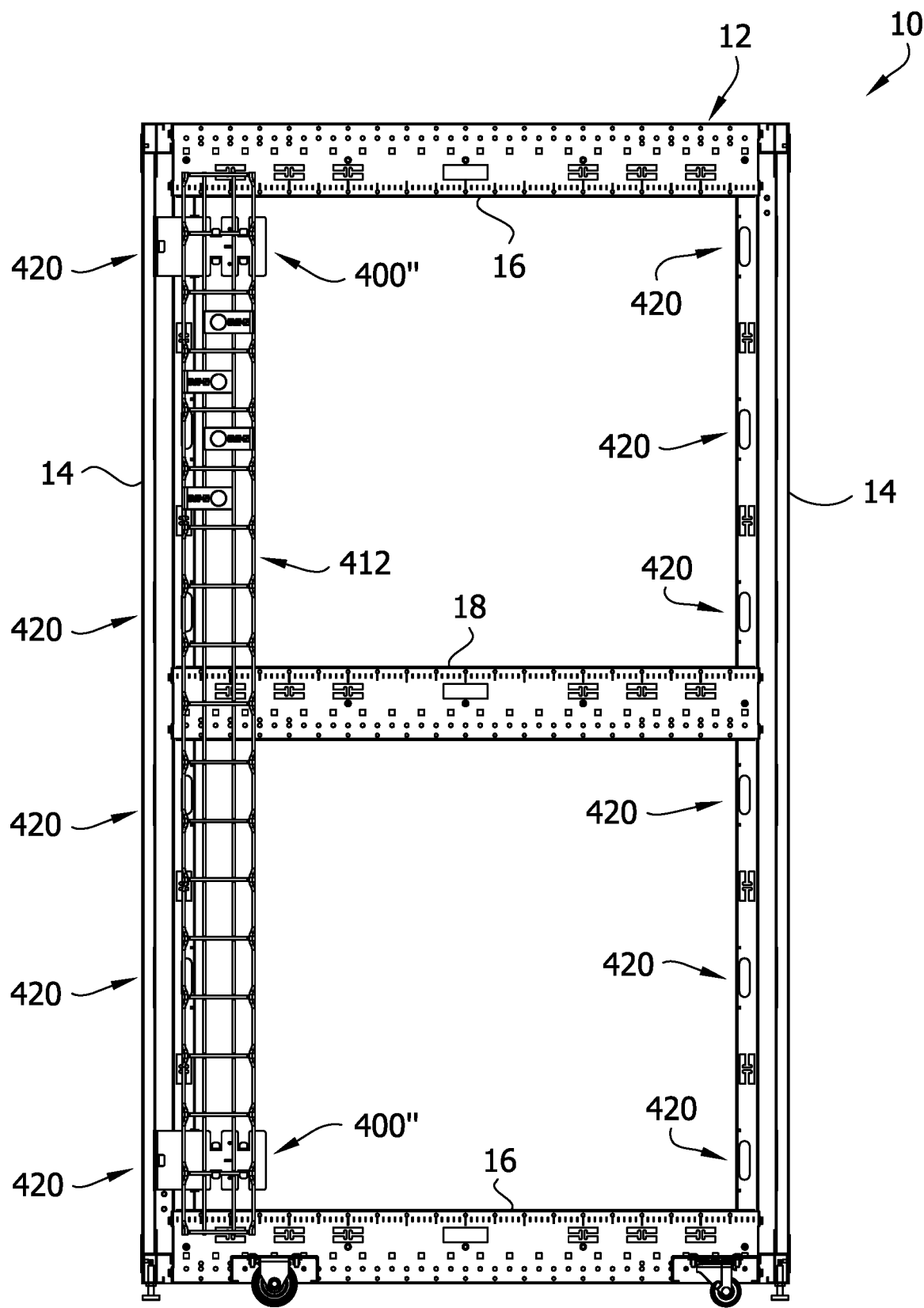
FIG. 30 is a section of the equipment rack taken in the plane including line 30-30 in FIG. 28.

As shown in FIGS. 28 and 29, two brackets 400 of a first embodiment are mounted on the left rear upright 14 adjacent the respective upper and lower ends of the frame 12. The brackets 400 are configured for supporting power distribution units (not shown), among other things. As also shown in FIGS. 28 and 29, two brackets 400' of a second embodiment are mounted on the left front and left rear uprights 14, respectively. The brackets 400' are shown holding a tray 410 (e.g., wire formed tray or wire basket, as shown) extending horizontally for supporting cables to facilitate cable management in the equipment rack 10. As shown in FIGS. 28 and 30, two brackets 400" of a third embodiment are mounted on the right front and right rear uprights 14, respectively. The brackets 400" are shown holding a cable support tray or basket 412 extending in a vertical orientation. More or fewer brackets 400, 400', 400" can be used, and the brackets can be mounted in other positions and/or orientations, based on the desired configuration of the equipment rack.

The equipment rack 10 is configured to permit mounting of the brackets 400, 400', 400" at various locations. In the illustrated embodiment, the brackets 400, 400', 400" are mountable on the frame 12, and in particular, on the uprights 14. As shown in FIGS. 28-30, the uprights 14 each have a plurality of predetermined mounting areas 420 spaced at intervals along the height of the uprights. A user can select among the predetermined mounting areas 420 for mounting the brackets 400, 400', 400". Other mounting locations in the equipment rack 10 can be used without departing from the scope of the present invention. Structure forming the predetermined mounting areas 420 will be described in detail below.

Figure 31:
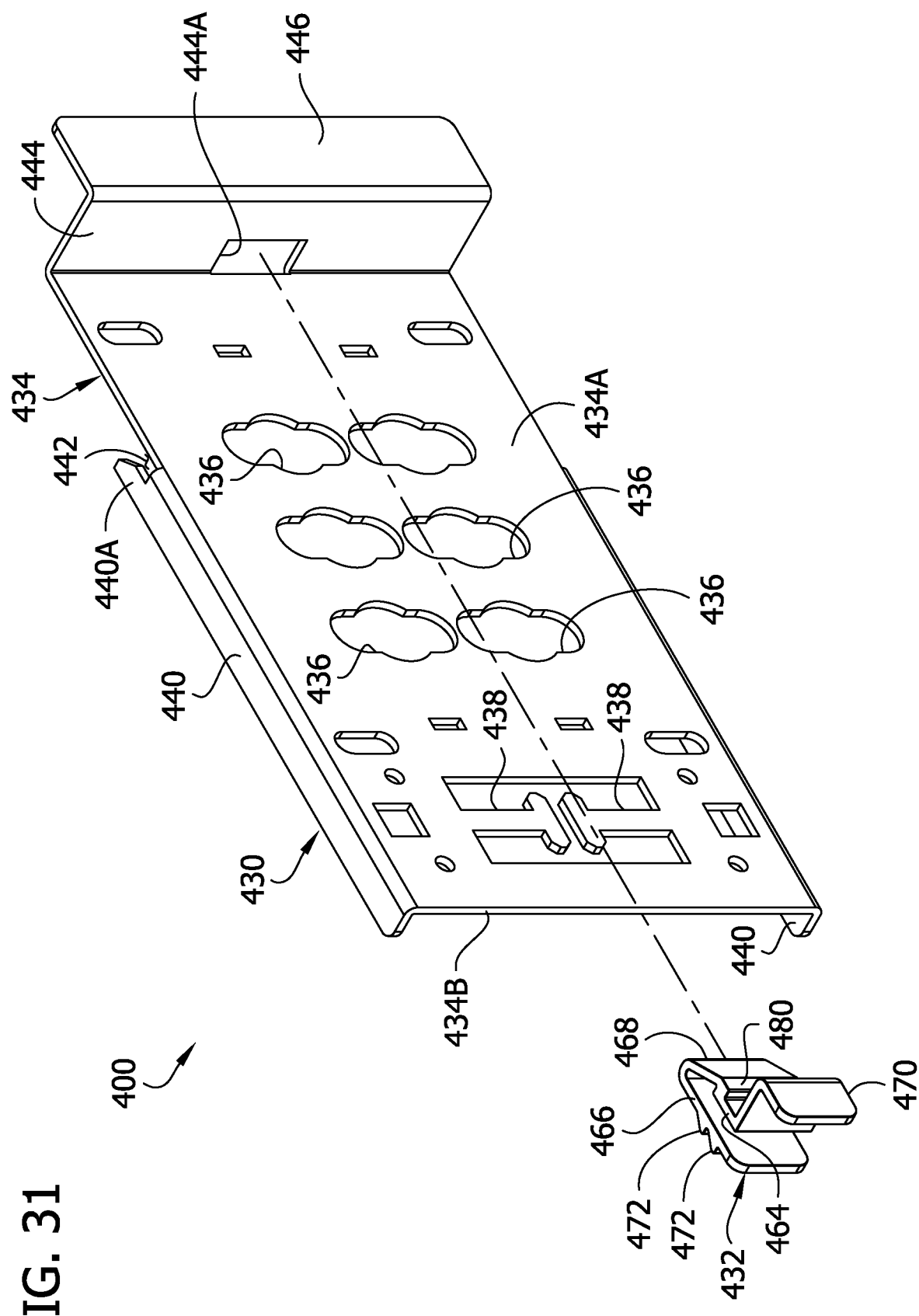
FIG. 31 is a front perspective of a first embodiment of a bracket, a snap fit retainer being shown separated from a bracket body.

Referring now to FIGS. 31-35, the bracket 400 of the first embodiment mounted adjacent the lower end of the rear left upright 14 will now be described in further detail. It will be understood that the other bracket 400 of the first embodiment, mounted on the front left upright 14, has the same configuration. As shown in FIG. 31, the bracket 400 includes a bracket body 430 and a snap fit retainer 432 (separated from the bracket body in FIG. 31). The bracket body 430 may be formed from sheet metal, having a thickness from 10 gauge to 20 gauge, for example, or another suitable thickness. In the illustrated embodiment, the bracket body 430 is made of 14 gauge sheet metal bent into the form of the bracket body. The snap fit retainer 432 can be made of plastic or another suitable material. The snap fit retainer 432 can be formed integrally with the bracket body 430 without departing from the scope of the present invention.

Still referring to FIG. 31, the bracket body 430 includes a generally rectangular mounting section 434 having a front mounting face 434A and an opposite rear face 434B. The mounting section 434 has a plurality of connectors configured for mounting various items on the bracket 400. For example, the mounting section 434 includes key slots 436 positioned in an array including three columns of two key slots. Each column of key slots 436 is configured for receiving connectors (e.g., button connectors) on the rear of a power distribution unit (not shown) for mounting the power distribution unit in the equipment rack 10. The bracket body 430 also includes cable tie anchors in the form of T-shaped teeth 438 in an opening in the mounting section 434. For example, cable ties (not shown) such as various types of straps, etc. can be used to secure cables to the anchors. A variety of other connectors are also provided for other types of connections to the mounting section 434. Other numbers and/or types of connectors can be provided on the bracket 400 and/or at other locations on the bracket without departing from the scope of the present invention.

The bracket body 430 includes upper and lower flanges 440 above and below the mounting section 434, respectively. The upper and lower flanges 440 extend between left and right ends of the bracket body 430, extend rearward from the mounting section 434, and extend transversely with respect to the mounting face 434A. Right ends of the upper and lower flanges 440 form limbs 440A for mounting the bracket on the frame. Gaps 442 (FIG. 31) are provided between the limbs 440A and the rear face 434B of the mounting section 434 for receiving a portion of an upright 14, as will become apparent. The bracket body 430 includes a connecting flange 444 to the right of the mounting section 434. The connecting flange 444 extends between upper and lower ends of the bracket body 430, extends forward from the mounting section 434, and extends transversely with respect to the mounting face 434A. The connecting flange 444 has a holder in the form of a rectangular opening 444A for holding the snap fit retainer 432 (see FIG. 32). The bracket body 430 includes a tongue 446 extending to the right transversely from the forward end of the connecting flange 444. The tongue 446 extends generally parallel with the mounting face 434A. As will become apparent, the tongue 446, limbs 440A, and snap fit retainer 432 are used for mounting the bracket 400 on the frame 12. The limbs 440A and the tongue 446 can be broadly referred to as protrusions (more broadly, connectors) used for mounting the bracket 400.

The position and orientation of the features of the bracket 400 as described above are with reference to the configuration and orientation of the bracket as shown in FIG. 31. It will be understood that the bracket 400 can be mounted in the equipment rack in various orientations, such that components described above as "upper" may instead be "lower," components described as "right" may instead be "left," etc., without departing from the scope of the present invention.

Figure 32:
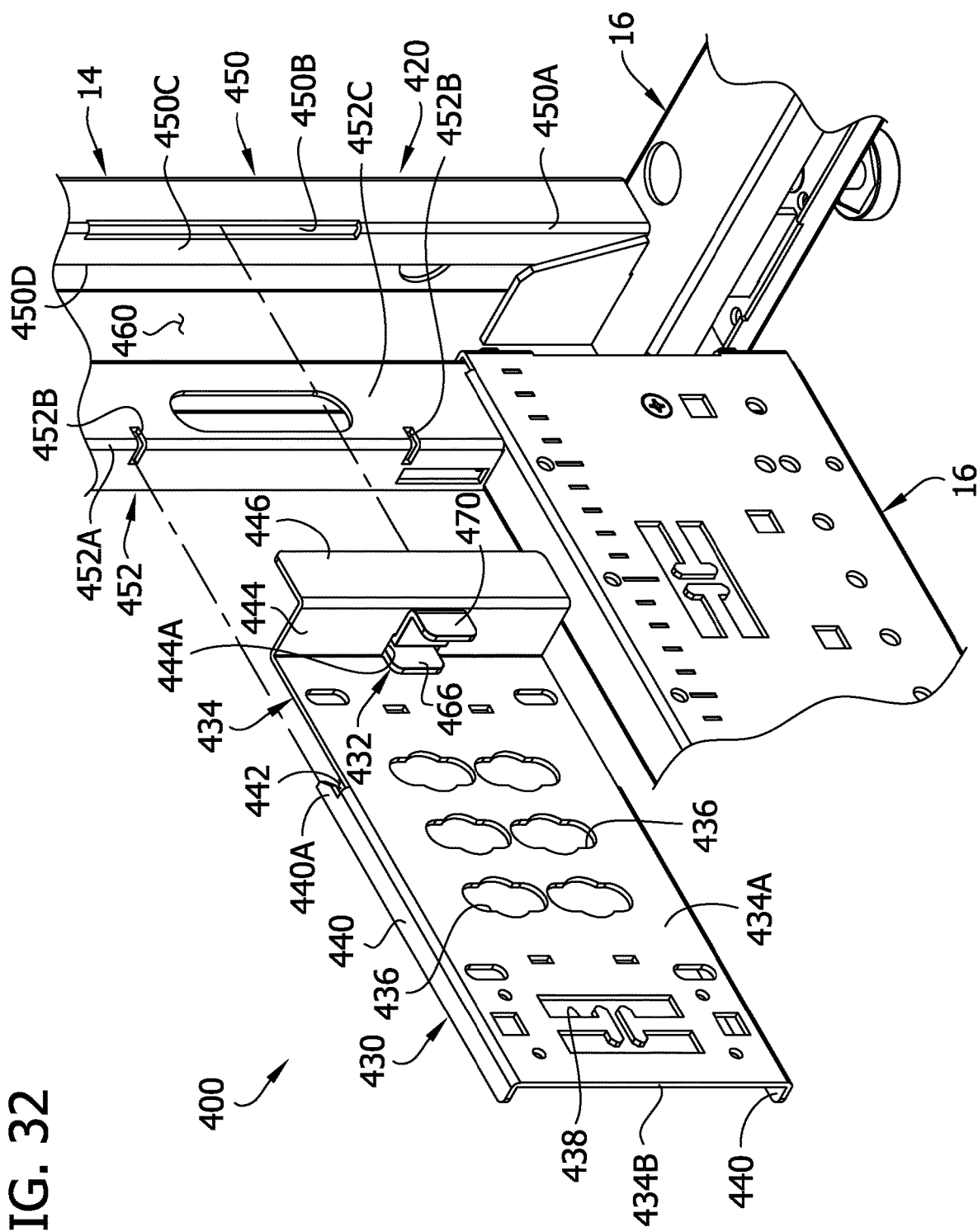
FIG. 32 is a fragmentary perspective of the bracket of FIG. 31 shown in registration with a mounting area of the equipment rack.

Referring to FIG. 32, the upright 14 includes structure defining the mounting area 420 configured for cooperating with the bracket 400 for mounting the bracket on the upright. The mounting area 420 shown in FIG. 32 will be described in further detail, with the understanding that the other mounting areas have a similar construction. At the mounting area 420, the upright 14 has first and second abutments 450, 452. The first abutment 450 defines an outside corner 450A and has a vertical slot 450B sized for receiving the tongue 446 of the bracket 400. The second abutment 452 defines an outside corner 452A having relatively small horizontal slots 452B for receiving the limbs 440A of the bracket 400. The vertical and horizontal slots 450B, 452B can be referred to broadly as receivers (more broadly, connectors) for receiving the protrusions (limbs 440A and tongue 446) of the bracket 400. The first and second abutments 450, 452 also include respective abutment surfaces 450C, 452C for abutting the connecting flange 444 and the rear face 434B of the mounting section 434, respectively. The first abutment 450 has a lip 450D adjacent a cavity 460 in the upright 14 configured for receiving the snap fit retainer 432.

Figure 34:
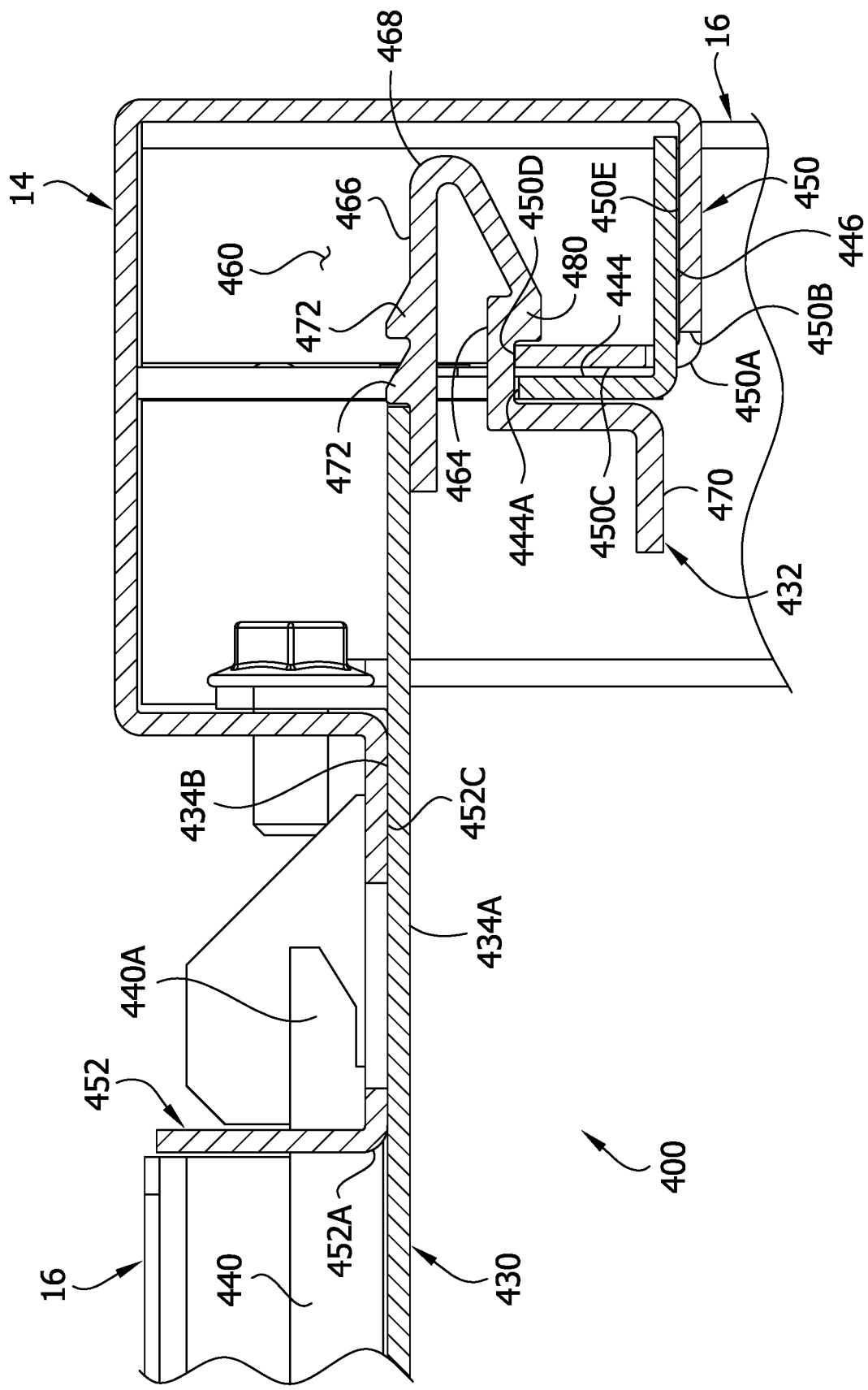
FIG. 34 is a fragmentary section taken in the plane including line 34-34 of FIG. 33.

As shown in FIGS. 31 and 34, the snap fit retainer 432 has a generally U-shaped body including first and second legs 464, 466 and a nose 468 connecting proximal ends of the legs. The retainer includes a lever 470 connected to a distal end of the first leg 464. The second leg 466 includes first and second barbs 472 having ramps extending outward and distally with respect to the nose 468 and having retaining surfaces facing distally with respect to the nose. The first leg 466 includes a catch 480 having a ramp extending outward and distally with respect to the nose 468 and having a retaining surface facing distally with respect to the nose. Desirably, the first and second legs 464, 466 are resiliently deflectable with respect to each other to permit temporary deformation of the retainer 432 for installing the retainer on the bracket body 430 and for securing the bracket 400 on the mounting area 420. When the retainer 432 is installed on the bracket body 430, the retaining surface of the second barb 472 engages the bracket body, and the lever 470 engages the connecting flange 444. The retaining surface of the second barb 472 limits withdrawal of the retainer 432 back out of the opening 444A in the connecting flange 444, and the lever 470 abutting the connecting flange limits movement of the retainer farther into the opening.

Figure 33:
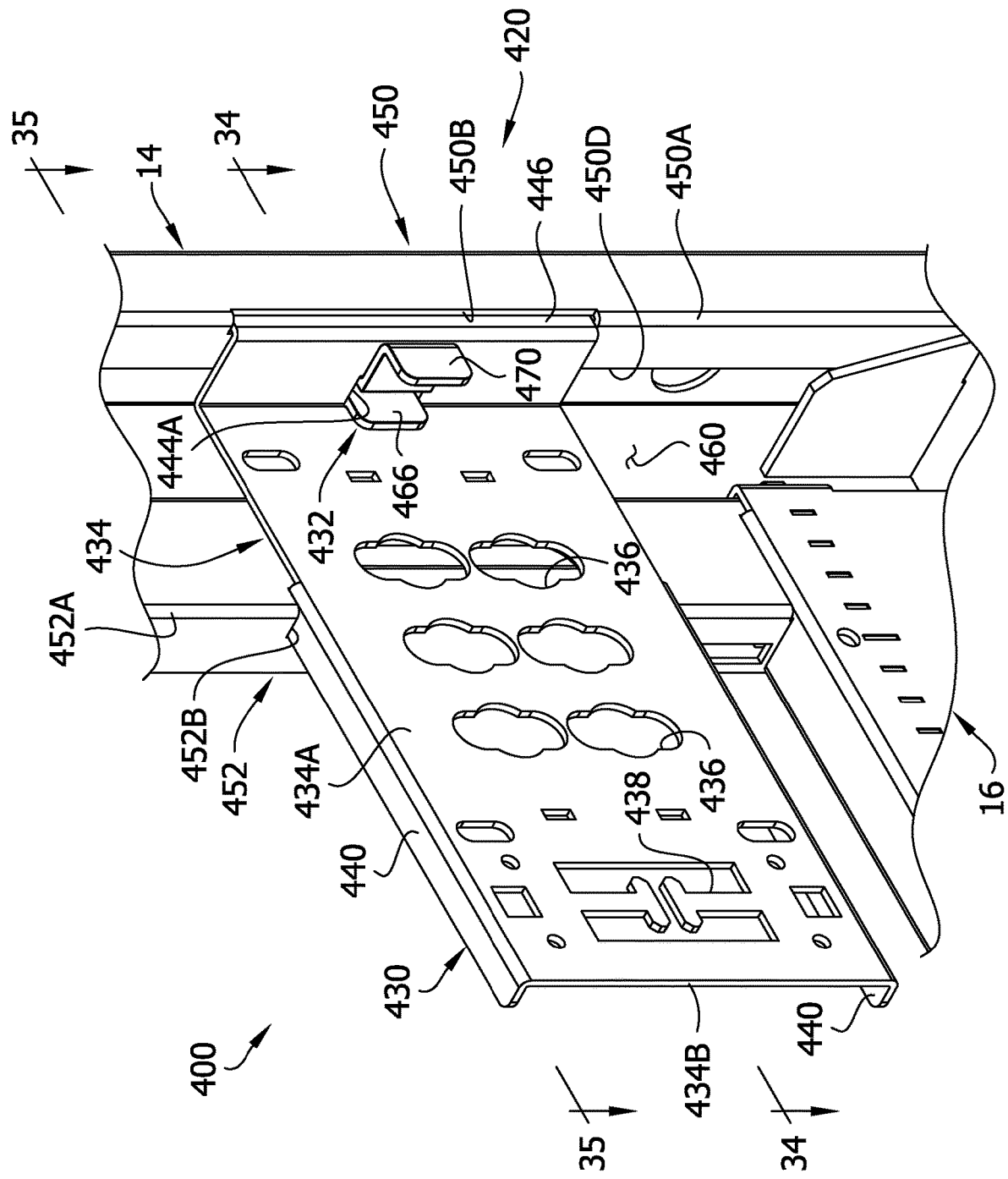
FIG. 33 is a fragmentary perspective similar to FIG. 32 but showing the bracket mounted on the mounting area.
Figure 35:
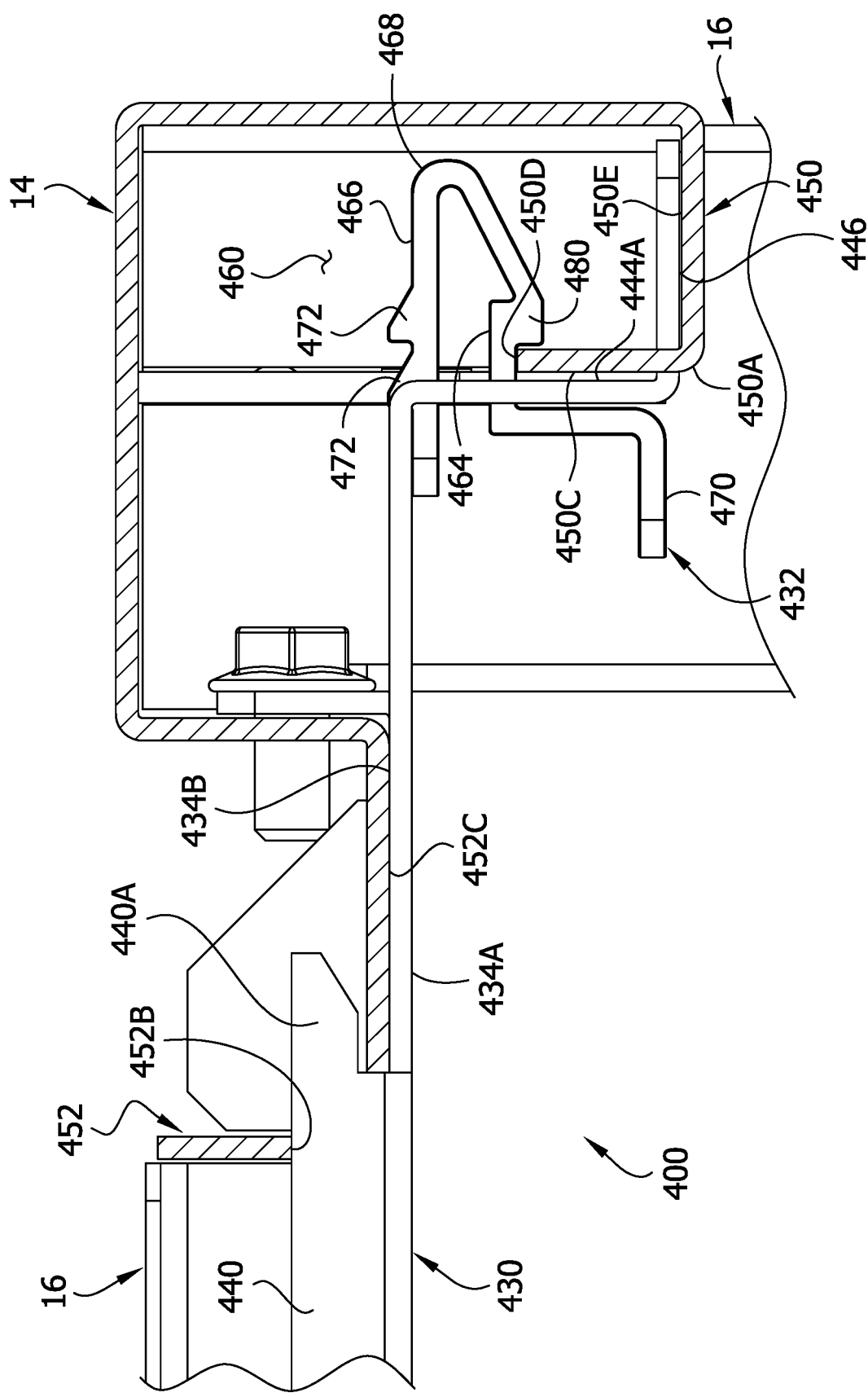
FIG. 35 is a fragmentary section taken in the plane including line 35-35 of FIG. 33.
Figure 36:
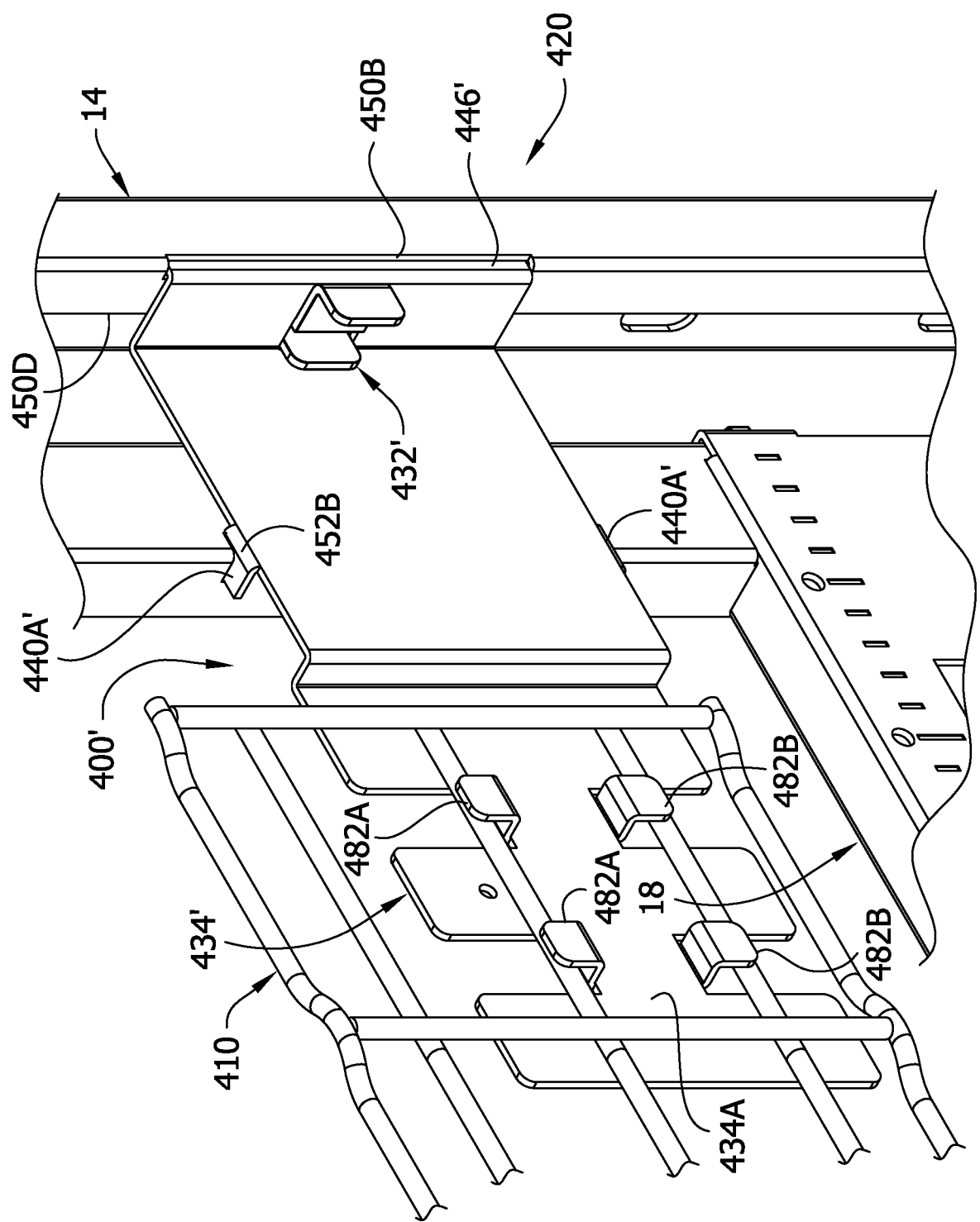
FIG. 36 is a fragmentary perspective of a bracket of a second embodiment mounted on a mounting area and holding a horizontal tray.

Mounting of the bracket 400 on the mounting area 420 will now be described with reference to FIGS. 32-35. In FIG. 32, the bracket 400 is shown in registration with and ready for mounting on the mounting area 420. In particular, the bracket 400 is positioned in register with the mounting area 420, such that the limbs 440A are in register with the horizontal slots 452B, the tongue 446 is in register with the vertical slot 450B, and the snap fit retainer 432 is in register with the lip 450D. When the bracket 400 is in such a position, the bracket can be moved toward the mounting area along a straight movement axis, in the direction in which the limbs 440A and tongue 446 extend, not only for mating the protrusions (limbs and tongue) with the receivers (horizontal and vertical slots 452B, 450B), but also for releasably locking the snap fit retainer 432 on the lip 450D to secure the protrusions in the receivers, as shown in FIGS. 33-35. As the nose 468 of the snap fit retainer 432 passes the lip 450D, the ramp of the catch 480 engages the lip 450D and causes the first leg 464 to increasingly deflect toward the second leg 466 until the catch 480 passes the lip, permitting the first leg to resiliently "snap" to its non-deflected position. This moves the retaining surface of the catch 480 into position for engaging the lip 450D to limit withdrawal of the bracket 400 from the mounting area 420. If desired, to remove the bracket 400 from the mounting area 420, a user can press the lever 470 to deflect the first leg 464 to permit withdrawal of the retainer 432 from the lip 450D.

As is now apparent, the bracket 400 and mounting area 420 are configured to permit convenient tool-free mounting of the bracket on the mounting area. The bracket 400 is essentially "plugged" into the mounting area 420, to mate the bracket with the mounting area and create a releasable securing or retaining connection of the bracket on the mounting area in the same motion, in a simple and efficient manner. Moreover, the bracket 400 is substantially anchored against pivoting or rotational movement by the engagement of the bracket with the abutments 450, 452. For example, in the illustrated embodiment, the tongue 446 abuts an inside surface 450E of the first abutment 450, the connecting flange 444 abuts the first abutment surface 450C, and the rear face 434B abuts the second abutment surface 452C. The arrangement provides for substantially improved convenience in assembly compared to arrangements requiring tools, such as requiring a driver for installing bolts or screws, etc.

The brackets 400' of the second embodiment, noted briefly above with respect to FIGS. 28-29, will now be discussed. As shown in closer detail in FIG. 36, the bracket 400' holding a right end of the horizontally extending tray 410 is shown mounted on the rear left upright 14. It will be understood that the bracket 400' holding the opposite end of the horizontally extending tray 410 has the same construction and is mounted on the front left upright 14 in a similar fashion. The bracket 400' is similar in many respects to the bracket of the first embodiment described above, and like parts are indicated by the same reference numbers plus a prime designator. The bracket 400' mounts on the mounting area 420 in the same manner described above. For example, the bracket 400' includes protrusions in the form of upper and lower limbs 440A' that are received in the horizontal slots 452B and in the form of a tongue 446' that is received in the vertical slot 450B. The bracket 400' also includes a snap fit retainer 432' for securing against the lip 450D. In this embodiment, the mounting section 434' has different connectors. The connectors on the mounting section include an upper set of hooks 482A and a lower set of hooks 482B. The sets of hooks 482A, 482B are oriented in opposite directions. The upper hooks 482A extend upward for holding a segment of the horizontal tray 410, and the lower hooks 482B extend downward for holding a different segment of the horizontal tray. The hooks 482A, 482B hold the respective tray segments against the mounting face 434A' of the mounting section 434'. Accordingly, the brackets 400' at opposite ends of the tray 410 hold the tray in position for supporting cables in the equipment rack.

Figure 37:
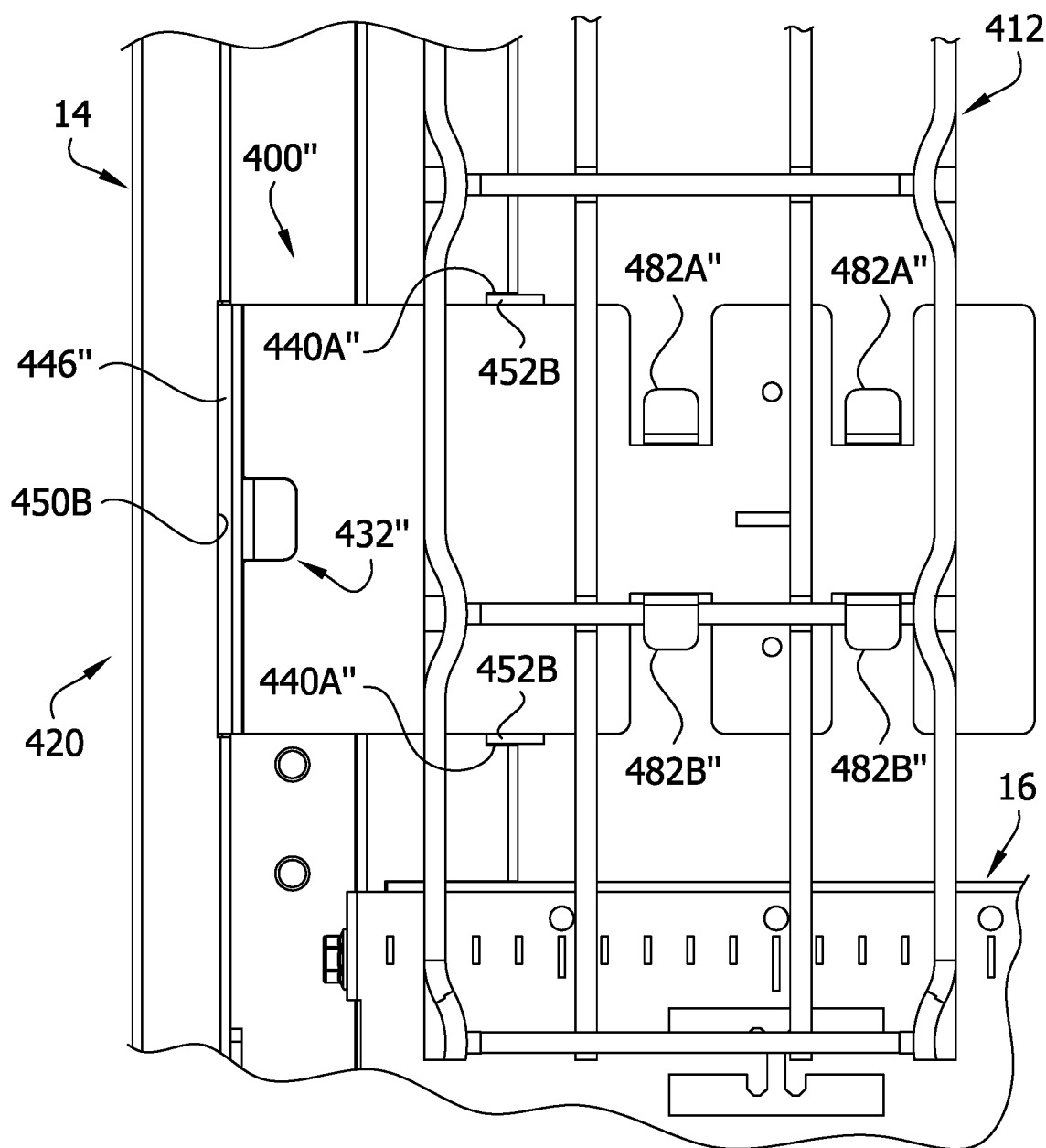
FIG. 37 is a fragmentary elevation of a bracket of a third embodiment mounted on a mounting area and holding a lower end of a vertical tray.
Figure 38:
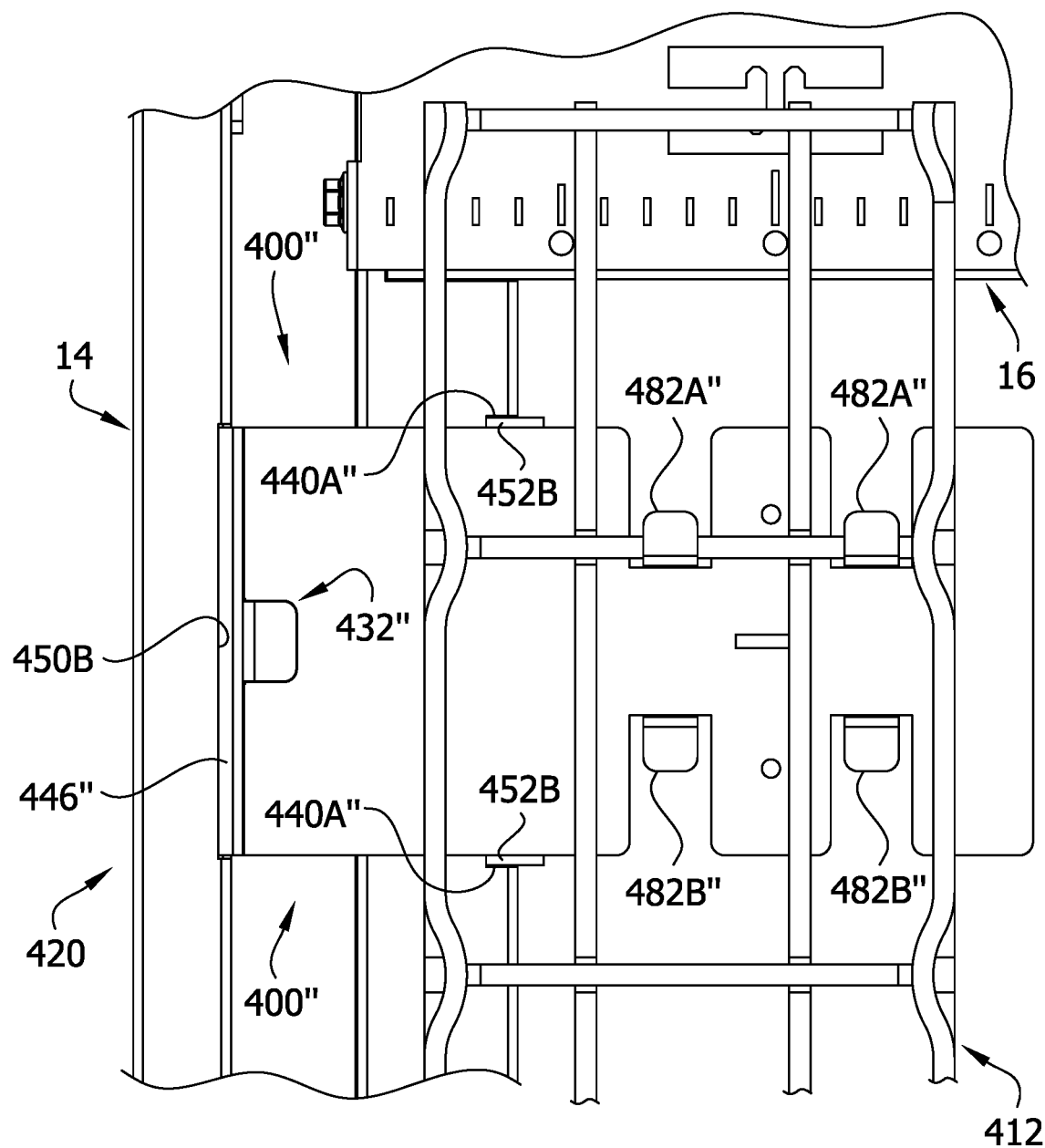
FIG. 38 is a fragmentary elevation of a bracket of the third embodiment mounted on a mounting area and holding an upper end of the vertical tray.
Figure 39:
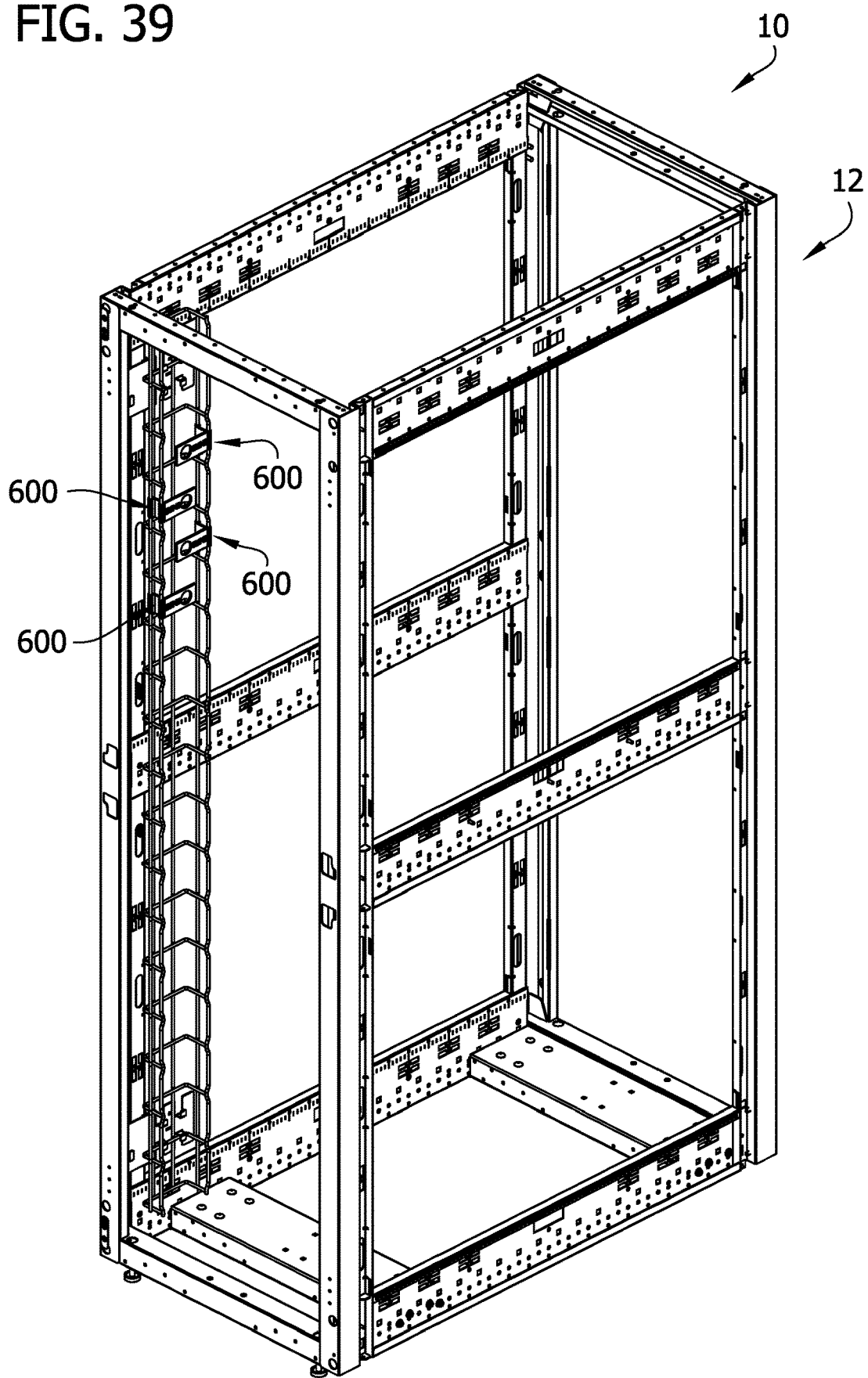
FIG. 39 is similar to FIG. 1, with the addition of one embodiment of cable retainer gates secured to a wire basket.

The brackets 400" of the third embodiment, noted briefly above with respect to FIGS. 28 and 30, will now be discussed. The bracket 400" holding a lower end of the vertically extending tray 412 is shown in FIG. 37, and the bracket 400" holding an upper end of the vertically extending tray 412 is shown in FIG. 38. The brackets 400" are similar in many respects to the brackets of the first and second embodiments described above, and like parts are indicated with the same reference numbers plus a double prime designator. The brackets 400" mount at the mounting areas 420 in the same manner described above. For example, the bracket 400" includes protrusions in the form of upper and lower limbs 440A" that are received in the horizontal slots 452B and in the form of a tongue 446" that is received in the vertical slot 450B. The bracket 400" also includes a snap fit retainer 432" for releasably locking the bracket 400" on the mounting area 420. In this embodiment, the mounting section 434" has a similar configuration as in the second embodiment. The connectors on the mounting section include an upper set of hooks 482A" and a lower set of hooks 482B". As shown by comparison of FIGS. 37 and 38, the lower set of hooks 482B" is used for mounting the lower end of the tray 412, and the upper set of hooks 482A" is used for mounting the upper end of the tray.

Referring to FIGS. 39-44, in one or more embodiments, the equipment rack 10 includes one or more cable retainer gates, each generally indicated at 600, attached to one or more wire baskets 410, 412 (broadly, baskets formed at least partially by wire lattice) mounted on the frame assembly 12. The cable retainer gates may be attached at selected locations along the length of the wire basket 412 to retain cables/wires within the wire basket. Each cable retainer gate 600 may be identical. The cable retainer gate 600 has a generally L-shaped body including a retainer portion 602 having opposite ends, and a basket-attachment portion, generally indicated at 604, extending transversely (e.g., generally perpendicular) from one end of the retainer portion and configured to selectively and removably attach the cable retainer gate to a selected one of the side walls of the wire basket 412. The retainer portion 602 may be generally planar and have generally rectangular perimeter. The retainer portion 602 may be generally rigid such that it maintains its generally planar shape to retain cables/wires in the wire basket 412. When the basket-attachment portion 604 is attached to one of the side walls of the wire basket 412, the retainer portion is generally in the form of a flap or cantilever that extends toward the opposite side wall of the wire basket, across the open channel of the wire basket 412, adjacent the open side of the channel.

The basket-attachment portion 604 includes first and second snap-fit connector 610, 612, respectively, that are spaced apart from one another along the basket-attachment portion and are configured to snap-fit connect to spaced apart wires running along the side wall of the wire basket 412. In the illustrated embodiment, each snap-fit connector 610, 612 includes a pair of opposing jaws 610a, 612a, respectively, defining a channel therebetween for receiving the corresponding wire. The channel may have a generally arcuate shape in cross section. The opposing jaws 610a, 612a are resiliently deflectable away from one another to allow the wire to enter the channel through the open side, whereupon the jaws rebound to grasp the wire. The snap-fit connectors 610, 612 may be of other types in other embodiments.

Figure 40:
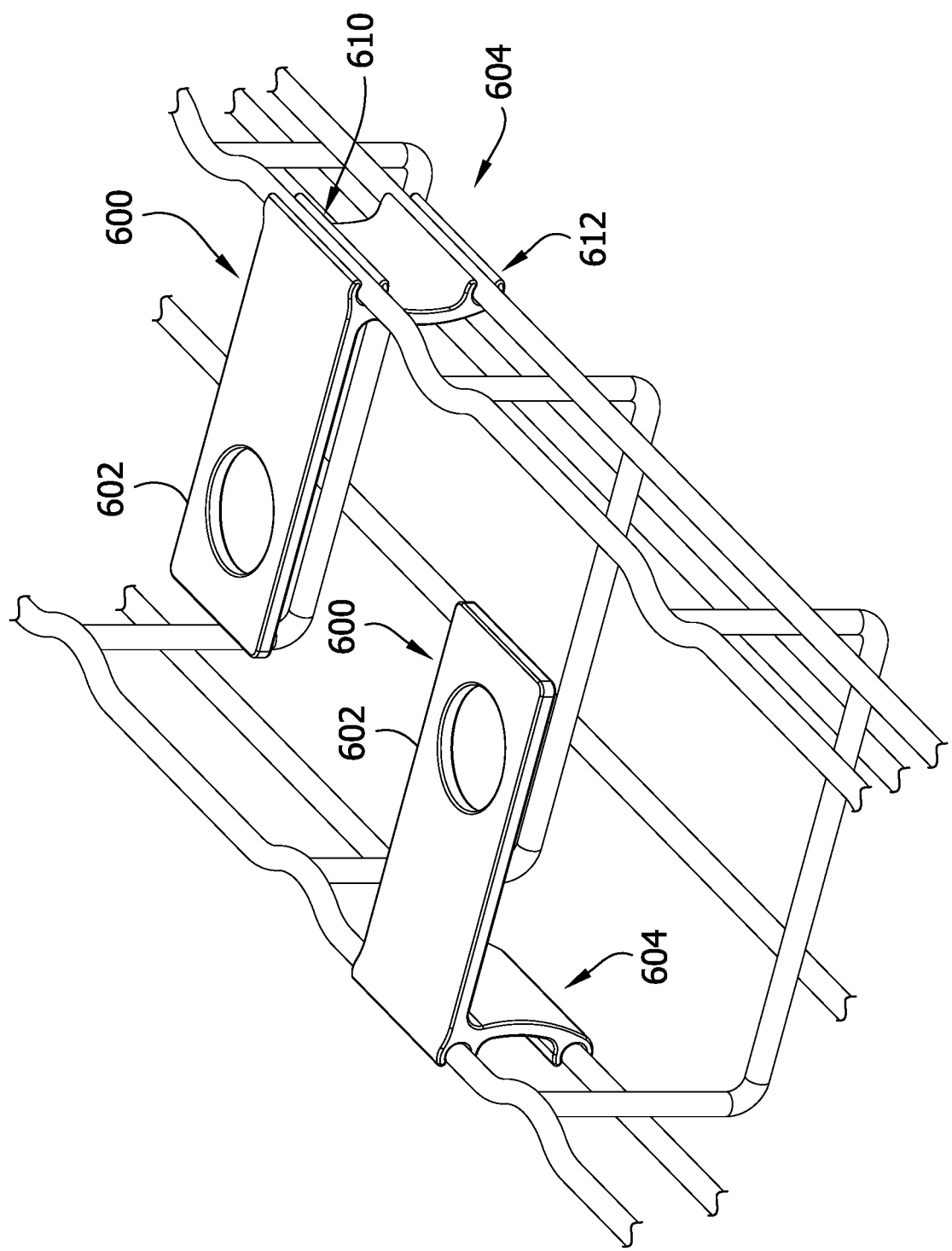
FIG. 40 is an enlarged, fragmentary perspective of two cable retainer gates secured to the wire basket.
Figure 41:
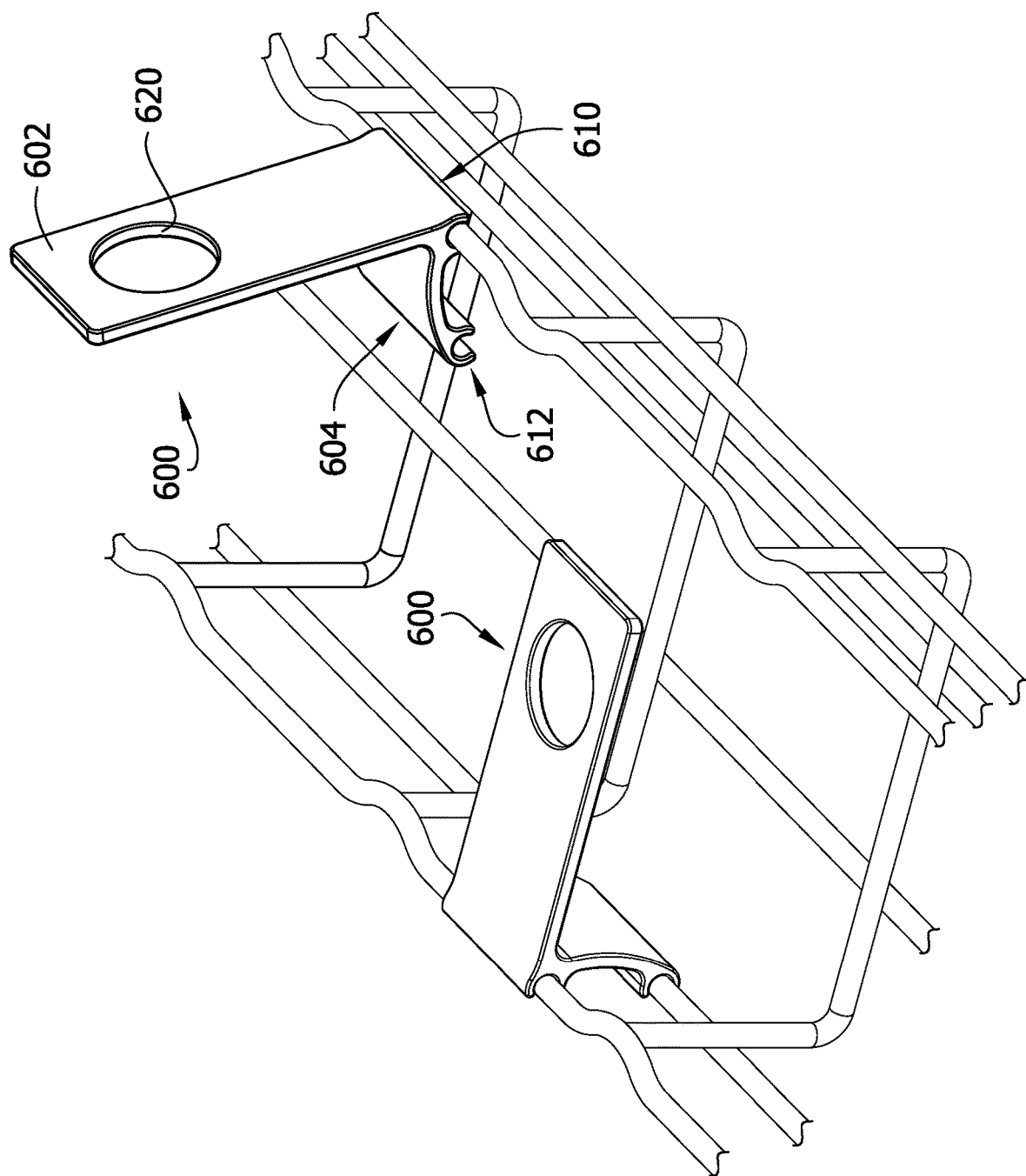
FIG. 41 is similar to FIG. 40, showing one of the cable retainer gates rotated on the wire basket.
Figure 42:
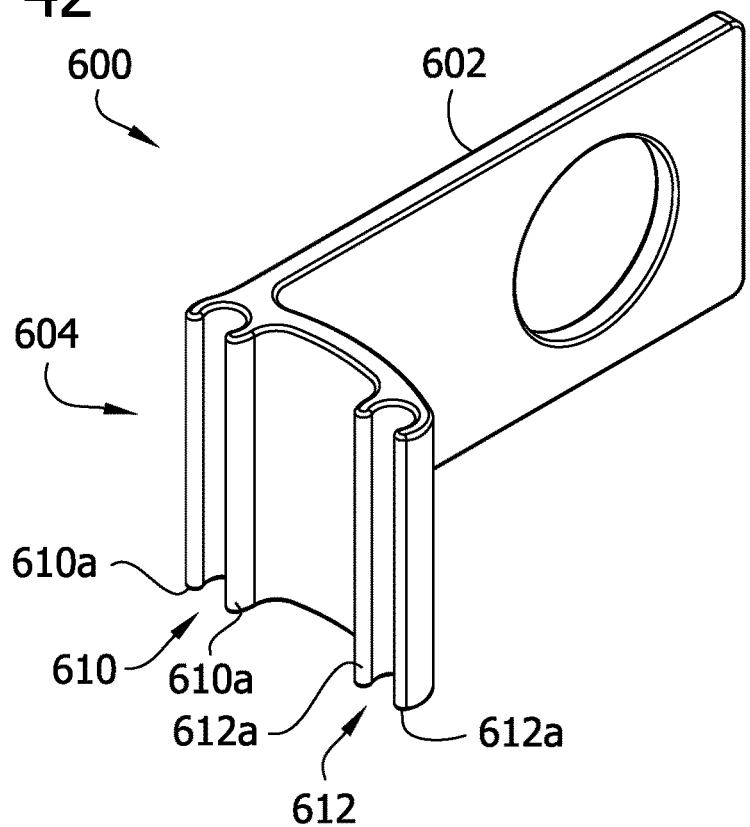
FIG. 42 is an enlarged perspective of the cable retainer gate.
Figure 43:
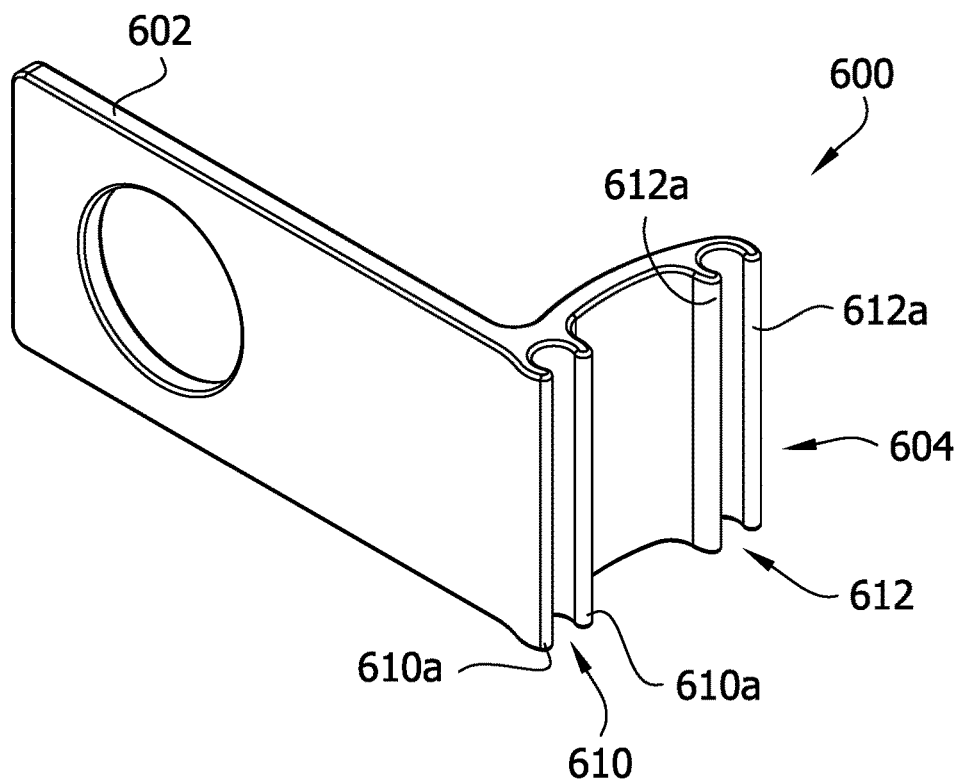
FIG. 43 is an enlarged perspective, taken in a different vantage point, of the cable retainer gate.
Figure 44:
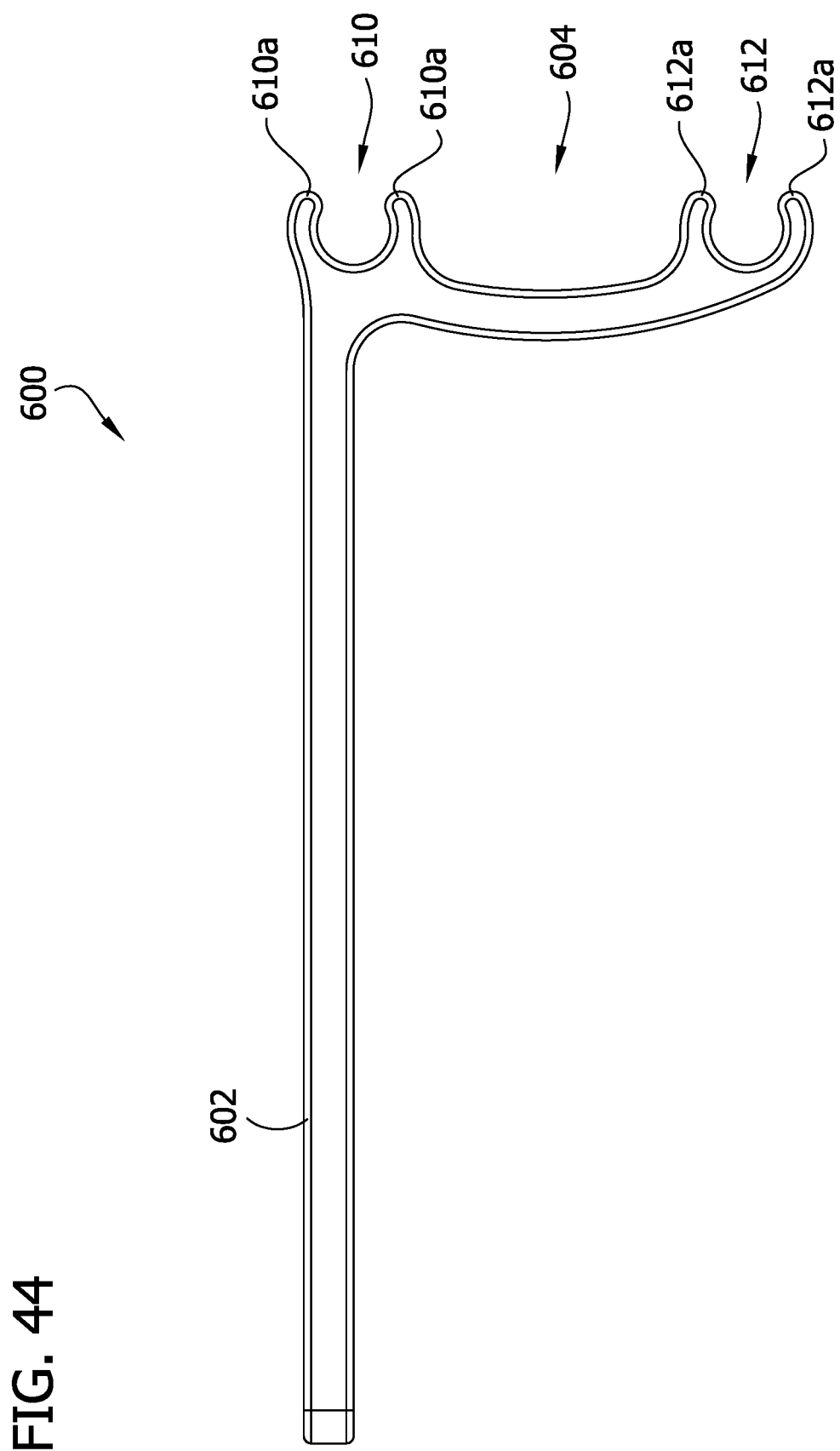
FIG. 44 is an elevational view of the cable retainer gate.

Referring to FIG. 40, when both of the first and second snap-fit connectors 610, 612, respectively, are attached to one of the side walls of the wire basket 412, the cable retainer gate 600 is generally fixed to the wire basket (i.e., is not movable) so that the cantilevered retainer portion 602 inhibits the cables/wires from falling out the open side of the wire basket. As shown in FIG. 41, when only the first snap-fit connector 610 is attached to one of the side walls of the wire basket 412, the cable retainer gate 600 is pivotable or rotatable about the attached wire of the basket. In this way, the cantilevered retainer portion 602 can be pivoted or rotated away from the open side of the wire basket to allow entry or removal of cables/wires from the basket without detaching the cable retainer gate from the basket. A finger opening 620 is defined by the retainer portion 602 to allow a user to pivot the cable retainer gate 600 by inserting a finger in the opening.

In one or more example, the retainer portion 602 may have a length from about 3 in to about 4 in (e.g., about 3.5 in). Center axes of the snap-fit channels of the first and second snap-fit connectors 610, 612 may be spaced apart a distance of about 1 in (e.g., 1.05 in) or other distances based on the distance between adjacent side wires of a desired wire basket. The cable retainer gate 600 may be of other dimensions.

In one or more embodiments, the cable retainer gate 600 is an integrally formed, one-piece component. The cable retainer gate 600 may be formed from plastic (e.g., ABS plastic material) or other suitable material. In one example, the cable retainer gate 600 may be formed by an injection molding process.

Figure 45:
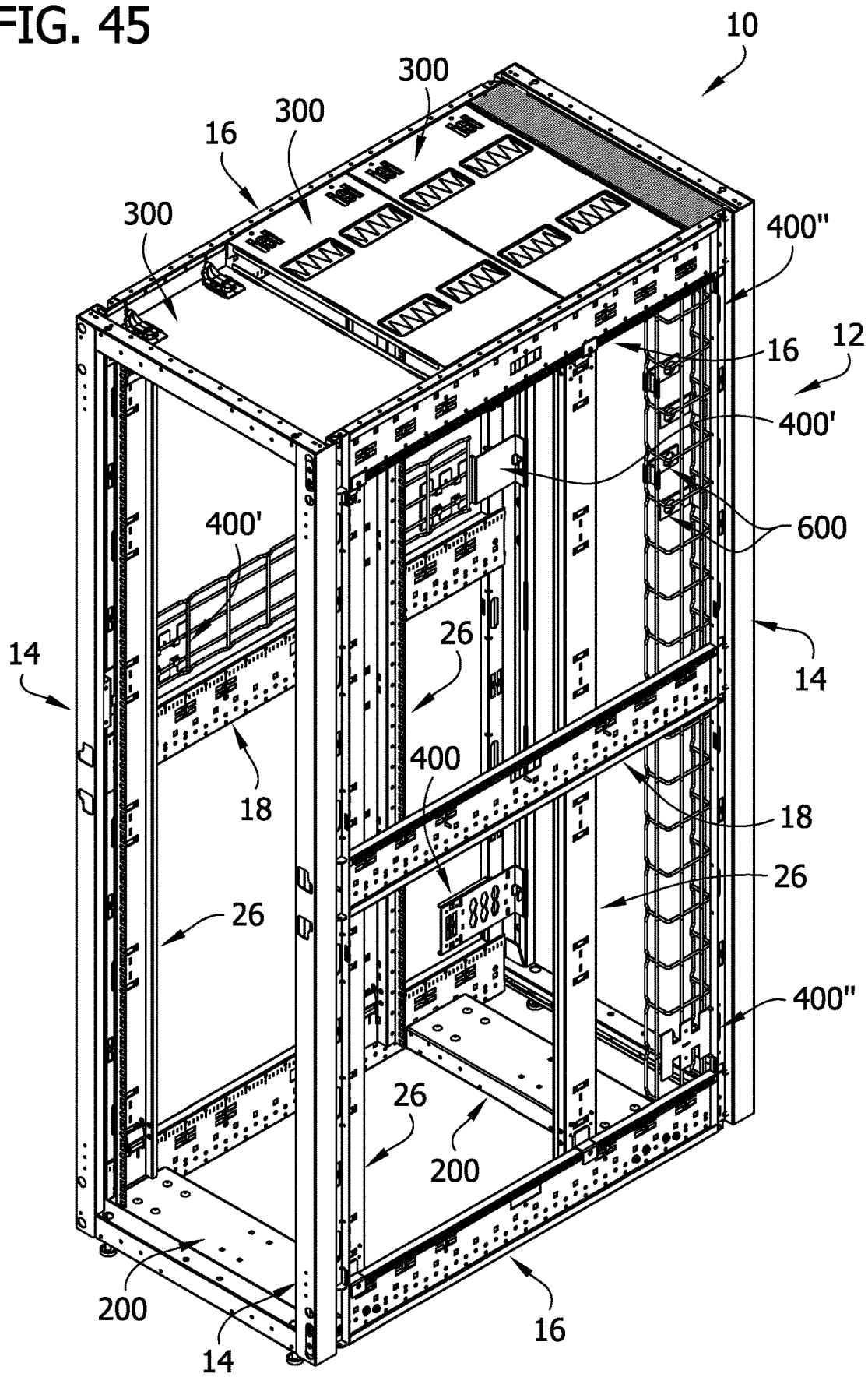
FIG. 45 is similar to FIG. 1, including mounting rails, caster bracket assemblies, horizontal panels for the upper end of the frame assembly, tool-free mounting brackets, and cable retainer gates.
Figure 46:
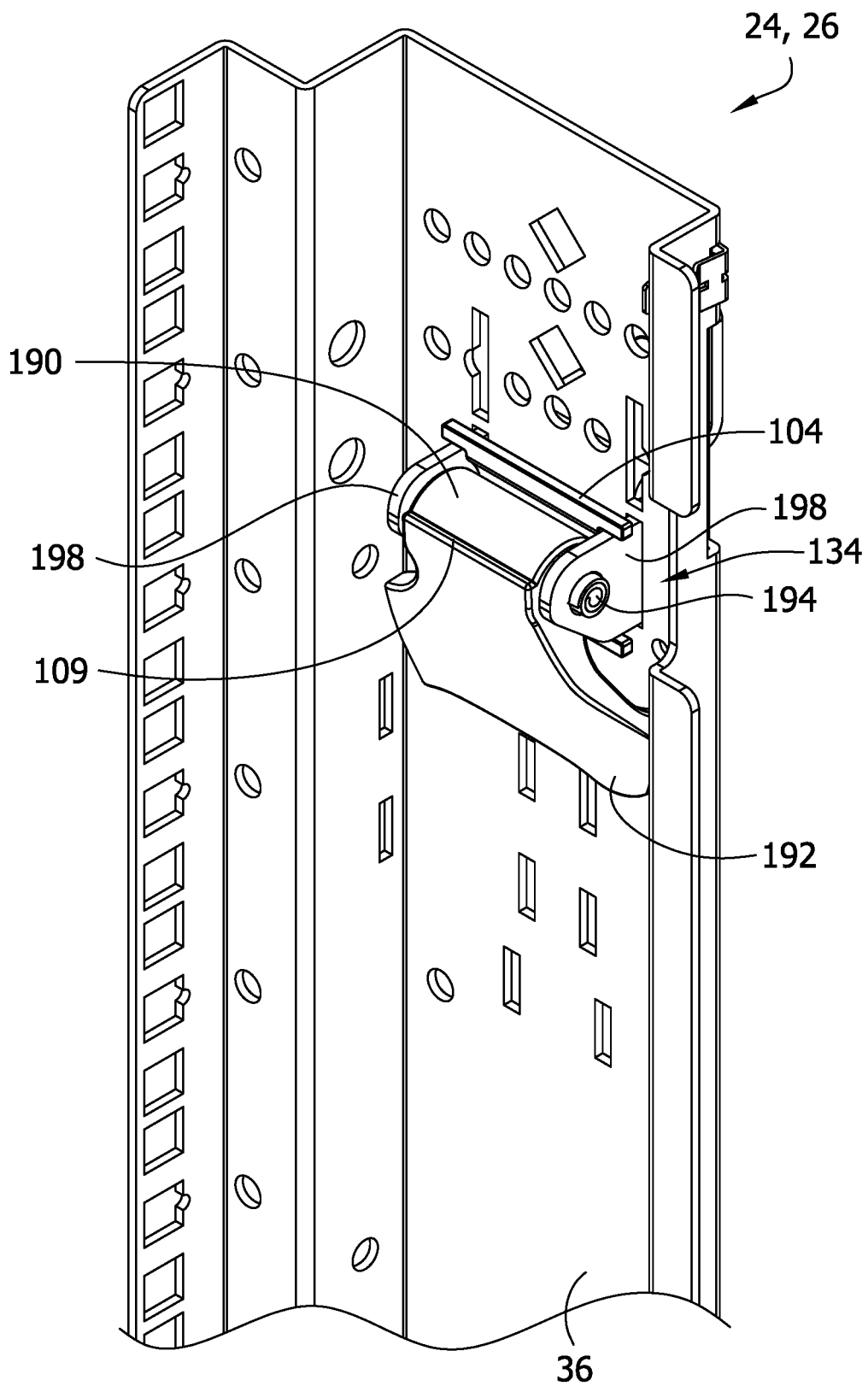
FIG. 46 is an enlarged, fragmentary perspective of a mounting rail with another embodiment of a clamp on the mounting rail.
Figure 47:
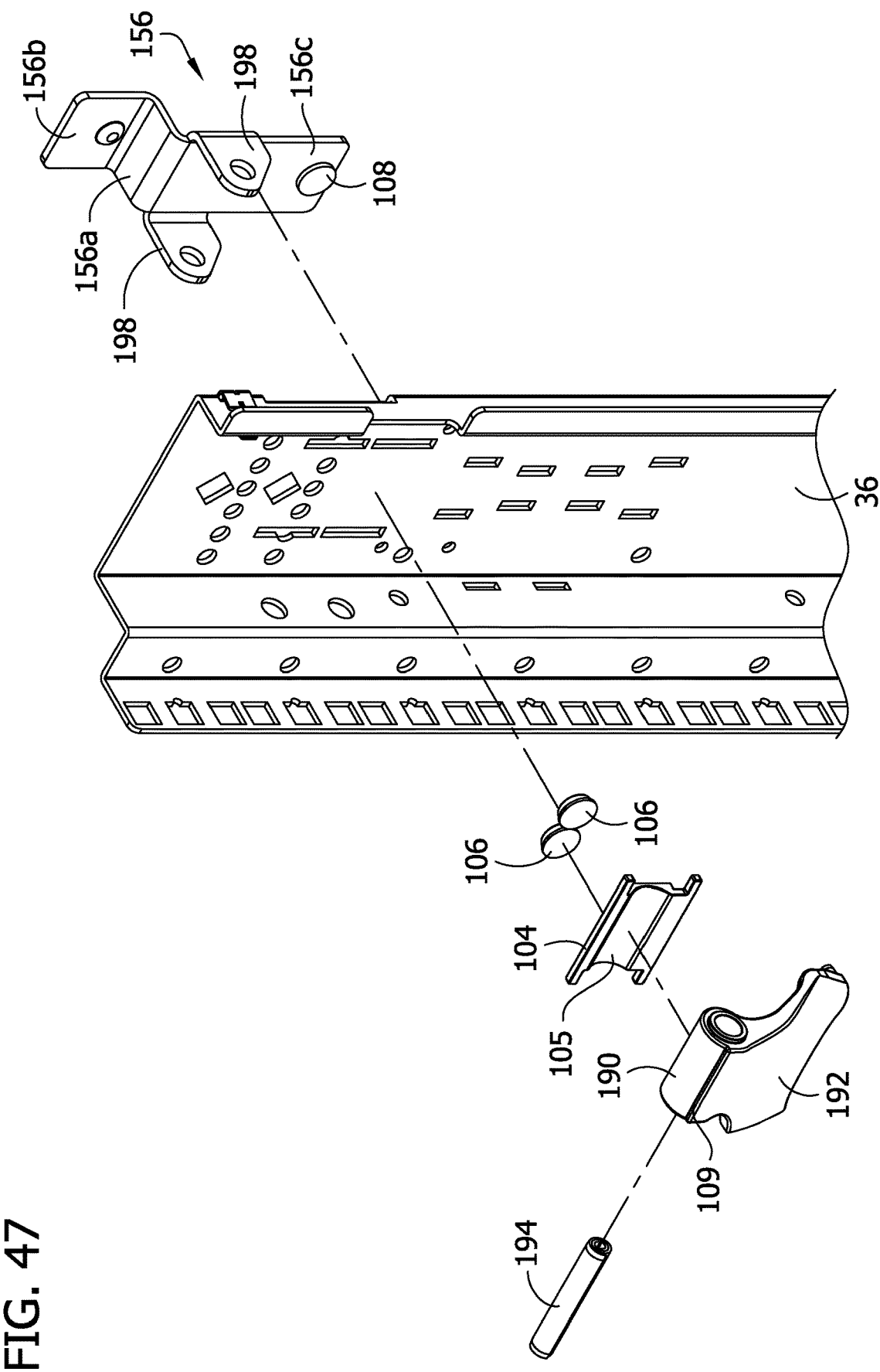
FIG. 47 is similar to FIG. 46, with components of the mounting rail shown exploded.

In one or more embodiments, the equipment rack 10 includes one or more of the components described herein above. That is, in one or more embodiments, the equipment rack includes one or more of the following: one or more of the uprights 14; one or more of the side braces 16; one or more of the mounting rails 26; one or more of the caster brackets 200 and/or caster bracket assemblies; one or more of the horizontal panels 300 for either or both the upper end and the lower end of the frame assembly 12; one or more of the tool-free mounting brackets 400, 400', 400"; and one or more of the cable retainer gates 600. Accordingly, the equipment rack 10 can be thought of as a system. In the embodiment shown in FIG. 45, the equipment rack includes at least one of each of these above-listed components. It is understood that the equipment rack 10 may include less than all of the components. In addition, in one or more embodiments, each of the above-listed components described herein may be provided apart from the equipment rack 10. That is, each of the components may be sold separately from the equipment rack, such that each of the components may be its own product. Accordingly, the present disclosure contemplates each of the above-listed components may be a separate invention apart from the equipment rack 10 and/or the other components.

Modifications and variations of the disclosed embodiments are possible without departing from the scope of the invention defined in the appended claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. An equipment rack comprising:
   a frame assembly including first and second generally horizontal braces, one of the first and second braces being positioned lower than the other of the first and second braces; and
   a mounting rail including an elongate rail body extending vertically between the first and second braces and a releasable clamp operatively coupled to the elongate rail body, the clamp including
      a clamp arm movable between a clamped position, in which the clamp arm is in clamping engagement with the first brace to secure the rail body in a selected horizontal position on the first brace, and an unclamped position, in which the clamp arm is free from clamping engagement with the first brace to allow the rail body to move horizontally along the first brace, and
      a lever arm operatively coupled to the clamp arm and configured to rotate relative to the clamp arm to impart movement of the clamp arm between the clamped and unclamped positions;
   wherein the clamp includes a cam secured to the lever arm configured to cam lock the lever arm when the clamp arm is in the clamped position;
   wherein the first brace is clamped between the clamp arm and the rail body when the clamp arm is in the clamped position.

2. The equipment rack set forth in claim 1, wherein the clamp arm at least partially defines a channel in which the first brace is received.

3. The equipment rack set forth in claim 2, wherein the clamp arm is slidable along the first brace to change the horizontal position of the mounting rail relative to the first and second braces when the clamp arm is in the unclamped position.

4. The equipment rack set forth in claim 1, wherein the clamp arm is configured to clamp the first brace against the rail body.

5. The equipment rack set forth in claim 4, wherein the rail body includes a web and the clamp arm includes first and second portions, the first portion extending away from the web and the second portion extending from the first portion, the second portion extending transversely with respect to the first portion, the second portion being movable toward the first brace from the unclamped position to the clamped position to clamp the first brace against the web of the rail body.

6. The equipment rack set forth in claim 1, wherein the clamp includes a trunnion bearing having spaced apart bearing arms, wherein the lever includes a trunnion rotatably received in the bearing arms.

7. The equipment rack set forth in claim 1, wherein the clamp is configured to form a mating connection of the clamp arm and the first brace as the clamp arm is moved into the clamped position to further inhibit horizontal movement of the mounting rail along the first brace.

8. The equipment rack set forth in claim 7, wherein the clamp arm includes a detent projection and the first brace includes a plurality of spaced apart recesses configured to receive the detent projection, the detent projection being movable into a selected one of the recesses when the clamp arm is moved toward the brace from the unclamped position to the clamped position.

9. The equipment rack set forth in claim 1, wherein the at least one clamp comprises a first clamp and a second clamp, the first clamp configured to releasably clamp on the first brace to secure the mounting rail on the first brace, the second clamp configured to releasably clamp on the second brace to secure the mounting rail on the second brace.

10. An equipment rack comprising:
    a frame assembly including first and second generally horizontal braces, one of the first and second braces being positioned lower than the other of the first and second braces; and
    a mounting rail including an elongate rail body extending vertically between the first and second braces and a releasable clamp operatively coupled to the elongate rail body, the clamp including
       a clamp arm movable between a clamped position, in which the clamp arm is in clamping engagement with the first brace to secure the rail body in a selected horizontal position on the first brace, and an unclamped position, in which the clamp arm is free from clamping engagement with the first brace to allow the rail body to move horizontally along the first brace, and
       a lever arm operatively coupled to the clamp arm and configured to rotate relative to the clamp arm to impart movement of the clamp arm between the clamped and unclamped positions
    wherein the rail body includes a web and the clamp arm includes first and second portions, the first portion extending away from the web and the second portion extending from the first portion, the second portion extending transversely with respect to the first portion, the second portion being movable with the clamp arm from the unclamped position to the clamped position,
    wherein the clamp includes a trunnion bearing having spaced apart bearing arms, wherein the lever includes a trunnion rotatably received in the bearing arms.

11. The equipment rack set forth in claim 10, wherein the second portion of the clamp arm is movable toward the first brace from the unclamped positon to the clamped position to clamp the first brace against the web of the rail body.

12. The equipment rack set forth in claim 10, wherein the clamp includes a cam secured to the lever arm configured to cam lock the lever arm when the clamp arm is in the clamped position.

13. The equipment rack set forth in claim 10, wherein the clamp arm at least partially defines a channel in which the first brace is received.

14. The equipment rack set forth in claim 13, wherein the clamp arm is slidable along the first brace to change the horizontal position of the mounting rail relative to the first and second braces when the clamp arm is in the unclamped position.

15. The equipment rack set forth in claim 10, wherein the clamp is configured to form a mating connection of the clamp arm and the first brace as the clamp arm is moved into the clamped position to further inhibit horizontal movement of the mounting rail along the first brace.

16. The equipment rack set forth in claim 15, wherein the clamp arm includes a detent projection and the first brace includes a plurality of spaced apart recesses configured to receive the detent projection, the detent projection being movable into a selected one of the recesses when the clamp arm is moved toward the brace from the unclamped position to the clamped position.

17. The equipment rack set forth in claim 10, wherein the at least one clamp comprises a first clamp and a second clamp, the first clamp configured to releasably clamp on the first brace to secure the mounting rail on the first brace, the second clamp configured to releasably clamp on the second brace to secure the mounting rail on the second brace.

* * * * *